US012616030B2

(12) United States Patent
Lai et al.

(10) Patent No.: US 12,616,030 B2
(45) Date of Patent: Apr. 28, 2026

(54) ELECTRONIC DEVICE AND METHOD FOR MANUFACTURING THE SAME

(71) Applicant: Advanced Semiconductor Engineering, Inc., Kaohsiung (TW)

(72) Inventors: Chih-Hsin Lai, Kaohsiung (TW); Chih-Cheng Lee, Kaohsiung (TW); Shao-Lun Yang, Kaohsiung (TW); Wei-Chih Cho, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 694 days.

(21) Appl. No.: 17/962,354

(22) Filed: Oct. 7, 2022

(65) Prior Publication Data

US 2024/0120288 A1 Apr. 11, 2024

(51) Int. Cl.
| | |
|---|---|
| *H01L 23/552* | (2006.01) |
| *H01L 21/48* | (2006.01) |
| *H01L 21/56* | (2006.01) |
| *H01L 23/00* | (2006.01) |
| *H01L 23/31* | (2006.01) |
| *H01L 23/498* | (2006.01) |

(52) U.S. Cl.
CPC ........ *H01L 23/552* (2013.01); *H01L 21/4853* (2013.01); *H01L 21/4857* (2013.01); *H01L 21/565* (2013.01); *H01L 23/3121* (2013.01); *H01L 23/49822* (2013.01); *H01L 24/16* (2013.01); *H01L 2224/16227* (2013.01); *H01L 2924/3025* (2013.01)

(58) Field of Classification Search
None
See application file for complete search history.

(56) References Cited

U.S. PATENT DOCUMENTS

| | | | | |
|---|---|---|---|---|
| 8,030,750 | B2 * | 10/2011 | Kim ........................ | H01L 24/97 257/E23.141 |
| 11,430,742 | B2 | 8/2022 | Ryu et al. | |
| 11,605,571 | B2 * | 3/2023 | Teixeira De Queiros ................... | H01L 21/4853 |
| 12,027,467 | B2 * | 7/2024 | Cho ................... | H01L 21/4853 |
| 2020/0251449 | A1 * | 8/2020 | Wu ........................ | H01L 23/552 |
| 2020/0335452 | A1 * | 10/2020 | Tai ....................... | H01L 23/5385 |
| 2021/0375707 | A1 * | 12/2021 | Teixeira De Queiros ................... | H01L 25/0655 |
| 2022/0246533 | A1 * | 8/2022 | Cho ................... | H01L 23/5386 |

* cited by examiner

*Primary Examiner* — Long Pham
(74) *Attorney, Agent, or Firm* — Foley & Lardner LLP

(57) ABSTRACT

An electronic device and a method for manufacturing the same are provided. The electronic device includes a substrate, an encapsulant and an electronic component. The encapsulant is disposed over the substrate, and has a first top surface, a second top surface and a first lateral surface extending between the first top surface and the second top surface. A roughness of the first lateral surface is less than or equal to a roughness of the second top surface. The electronic component is disposed over the second top surface of the encapsulant and electrically connected to the substrate.

18 Claims, 53 Drawing Sheets

ELECTRONIC DEVICE AND METHOD FOR MANUFACTURING THE SAME

BACKGROUND

1. Field of the Disclosure

The present disclosure relates to an electronic device and a method for manufacturing the same, and more particularly to an electronic device including an encapsulant and a method for manufacturing the same.

2. Description of the Related Art

A semiconductor device package may include a substrate, a wireless device electrically connected to the substrate, and a lid covering the wireless device. The lid is configured to provide an electromagnetic interference (EMI) shielding for the wireless device. However, the lid is connected to the substrate through a lid-attaching process, and a reliability of such semiconductor device package is low. In addition, a heat dissipation rate of such semiconductor device package is low.

SUMMARY

In some embodiments, an electronic device includes a substrate, an encapsulant and an electronic component. The encapsulant is disposed over the substrate, and has a first top surface, a second top surface and a first lateral surface extending between the first top surface and the second top surface. A roughness of the first lateral surface is less than or equal to a roughness of the second top surface. The electronic component is disposed over the second top surface of the encapsulant and electrically connected to the substrate.

In some embodiments, an electronic device includes a substrate, an encapsulant, an electronic component and a shielding layer. The encapsulant is disposed over the substrate, and includes a first portion and a second portion connected to the first portion. The electronic component is disposed over the second portion. The shielding layer is disposed on a lateral surface of the second portion, and is distant from the first portion in a cross-sectional view.

In some embodiments, a method for manufacturing an electronic device includes: performing a step-shaped molding process to form an encapsulant encapsulating a substrate; and disposing an electronic component adjacent to a first portion of the encapsulant and over a second portion of the encapsulant continuously extending to the first portion of the encapsulant.

BRIEF DESCRIPTION OF THE DRAWINGS

Aspects of some embodiments of the present disclosure are readily understood from the following detailed description when read with the accompanying figures. It is noted that various structures may not necessarily be drawn to scale, and dimensions of the various structures may be arbitrarily increased or reduced for clarity of discussion.

DETAILED DESCRIPTION

Figure 1:
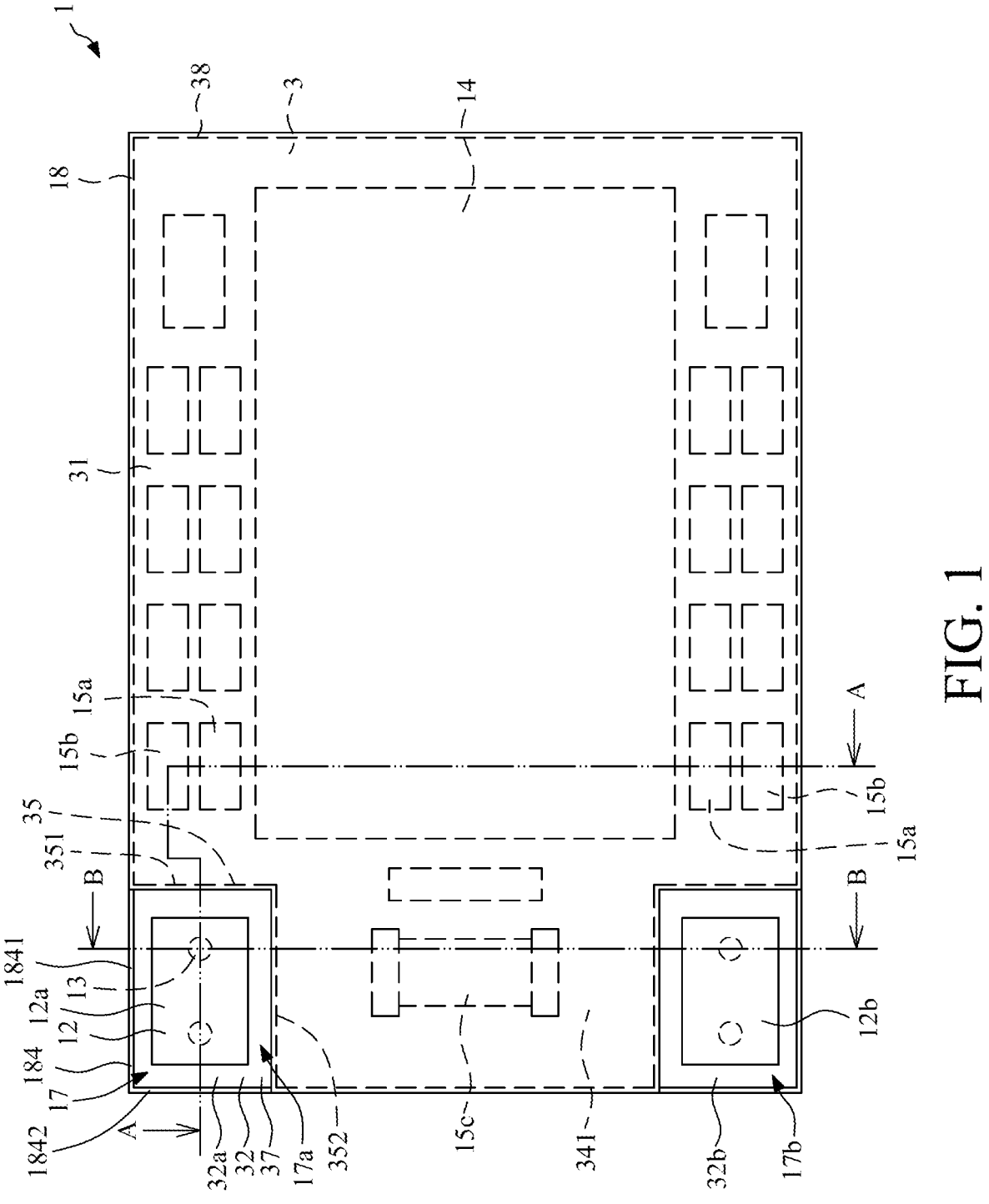
FIG. 1 illustrates a top view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
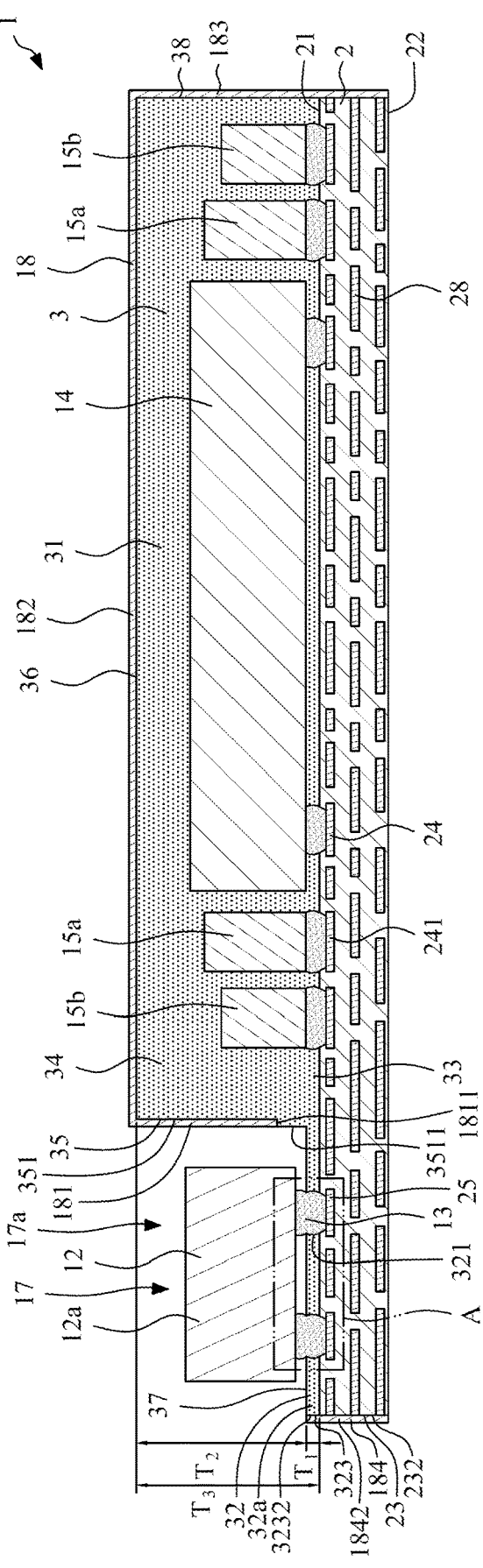
FIG. 2 illustrates a cross-sectional view taken along line A-A in FIG. 1.
Figure 3:
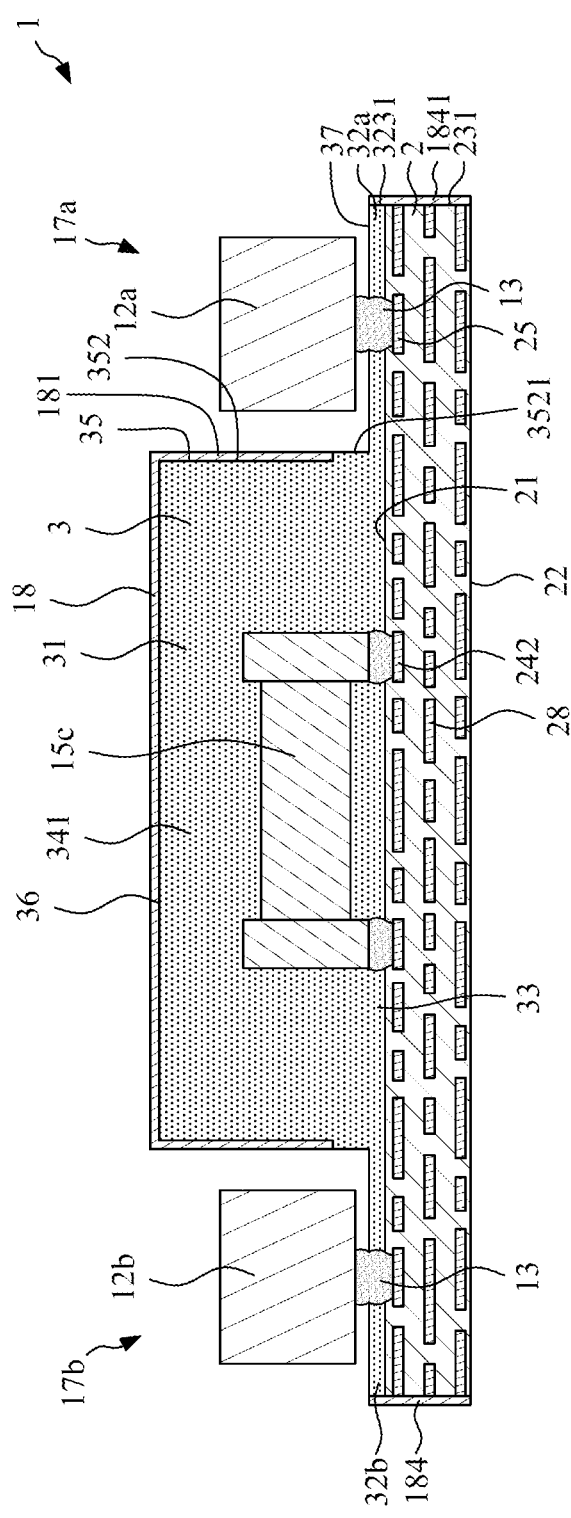
FIG. 3 illustrates a cross-sectional view taken along line B-B in FIG. 1.

FIG. 1 illustrates a top view of an electronic device 1 according to some embodiments of the present disclosure. FIG. 2 illustrates a cross-sectional view taken along line A-A in FIG. 1. FIG. 3 illustrates a cross-sectional view taken along line B-B in FIG. 1. The electronic device 1 may include a substrate 2, an electronic element 14, a plurality of passive elements 15a, 15b, 15c, an encapsulant 3, an electronic component 12, a reflowable element 13 and a shielding layer 18. In some embodiments, the electronic device 1 may be also referred to as "an antenna device".

The substrate 2 may be a carrier and may have a first surface 21, a second surface 22 opposite to the first surface 21, four lateral surfaces 23 extending between the first surface 21 and the second surface 22. The first surface 21 may be also referred to as "a second surface" or "a top surface". The second surface 22 may be also referred to as "a first surface" or "a bottom surface". The substrate 2 may include a plurality of dielectric layers, a plurality of circuit layers 28 interposed between the dielectric layers and a plurality of electrical contacts 24, 241, 242, 25 (e.g., bonding pads). A material of the dielectric layers of the substrate 2 may include an insulating material, a passivation material, a dielectric material or a solder resist material, such as, for example, a benzocyclobutene (BCB) based polymer, a polyimide (PI) or a polypropylene (PP). In some embodiments, the circuit layers 28 of the substrate 2 may include at least one routing layer or patterned layer.

The electronic element 14 (e.g., a semiconductor die or a semiconductor chip) may be electrically connected to the electrical contacts 24 (e.g., bonding pads) of the substrate 2. The electronic element 14 may be an active electrical component, and may include a wireless device such as a radio frequency (RF) chip or a radio frequency integrated circuit (RFIC). In some embodiments, the electronic element 14 may be disposed adjacent to the first surface 21 of the substrate 2, and may be attached to the substrate 2 through flip chip bonding or surface mounting technology. The passive elements 15a, 15b (e.g., capacitors, resistors or inductors) may be disposed around the electronic element 14, and may be electrically connected to the electrical contacts 241 (e.g., bonding pads) adjacent to the first surface 21 of the substrate 2. The passive element 15c (e.g., capacitor, resistor or inductor) may be disposed around the electronic element 14, and may be electrically connected to the electrical contact 242 (e.g., bonding pad) adjacent to the first surface 21 of the substrate 2. The passive elements 15a, 15b, 15c may be attached to the substrate 2 through flip chip bonding or surface mounting technology (SMT).

The encapsulant 3 (e.g., a molding compound with or without fillers) may be disposed over the substrate 2. The encapsulant 3 may cover the entire first surface 21 of the substrate 2 and may encapsulate the electronic element 14 and the passive elements 15a, 15b, 15c. The encapsulant 3 may include a first portion 31 and a second portion 32 connected to the first portion 31. The first portion 31 may be a main portion, and may cover the electronic element 14 and the passive elements 15a, 15b, 15c. The second portion 32 may be an extending portion that continuously extends from or continuously extends to the first portion 31, and may be disposed between the electronic component 12 and the substrate 2. Alternatively, the first portion 31 may continuously extend from or continuously extend to the second portion 32.

The first portion 31 and the second portion 32 may be formed integrally as a monolithic structure. That is, there may be no interface between the first portion 31 and the second portion 32. Thus, in the cross-sectional view as shown in FIG. 2, the encapsulant 3 may be a step structure, and may define an accommodating space 17 for accommodating the electronic component 12. In some embodiments, the encapsulant 3 may include a lower portion 33 and an upper portion 34 located on the lower portion 33. The lower portion 33 and the upper portion 34 may be formed integrally as a monolithic structure. That is, there may be no interface between the lower portion 33 and the upper portion 34. In the cross-sectional view as shown in FIG. 2, a width of the upper portion 34 may be less than a width of the lower portion 33. A thickness $T_2$ of the upper portion 34 is greater than a thickness $T_1$ of the lower portion 33. The thickness $T_2$ of the upper portion 34 may be greater than a thickness of the electronic component 12 and a thickness of the electronic element 14. The lower portion 33 may have an extending portion (i.e., the above-mentioned second portion 32) that is not covered by the upper portion 34. The second portion 32 may have one or more lateral surface(s) 323 that is/are substantially aligned with the lateral surface(s) 23 of the substrate 2. For example, the second portion 32 may be located at a corner of the substrate 2, and may extend to two lateral surfaces 23 of the substrate 2. The second portion 32 of the encapsulant 3 may extend beyond the upper portion 34 of the encapsulant 3, and may be disposed between the electronic component 12 and the substrate 2.

The encapsulant 3 may have a first top surface 36, an inner lateral surface 35, an outer lateral surface 38 and a second top surface 37. The first top surface 36 of the encapsulant 3 may be opposite to the first surface 21 of the substrate 2. The first top surface 36 may be a top surface of the first portion 31 or a top surface of the upper portion 34 of the encapsulant 3. Thus, the first portion 31 may have the first top surface 36. The second top surface 37 may be substantially parallel with the first top surface 36, and may be lower than the first top surface 36. The second top surface 37 may be a top surface of the second portion 32 of the encapsulant 3. Thus, the second portion 32 of the encapsulant 3 may have the second top surface 37, and the second top surface 37 of the encapsulant 3 may be located between the electronic component 12 and the substrate 2. The thickness $T_2$ of the upper portion 34 may be a vertical distance between the first top surface 36 and the second top surface 37. The thickness $T_1$ of the lower portion 33 may be a vertical distance between the second top surface 37 and the first surface 21 of the substrate 2. The inner lateral surface 35 may extend between the first top surface 36 and the second top surface 37. As shown in FIG. 1, the inner lateral surface 35 may include a first lateral surface 351 and a second lateral surface 352 distinct from first lateral surface 351. For example, the first lateral surface 351 may be substantially perpendicular to the second lateral surface 352. Further, the second top surface 37 of the encapsulant 3 and the inner lateral surface 35 (including the first lateral surface 351 and the second lateral surface 352) of the encapsulant 3 may together/collectively define the accommodating space 17, 17a for accommodating the electronic component 12. The outer lateral surface 38 may extend between the first top surface 36 and the first surface 21 of the substrate 2, and may be aligned with the lateral surface 23 of the substrate 2.

A roughness of the first top surface 36 of the encapsulant 3 may be equal to a roughness of the second top surface 37 of the encapsulant 3. A roughness of the inner lateral surface 35 (including the first lateral surface 351 and the second lateral surface 352) of the encapsulant 3 is less than or equal to a roughness of the second top surface 37. For example, the first top surface 36 of the encapsulant 3 may have a first surface roughness value $R_{a1}$. The second top surface 37 of the encapsulant 3 may have a second surface roughness value $R_{a2}$. The inner lateral surface 35 (including the first lateral surface 351 and the second lateral surface 352) of the encapsulant 3 may have a third surface roughness value $R_{a3}$. A difference between the first surface roughness value $R_{a1}$ and the second surface roughness value $R_{a2}$ may be greater than or equal to a difference between the first surface roughness value $R_{a1}$ and the third surface roughness value $R_{a3}$. Alternatively, a difference between the first surface roughness value $R_{a1}$ and the third surface roughness value $R_{a3}$ may be less than or equal to a difference between the third surface roughness value $R_{a3}$ and the second surface roughness value $R_{a2}$.

For example, the first top surface 36 of the encapsulant 3 and the inner lateral surface 35 (including the first lateral surface 351 and the second lateral surface 352) of the encapsulant 3 may be formed by molding without further machining process, the first surface roughness value $R_{a1}$ may be substantially equal to the second surface roughness value $R_{a2}$, both are relatively small. When the second top surface 37 of the encapsulant 3 is formed by laser polishing, the second surface roughness value $R_{a2}$ may be relatively large. Thus, the difference between the first surface roughness value $R_{a1}$ and the second surface roughness value $R_{a2}$ may be greater than the difference between the first surface roughness value $R_{a1}$ and the third surface roughness value $R_{a3}$. Alternatively, the difference between the first surface roughness value $R_{a1}$ and the third surface roughness value $R_{a3}$ may be less than the difference between the third surface roughness value $R_{a3}$ and the second surface roughness value $R_{a2}$.

When the second top surface 37 of the encapsulant 3 is formed by molding without further machining process, the second surface roughness value $R_{a2}$ may be relatively small. Thus, the difference between the first surface roughness value $R_{a1}$ and the second surface roughness value $R_{a2}$ may be substantially equal the difference between the first surface roughness value $R_{a1}$ and the third surface roughness value $R_{a3}$. Alternatively, the difference between the first surface roughness value $R_{a1}$ and the third surface roughness value $R_{a3}$ may be substantially equal to the difference between the third surface roughness value $R_{a3}$ and the second surface roughness value $R_{a2}$.

Figure 9:
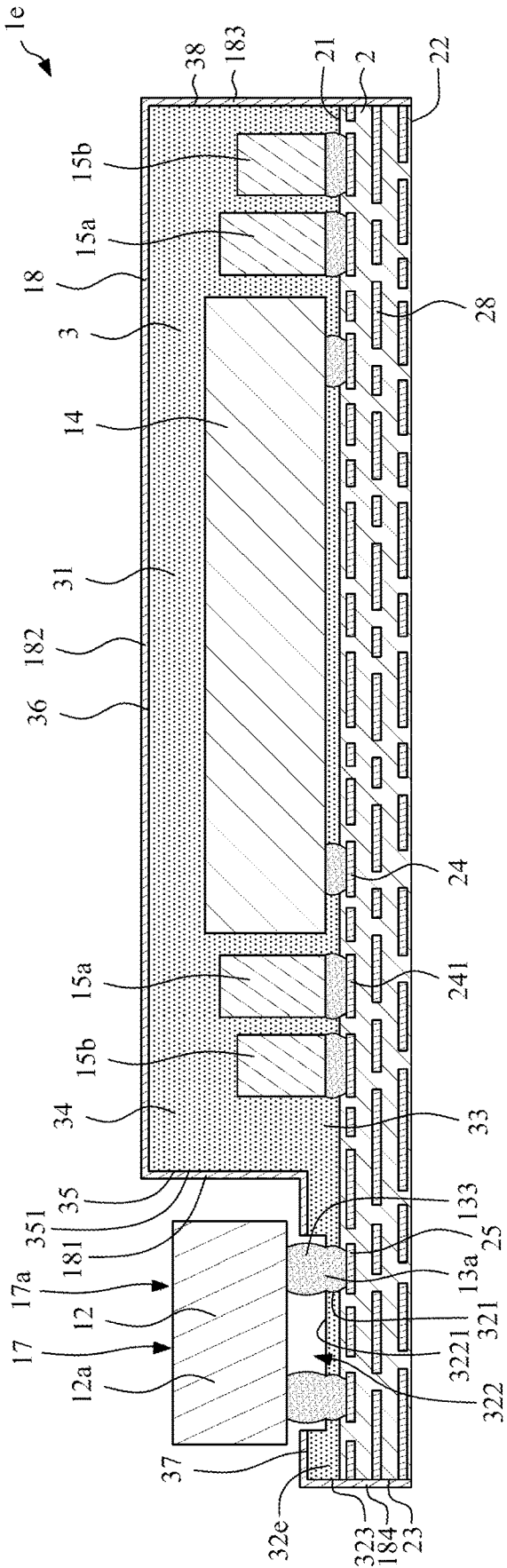
FIG. 9 illustrates a cross-sectional view taken along line C-C in FIG. 8.

The first lateral surface 351 may have a lower portion 3511 (FIG. 2). The lower portion 3511 of the first lateral surface 351 may be also referred to as a first side surface 3511 of the first portion 31. The second lateral surface 352 may have a lower portion 3521 (FIG. 3). The lower portion 3521 of the second lateral surface 352 may be also referred to as a second side surface 3521 of the first portion 31. The second side surface 3521 of the first portion 31 may be distinct from the first side surface 3511 of the first portion 31. For example, the second side surface 3521 of the first portion 31 may be substantially perpendicular to the first side surface 3511 of the first portion 31. The first side surface 3511 and the second side surface 3521 of the first portion 31 collectively define the accommodating space 17, 17a configured to accommodate the electronic component 12. As shown in FIG. 9, the second portion 32 of the encapsulant 3 may define a recess portion 322 recessed from the top surface (i.e., the second top surface 37) of the second portion 32e of the encapsulant 3. The recess portion 322 may have a bottom surface 3221. The bottom surface 3221 may be also referred to as a third top surface of the second portion 32e of the encapsulant 3. Thus, the second portion 32e of the encapsulant 3 may further have a third top surface 3221 (i.e., the bottom surface 3221 of the recess portion 322) level-distinct from the second top surface 37. That is, a level of the second top surface 37 of the second portion 32e of the encapsulant 3 may be different from a level of the third top surface 3221 (i.e., the bottom surface 3221 of the recess portion 322). Further, the roughness of the second top surface 37 may be less than a roughness of the third top surface 3221. In some embodiments, the lower portion 3511 of the first lateral surface 351 may have a fourth surface roughness value $R_{a4}$, and the third top surface 3221 may have a fifth surface roughness value $R_{a5}$. In some embodiments, the lower portion 3511 of the first lateral surface 351 and the second top surface 37 of the encapsulant 3 may be both formed by laser polishing. A difference between the first surface roughness value $R_{a1}$ of the first top surface 36 and a fourth surface roughness value $R_{a4}$ of the lower portion 3511 of the first lateral surface 351 may be substantially equal to a difference between the first surface roughness value $R_{a1}$ of the first top surface 36 and the fifth surface roughness value $R_{a5}$ of the third top surface 37.

The second portion 32 of the encapsulant 3 may define an opening 321 to expose at least a portion of the electrical contact 25 (e.g., bonding pad) of the substrate 2 and accommodate at least a portion of the reflowable element 13. The electronic component 12 may be disposed outside or external to the encapsulant 3, and electrically connected to the exposed electrical contact 25 (e.g., bonding pad) of the substrate 2 through the reflowable element 13. That is, the electronic component 12 may be attached to the substrate 2 through flip chip bonding or surface mounting technology (SMT). The electronic component 12 may be disposed over or disposed adjacent to the second top surface 37 of the encapsulant 3 and electrically connected to the substrate 2 through an electrical path (e.g., the reflowable element 13) passing through or extending through a second portion 32 of the encapsulant 3.

The electronic component 12 may be a connector that is configured to connect the substrate 2 to an external device. The electronic component 12 may be electrically connected to the electronic element 14 through the substrate 2. Thus, the external device may be electrically connected to the electronic element 14 through the electronic component 12 and the substrate 2. In addition, the electronic component 12 may be a universal serial bus (USB) port, type A port, type B port or type C port. The electronic component 12 may be disposed in the accommodating space 17, and may be disposed over the second portion 32 of the encapsulant 3. Thus, the electronic component 12 and the first portion 31 or the upper portion 34 of the encapsulant 3 may be disposed on the first surface 21 of the substrate 2 side by side. There may be a horizontal gap between the electronic component 12 and the first portion 31 or the upper portion 34 of the encapsulant 3. There may be a vertical gap between the electronic component 12 and the second portion 32 of the encapsulant 3.

The shielding layer 18 may be disposed on a surface of the encapsulant 3. The shielding layer 18 may be a plated metal layer that is used for EMI (electromagnetic interference) shielding. Thus, the shielding layer 18 may include an electromagnetic interference (EMI) shielding material. In some embodiments, the shielding layer 18 may be disposed on and cover the first top surface 36 of the encapsulant 3, the inner lateral surface 35 of the encapsulant 3, the outer lateral surface 38 of the encapsulant 3, the second top surface 37 of the encapsulant 3, and the lateral surface(s) 23 of the substrate 2. As shown in FIG. 2, the shielding layer 18 may include a first portion 181, a second portion 182, a third portion 183 and a fourth portion 184. The first portion 181 of the shielding layer 18 may cover and contact at least a portion of the inner lateral surface 35 of the encapsulant 3. A bottom end surface 1811 of the first portion 181 of the shielding layer 18 on the inner lateral surface 35 of the upper portion 34 of the encapsulant 3 that faces the connector 12 is embedded in the upper portion 34 of the encapsulant 3. A portion of the upper portion 34 of the encapsulant 3 may cover and contact the bottom end surface 1811 of the first portion 181 of the shielding layer 18. The bottom end surface 1811 of the first portion 181 of the shielding layer 18 may be not leveled with the second top surface 37 of the encapsulant 3. Thus, there may be a vertical distance between the bottom end surface 1811 of the first portion 181 of the shielding layer 18 and the second top surface 37 of the encapsulant 3.

The second portion 182 of the shielding layer 18 may cover and contact the first top surface 36 of the encapsulant 3. The third portion 183 of the shielding layer 18 may cover and contact the outer lateral surface 38 of the encapsulant 3 and the lateral surface 23 of the substrate 2. The shielding layer 18 may extend to the lateral surface 23 of the substrate 2. The lateral surface 23 of the substrate 2 may be substantially aligned with the lateral surface 323 of the second portion 32 of the encapsulant 3. A portion of the circuit layer 28 of the substrate 2 may be electrically connected to the third portion 183 of the shielding layer 18. The fourth portion 184 of the shielding layer 18 may disposed on and contact the lateral surface 323 of the second portion 32 of the encapsulant 3 and the lateral surface 23 of the substrate 2. The fourth portion 184 of the shielding layer 18 may be distant from the first portion 31 of the encapsulant 3 in a cross-sectional view. The second portion 32 of the encapsulant 3 may be disposed between the fourth portion 184 of the shielding layer 18 and the first portion 31 of the encapsulant 3.

As shown in FIG. 2, the shielding layer 18 may not cover the top surface (i.e., the second top surface 37) of the second portion 32 of the encapsulant 3. Thus, the first portion 181 of the shielding layer 18 may be discontinuous from the fourth portion 184 of the shielding layer 18. The top surface (i.e., the second top surface 37) of the second portion 32 of the encapsulant 3 may be exposed from the shielding layer 18. In addition, the top surface of the fourth portion 184 of the shielding layer 18 may be aligned with the second top surface 37 of the encapsulant 3. The top surface of the fourth portion 184 of the shielding layer 18 may be not leveled with the bottom end surface 1811 of the first portion 181 of the shielding layer 18. In some embodiments, the shielding layer 18 may cover a portion of the top surface (i.e., the second top surface 37) of the second portion 32 of the encapsulant 3.

As shown in FIG. 1, the fourth portion 184 of the shielding layer 18 may include a first part 1841 and a second part 1842. The first part 1841 may be substantially perpendicular to the second part 1842. As shown in FIG. 3, the first part 1841 of the fourth portion 184 of the shielding layer 18 may cover a first lateral surface 3231 of the second portion 32 of the encapsulant 3. The first lateral surface 3231 of the second portion 32 of the encapsulant 3 may be substantially aligned with a first lateral surface 231 of the substrate 2. As shown in FIG. 2, the second part 1842 of the fourth portion 184 of the shielding layer 18 may cover a second lateral surface 3232 of the second portion 32 of the encapsulant 3. The second lateral surface 3232 of the second portion 32 of the encapsulant 3 may be substantially aligned with a second lateral surface 232 of the substrate 2.

Figure 2A:
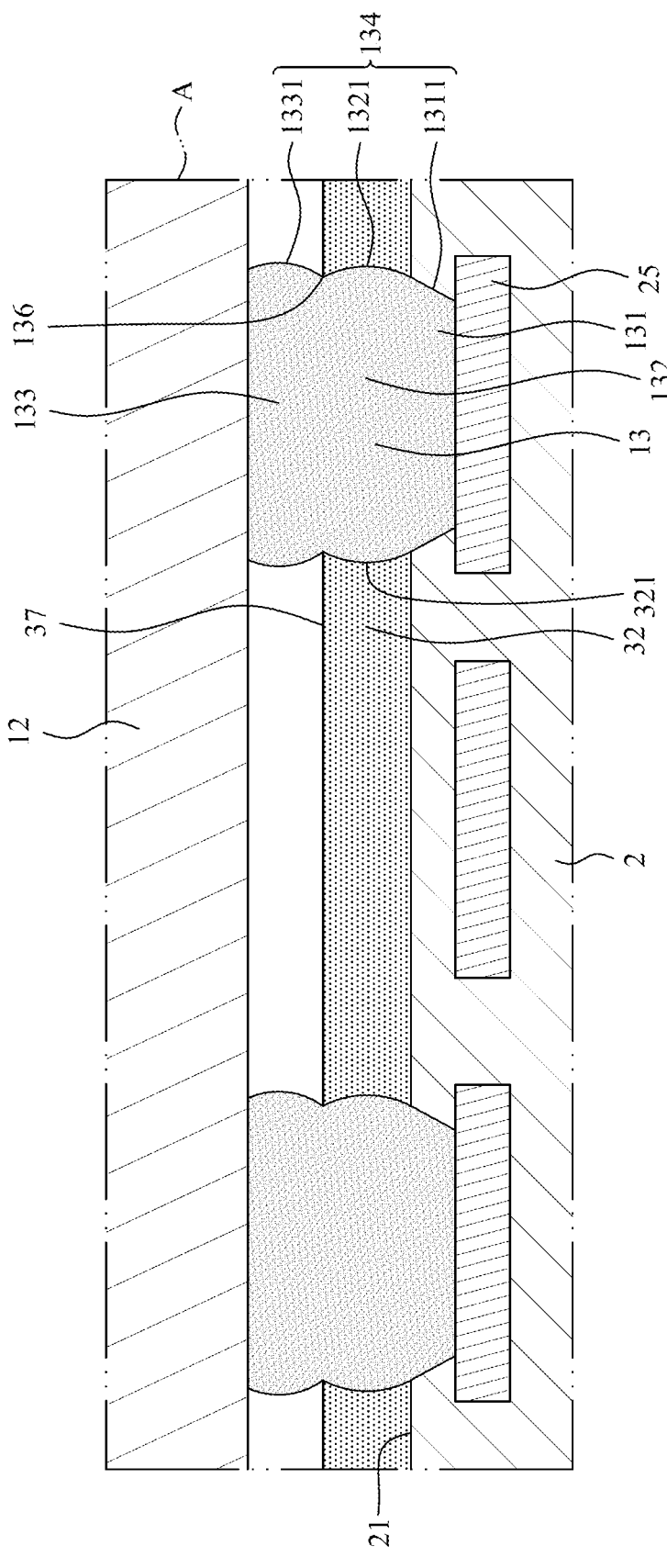
FIG. 2A illustrates an enlarged view of an area "A" of FIG. 2.

FIG. 2A illustrates an enlarged view of an area "A" of FIG. 2. The electronic component 12 may be electrically connected to the substrate 2 through the reflowable element 13, and the second portion 32 of the encapsulant 3 may surround and contact at least a portion of the reflowable element 13. The reflowable element 13 may include a first portion 131, a second portion 132 and a third portion 133. The first portion 131, the second portion 132 and the third portion 133 may be formed integrally as a monolithic structure. The first portion 131 may be disposed in an opening of the dielectric layer of the substrate 2. The first portion 131 may be disposed on and contact the electrical contact 25 (e.g., bonding pads) of the substrate 2. The first portion 131 may have a lateral surface 1311. Further, the second portion 132 may be disposed on the first portion 131, and surrounded by the second portion 32 of the encapsulant 3. The second portion 132 may be disposed in the opening 321 of the second portion 32 of the encapsulant 3. The second portion 132 may have a lateral surface 1321. The lateral surface 1321 may have a curved shape. In addition, the third portion 133 may be disposed on the second portion 132. The third portion 133 may protrude from the top surface (i.e., the second top surface 37) of the second portion 32 of the encapsulant 3 to contact the electronic component 12. The third portion 133 may have a lateral surface 1331. The lateral surface 1331 may have a curved shape. In the cross-sectional view shown in FIG. 2A, the reflowable element 13 may have a lateral surface 134 including the lateral surface 1311 of the first portion 131, the lateral surface 1321 of the second portion 132 and the lateral surface 1331 of the third portion 133. The lateral surface 1321 of the second portion 132 may be discontinuous with the lateral surface 1331 of the third portion 133. Thus, the lateral surface 134 of the reflowable element 13 may be discontinuous. The reflowable element 13 may have a substantially hourglass shape. There may be a neck portion between the second portion 132 and the third portion 133. There may be a turning point 136 at the intersection between the lateral surface 1321 of the second portion 132 and the lateral surface 1331 of the third portion 133. The turning point 136 may be located at the top surface (i.e., the second top surface 37) of the second portion 32 of the encapsulant 3.

Figure 2B:
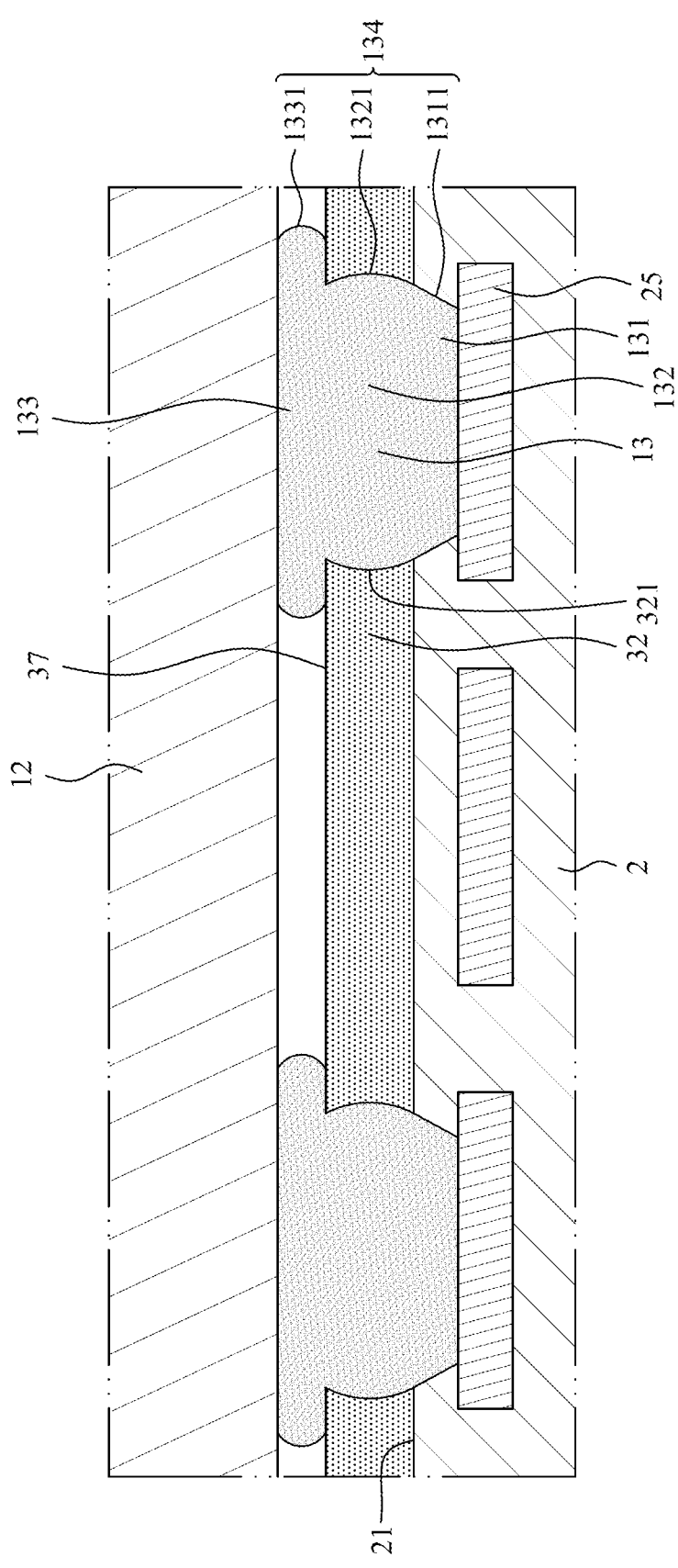
FIG. 2B illustrates an enlarged view of an electronic device according to some embodiments of the present disclosure.

FIG. 2B illustrates an enlarged view of an electronic device according to some embodiments of the present disclosure. The structure of FIG. 2B is similar to the structure of FIG. 2A. As shown in FIG. 2B, the third portion 133 of the reflowable element 13 may extend to contact the top surface (i.e., the second top surface 37) of the second portion 32 of the encapsulant 3. Thus, a portion of the third portion 133 of the reflowable element 13 may be disposed on the top surface (i.e., the second top surface 37) of the second portion 32 of the encapsulant 3.

Referring to FIG. 1 and FIG. 3, the second portion 32 of the encapsulant 3 may include a first region 32a and a second region 32b distant from the first region 32a. The connector 12 may include a first electronic component 12a (e.g., a first connector) and a second electronic component 12b (e.g., a second connector). The accommodating space 17 may include a first accommodating space 17a and a second accommodating space 17b. That is, the encapsulant 3 may define the first accommodating space 17a corresponding to the first region 32a and a second accommodating space 17b corresponding to the second region 32b. The first electronic component 12a (e.g., the first connector) may be disposed in the first accommodating space 17a, and may be disposed over the first region 32a. The first electronic component 12a (e.g., the first connector) may be disposed outside or external to the encapsulant 3, and electrically connected to the electrical contact 25 (e.g., bonding pad) of the substrate 2 through the reflowable element 13. Further, the second electronic component 12b (e.g., the second connector) may be disposed in the second accommodating space 17b and disposed over the second region 32b. The second electronic component 12b (e.g., the second connector) may be disposed outside or external to the encapsulant 3, and electrically connected to the electrical contact 25 (e.g., bonding pad) of the substrate 2 through the reflowable element 13.

A portion 341 of the upper portion 34 of the encapsulant 3 may be located between the first electronic component 12a (e.g., the first connector) and the second electronic component 12b (e.g., the second connector). Alternatively, the portion 341 of the upper portion 34 of the encapsulant 3 may be located between the first region 32a and the second region 32b. The first accommodating space 17a may extend to at least two lateral surfaces 323 of the first region 32a of the second portion 32 of the encapsulant 3. The second accommodating space 17b may extend to at least two lateral surfaces 323 of the second region 32b of the second portion 32 of the encapsulant 3.

In the embodiment illustrated in FIG. 1 to FIG. 3, the encapsulant 3 may be formed by a step-shaped molding process, thus, only a small amount of the second portion 32 of the second portion 32 of the encapsulant 3 is needed to be removed. Thus, a manufacturing time and manufacturing cost are reduced. In addition, a heat dissipation rate of the encapsulant 3 is higher than air. As a result, the performance of the electronic device 1 is improved.

Figure 4:
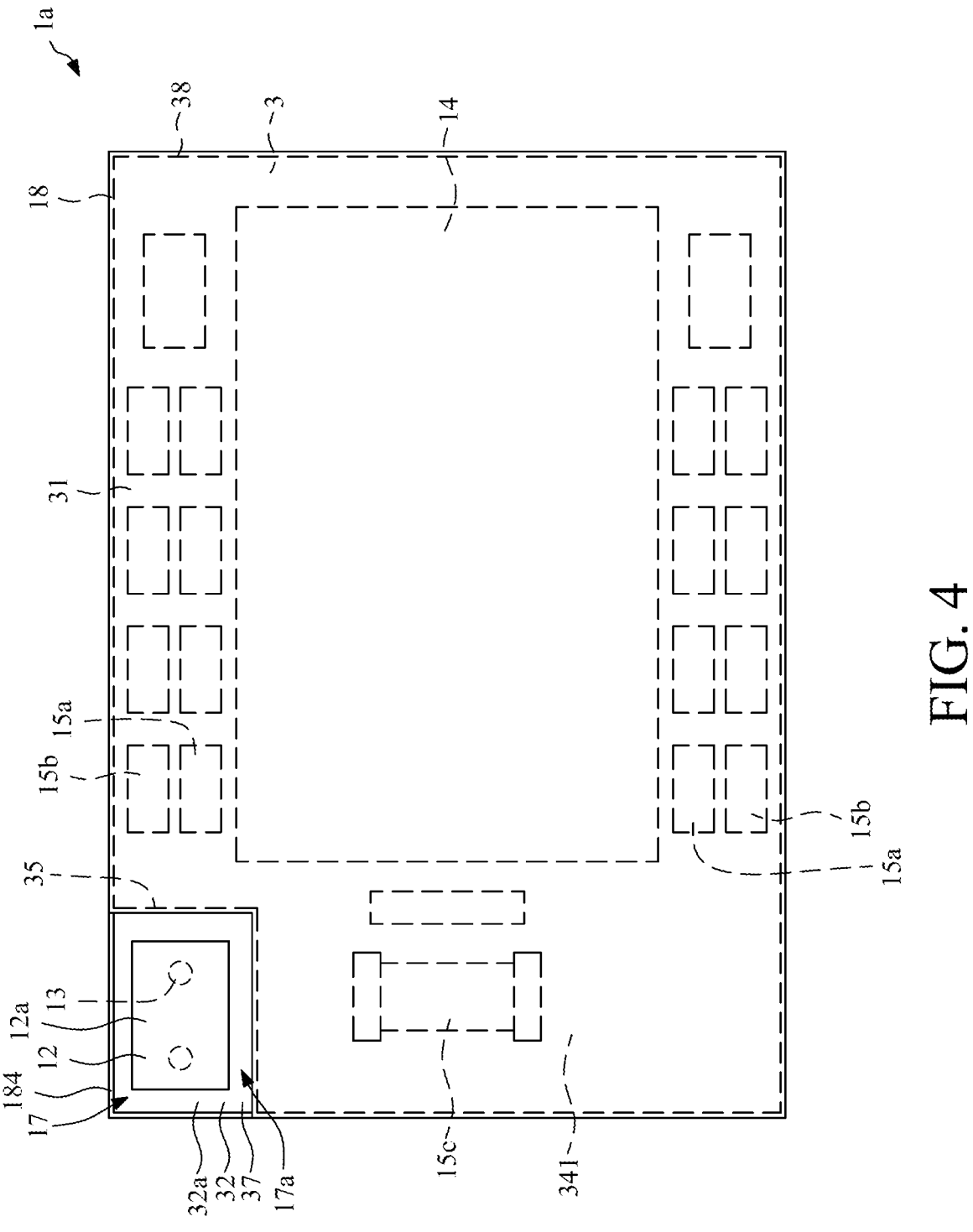
FIG. 4 illustrates a top view of an electronic device according to some embodiments of the present disclosure.

FIG. 4 illustrates a top view of an electronic device 1a according to some embodiments of the present disclosure. The electronic device 1a of FIG. 4 is similar to the electronic device 1 of FIG. 1, except that the second region 32b of the second portion 32 of the encapsulant 3, the second accommodating space 17b and the second electronic component 12b (e.g., the second connector) may be omitted.

Figure 5:
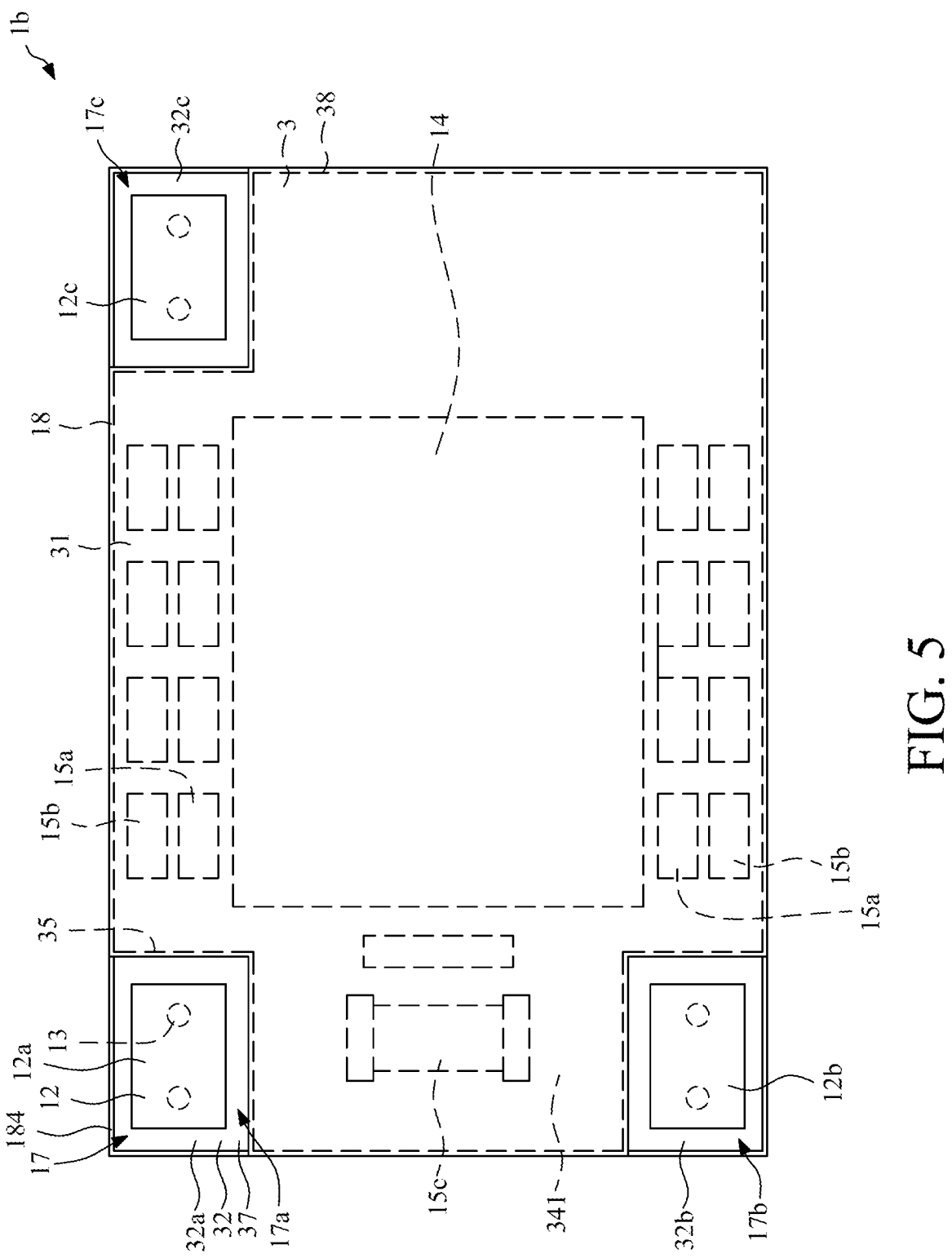
FIG. 5 illustrates a top view of an electronic device according to some embodiments of the present disclosure.

FIG. 5 illustrates a top view of an electronic device 1b according to some embodiments of the present disclosure. The electronic device 1b of FIG. 5 is similar to the electronic device 1 of FIG. 1, except that a third region 32c of the second portion 32 of the encapsulant 3, a third accommodating space 17c and a third electronic component 12c (e.g., a third connector) may be further included. The third electronic component 12c (e.g., the third connector) may be disposed in the third accommodating space 17c and disposed over the third region 32c. The third electronic component 12c (e.g., the third connector) may be disposed outside or external to the encapsulant 3, and electrically connected to the electrical contact 25 (e.g., bonding pad) of the substrate 2 through the reflowable element 13. A portion of the upper portion 34 of the encapsulant 3 may be located between the first electronic component 12a (e.g., the first connector) and the third electronic component 12c (e.g., the third connector).

Figure 6:
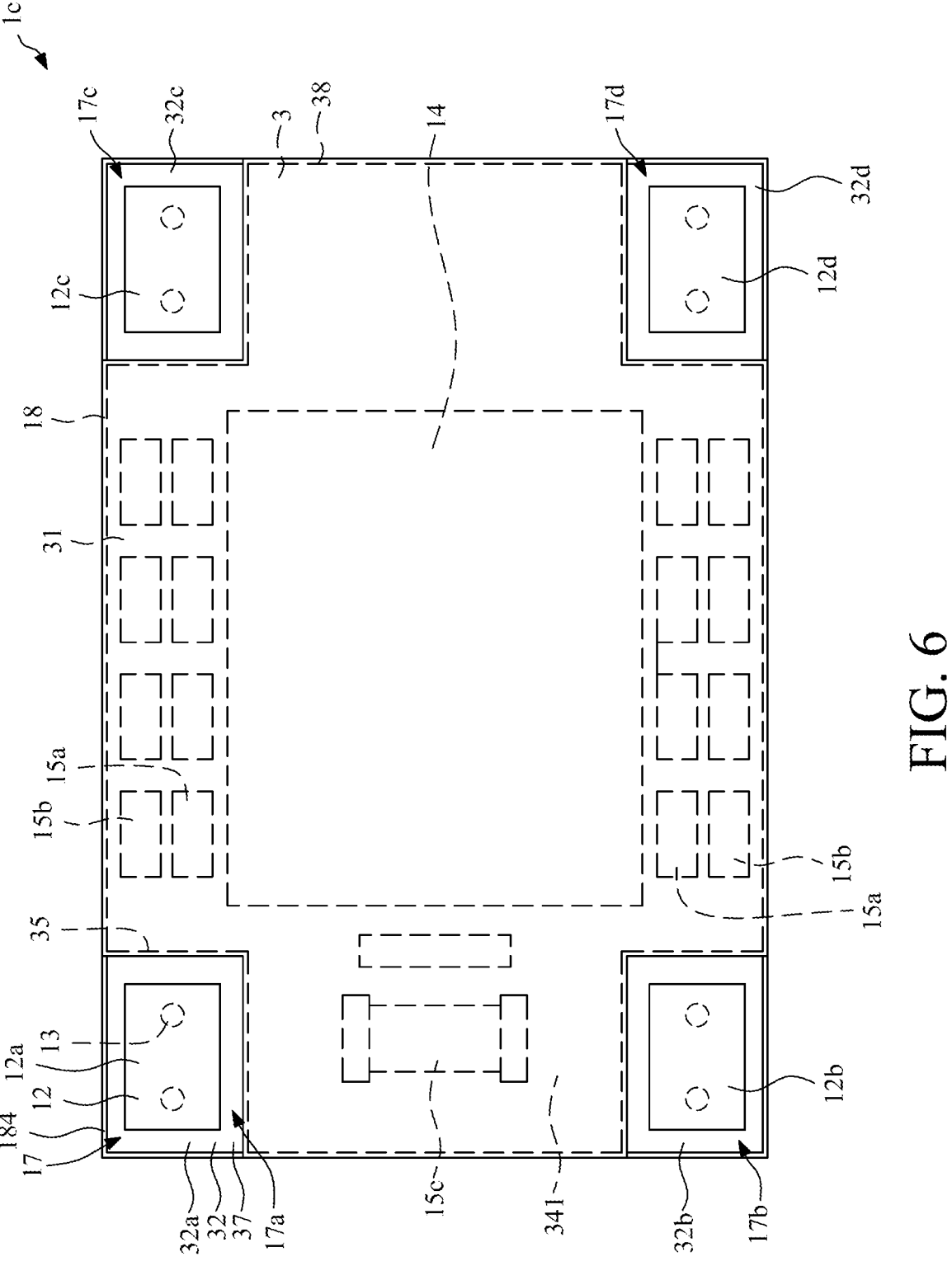
FIG. 6 illustrates a top view of an electronic device according to some embodiments of the present disclosure.

FIG. 6 illustrates a top view of an electronic device 1c according to some embodiments of the present disclosure. The electronic device 1c of FIG. 6 is similar to the electronic device 1b of FIG. 5, except that a fourth region 32d of the second portion 32 of the encapsulant 3, a fourth accommodating space 17d and a fourth electronic component 12d (e.g., a fourth connector) may be further included. The fourth electronic component 12d (e.g., the fourth connector) may be disposed in the fourth accommodating space 17d and disposed over the fourth region 32d. The fourth electronic component 12d (e.g., the fourth connector) may be disposed outside or external to the encapsulant 3, and electrically connected to the electrical contact 25 (e.g., bonding pad) of the substrate 2 through the reflowable element 13. A portion of the upper portion 34 of the encapsulant 3 may be located between the fourth electronic component 12d (e.g., the fourth connector) and the third electronic component 12c (e.g., the third connector).

Figure 7:
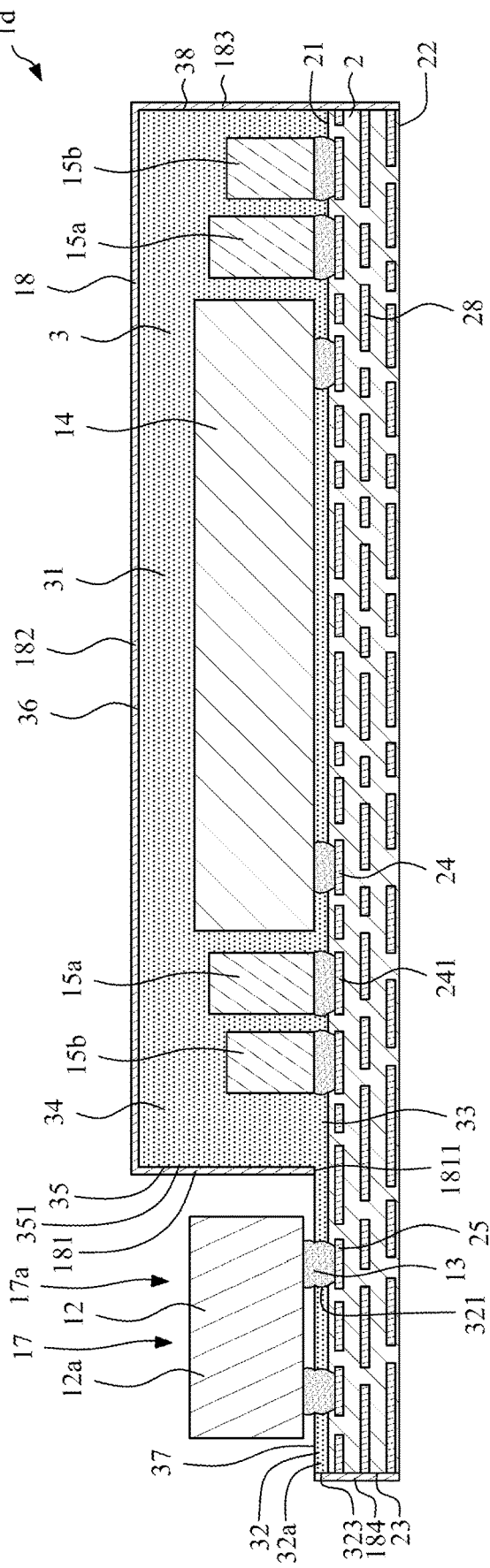
FIG. 7 illustrates a top view of an electronic device according to some embodiments of the present disclosure.

FIG. 7 illustrates a top view of an electronic device 1d according to some embodiments of the present disclosure. The electronic device 1d of FIG. 7 is similar to the electronic device 1 of FIG. 2, except that the bottom end surface 1811 of the first portion 181 of the shielding layer 18 may be leveled with or aligned with the second top surface 37 of the encapsulant 3. In addition, the top surface of the fourth portion 184 of the shielding layer 18 may be leveled with the bottom end surface 1811 of the first portion 181 of the shielding layer 18.

Figure 8:
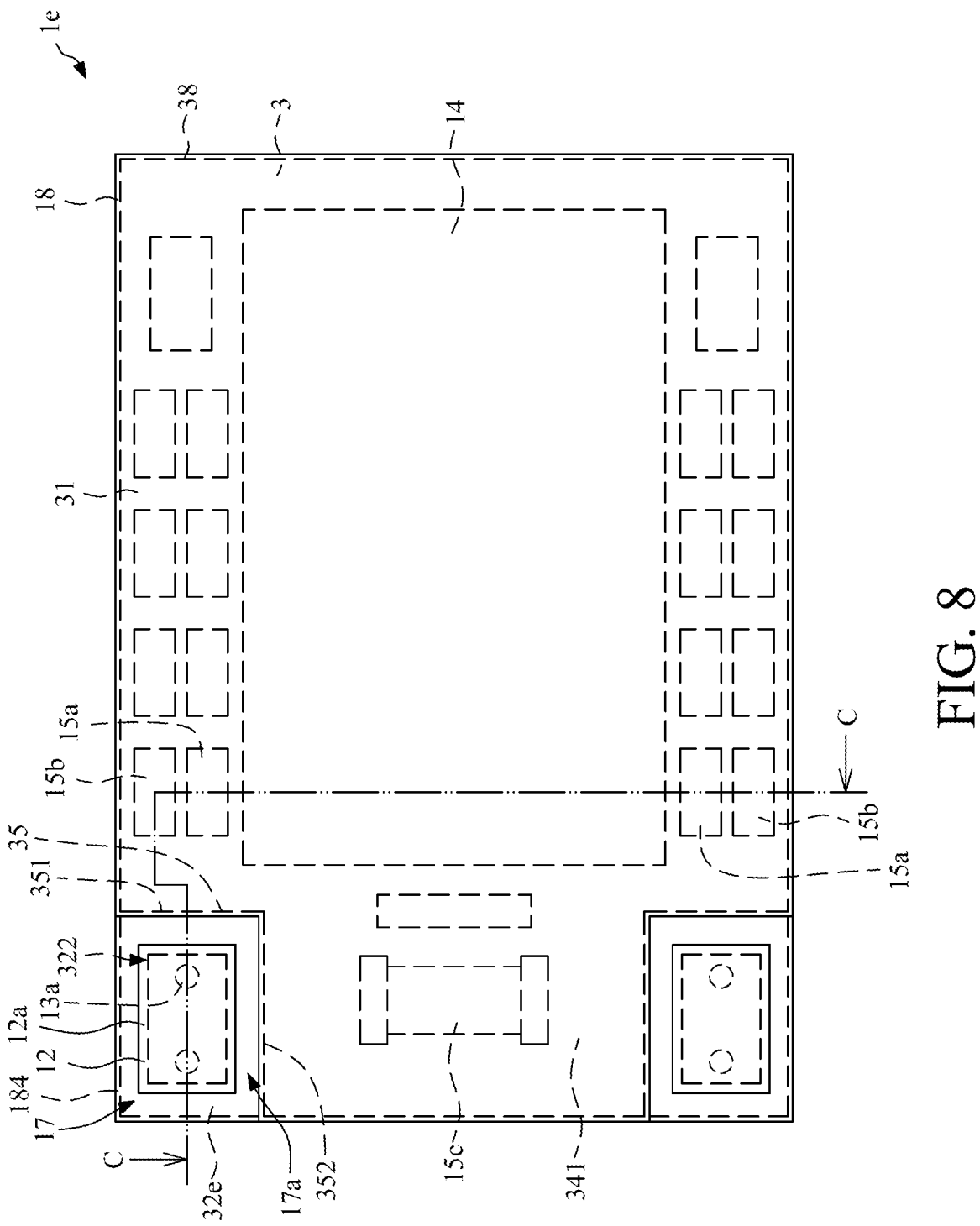
FIG. 8 illustrates a top view of an electronic device according to some embodiments of the present disclosure.

FIG. 8 illustrates a top view of an electronic device 1e according to some embodiments of the present disclosure. FIG. 9 illustrates a cross-sectional view taken along line C-C in FIG. 8. The electronic device 1e of FIG. 8 and FIG. 9 is similar to the electronic device 1 of FIG. 1 and FIG. 2, except for the structure of the second portion 32e of the encapsulant 3, and the structure of the reflowable element 13a. The second portion 32e of the encapsulant 3 may be thicker than the second portion 32 of the encapsulant 3 of FIG. 2, and may further define a recess portion 322 recessed from the top surface (i.e., the second top surface 37) of the second portion 32e of the encapsulant 3. The recess portion 322 may not extend through the second portion 32e, and may be communicated with the opening 321. Thus, the second portion 32e of the encapsulant 3 may be in a substantially "U" shape. The recess portion 322 may have a bottom surface 3221. The bottom surface 3221 may be also referred to as a third top surface of the second portion 32e of the encapsulant 3. Thus, the second portion 32e of the encapsulant 3 may further have a third top surface 3221 (i.e., the bottom surface 3221 of the recess portion 322) different from the second top surface 37. The shielding layer 18 may be disposed over the second top surface 37 except for the third top surface 3221.

At least two reflowable materials 13a may be disposed in one recess portion 322. The recess portion 322 may expose a portion of the reflowable element 13a that connects the substrate 2 and the electronic component 12. A third portion 133 of the reflowable element 13a may extend from a bottom surface 3221 of the recess portion 322 to the electronic component 12 (e.g., the connector). The third portion 133 of the reflowable element 13a may extend beyond the top surface (i.e., the second top surface 37) of the second portion 32e of the encapsulant 3. Thus, a height of the third portion 133 of the reflowable element 13a may be greater than a depth of the recess portion 322. A horizontal gap may be formed between a lateral surface of the third portion 133 of the reflowable element 13a and a sidewall of the recess portion 322. That is, the third portion 133 of the reflowable element 13a may be spaced apart from the sidewall of the recess portion 322. The third portion 133 of the reflowable element 13a may not contact the sidewall of the recess portion 322. Further, the opening 321 may extend between the bottom surface 3221 of the recess portion 322 and the first surface 21 of the substrate 2. In addition, a portion of the shielding layer 18 may be disposed on the top surface (i.e., the second top surface 37) of the second portion 32e of the encapsulant 3. Thus, a portion of the shielding layer 18 may be disposed between the second portion 32e of the encapsulant 3 and the electronic component 12 (e.g., the connector). It is noted that a portion of the shielding layer 18 may be disposed on the top surface 37 of the second portion 32e of the encapsulant 3, and may be spaced apart from the reflowable element 13a. The shielding layer 18 may not contact the reflowable element 13a.

Figure 10:
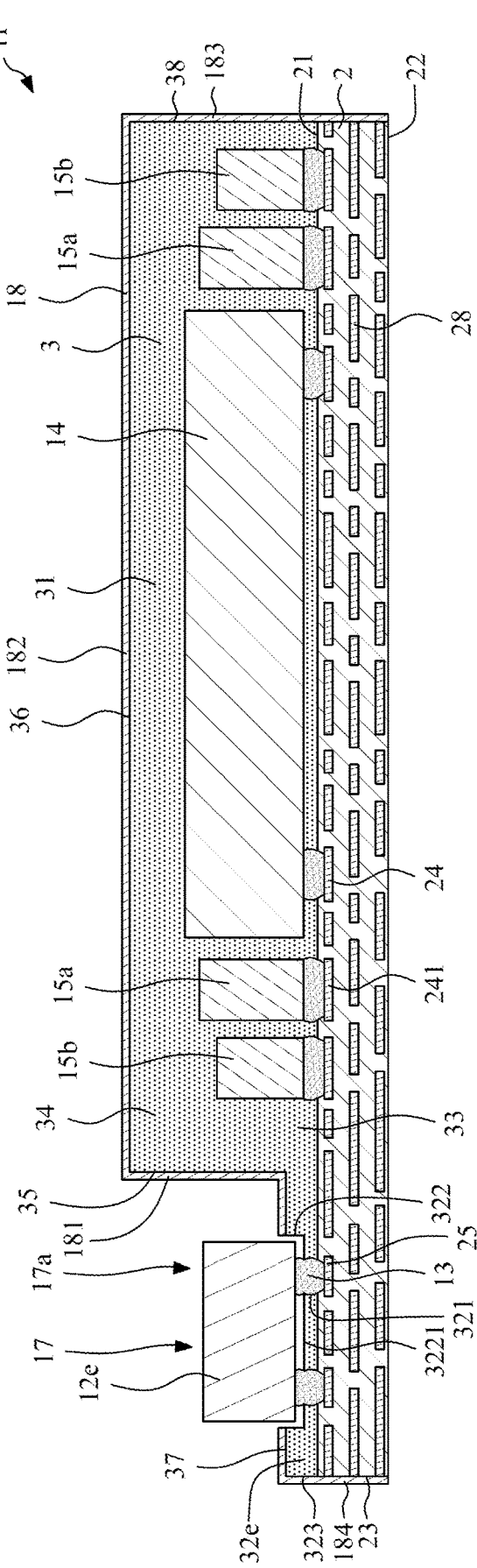
FIG. 10 illustrates a cross-sectional view of an electronic device according to some embodiments of the present disclosure.
Figure 11:
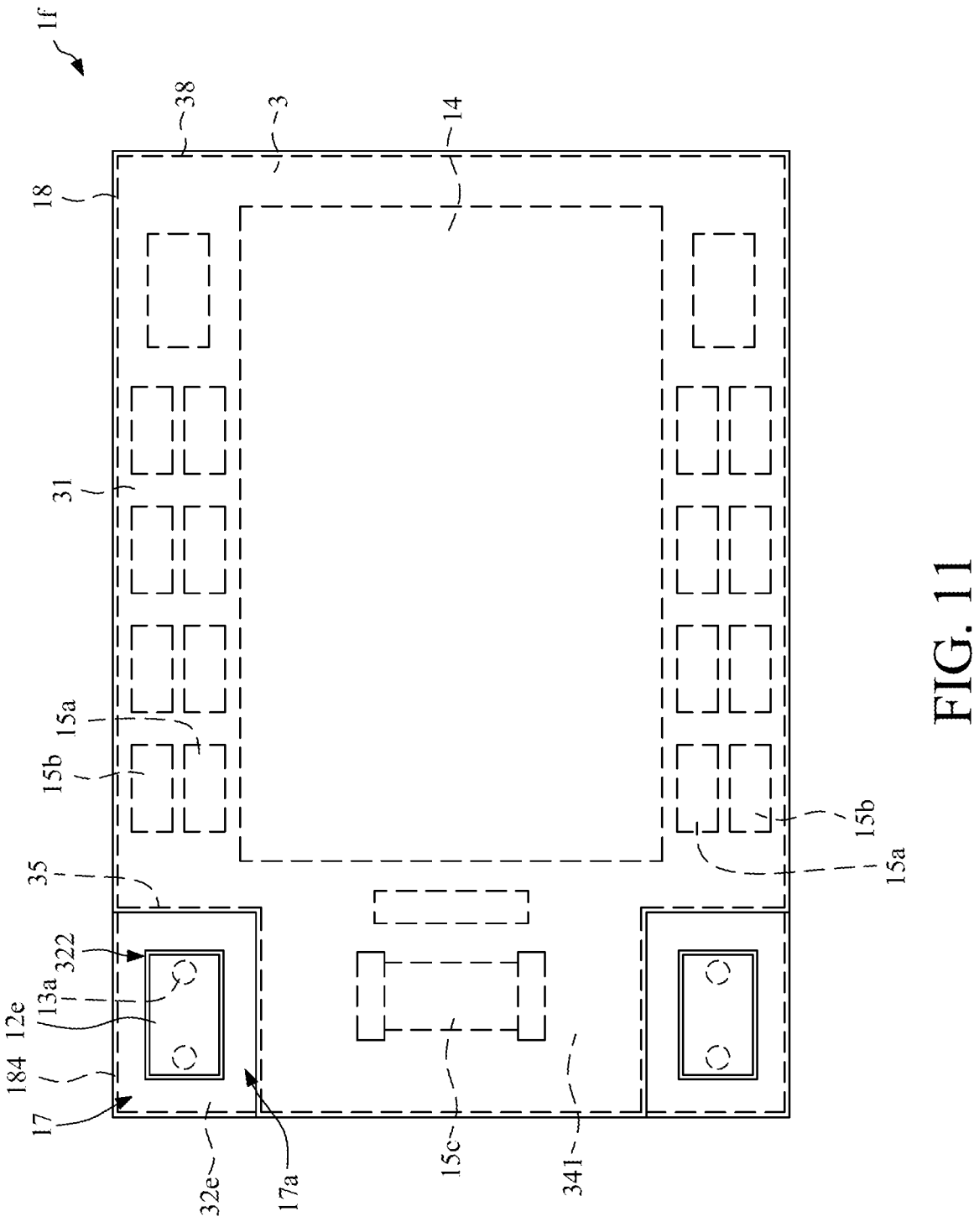
FIG. 11 illustrates a top view of the electronic device of FIG. 10.

FIG. 10 illustrates a cross-sectional view of an electronic device if according to some embodiments of the present disclosure. FIG. 11 illustrates a top view of the electronic device if of FIG. 10. The electronic device if of FIG. 10 and FIG. 11 is similar to the electronic device 1e of FIG. 7 and FIG. 8, except that a width of the electronic component 12e (e.g., a connector) may be slightly less than a width of the recess portion 322. A bottom portion of the electronic component 12e (e.g., a connector) may be disposed in the recess portion 322. Thus, a shift of the electronic component 12e after a reflow process may be reduced.

Figure 12:
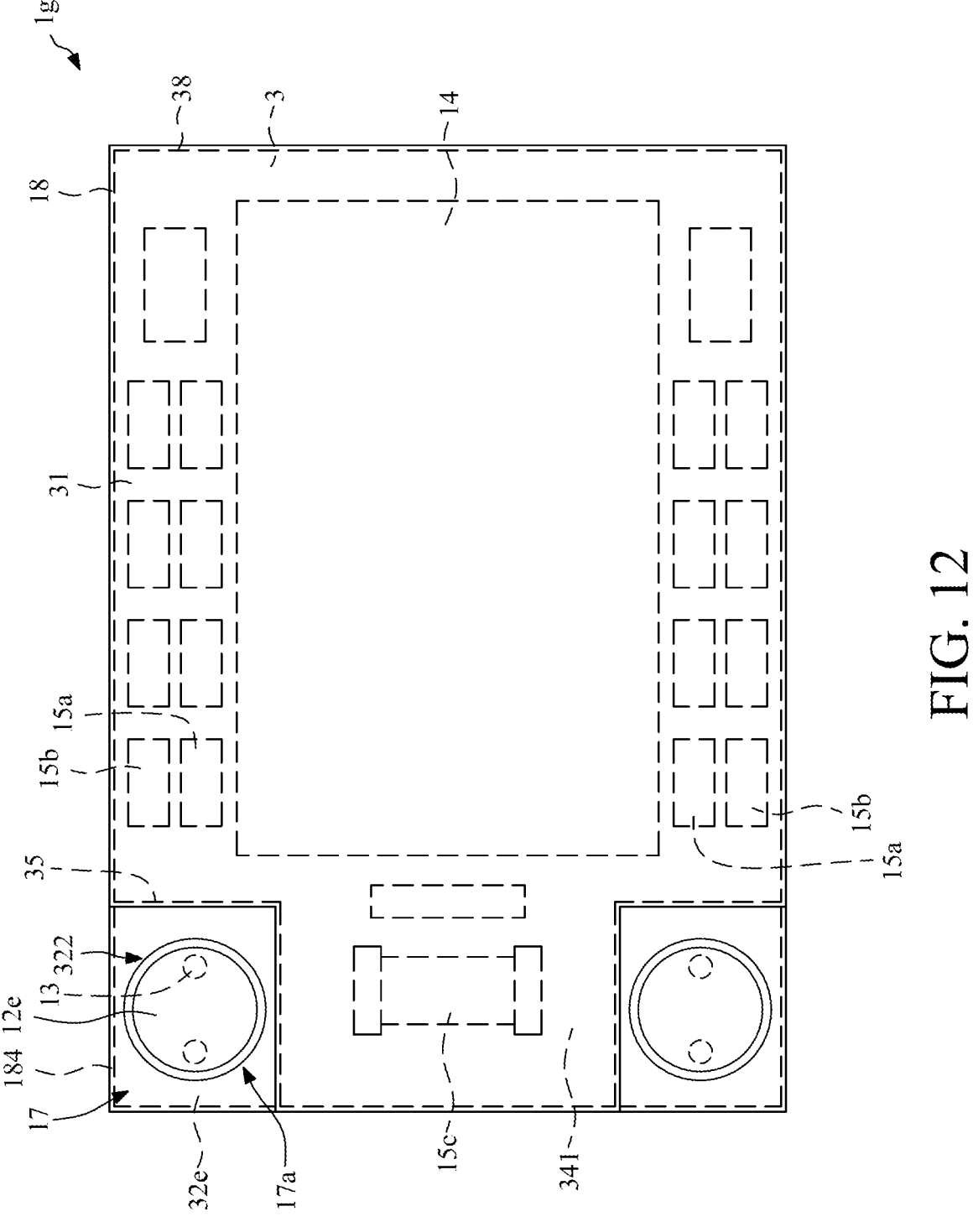
FIG. 12 illustrates a top view of an electronic device according to some embodiments of the present disclosure.

FIG. 12 illustrates a top view of an electronic device 1g according to some embodiments of the present disclosure. The electronic device 1g of FIG. 12 is similar to the electronic device if of FIG. 11, except that a shape of the electronic component 12e (e.g., the connector) and a shape of the recess portion 322 may be both circular. That is, the shape of the recess portion 322 may be designed according to the shape of the electronic component 12e (e.g., the connector) such that the recess portion 322 may accommodated a bottom portion of the electronic component 12e (e.g., the connector).

Figure 13:
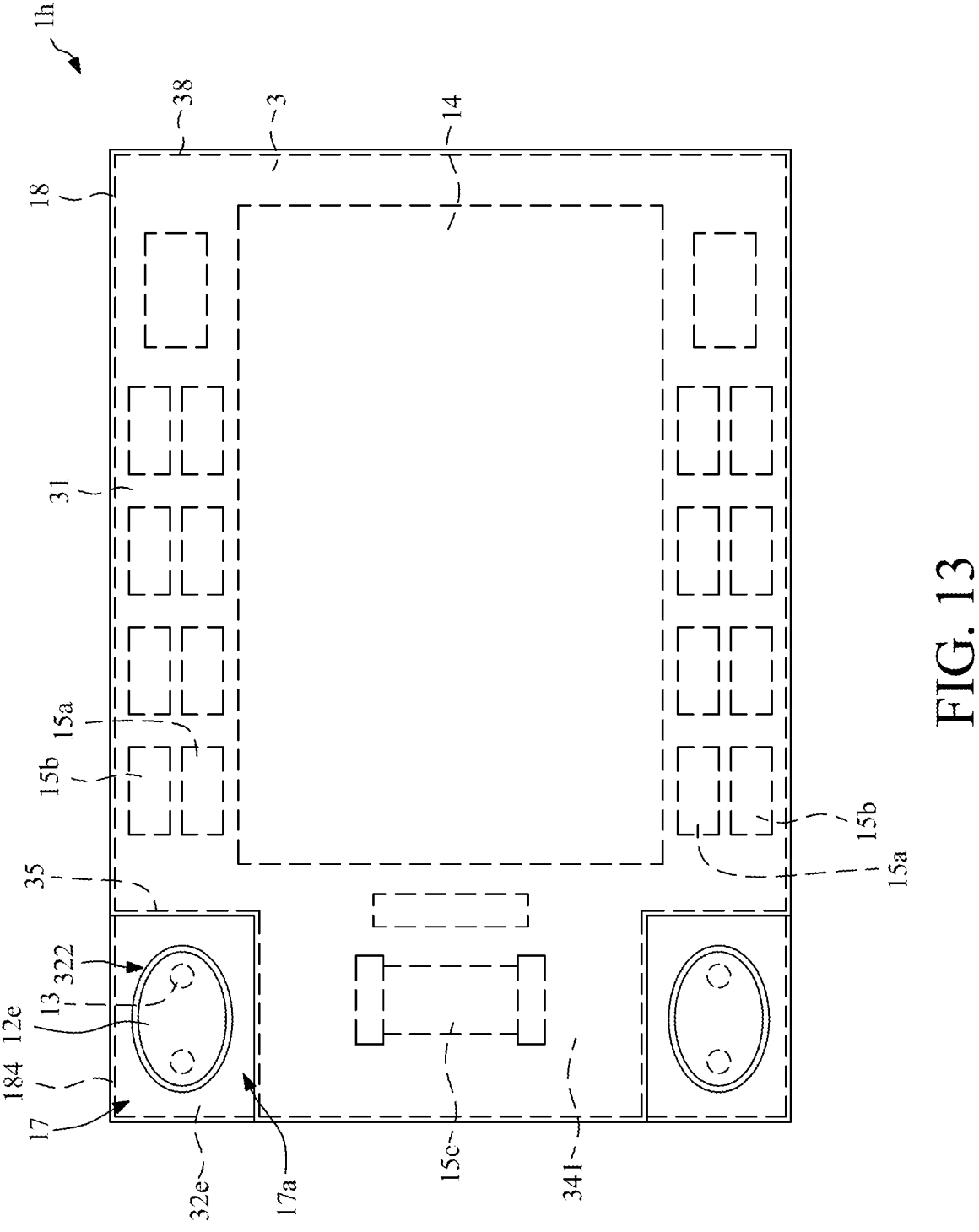
FIG. 13 illustrates a top view of an electronic device according to some embodiments of the present disclosure.

FIG. 13 illustrates a top view of an electronic device 1h according to some embodiments of the present disclosure. The electronic device 1h of FIG. 13 is similar to the electronic device 1g of FIG. 12, except that a shape of the electronic component 12e (e.g., the connector) and a shape of the recess portion 322 may be both oval.

Figure 14:
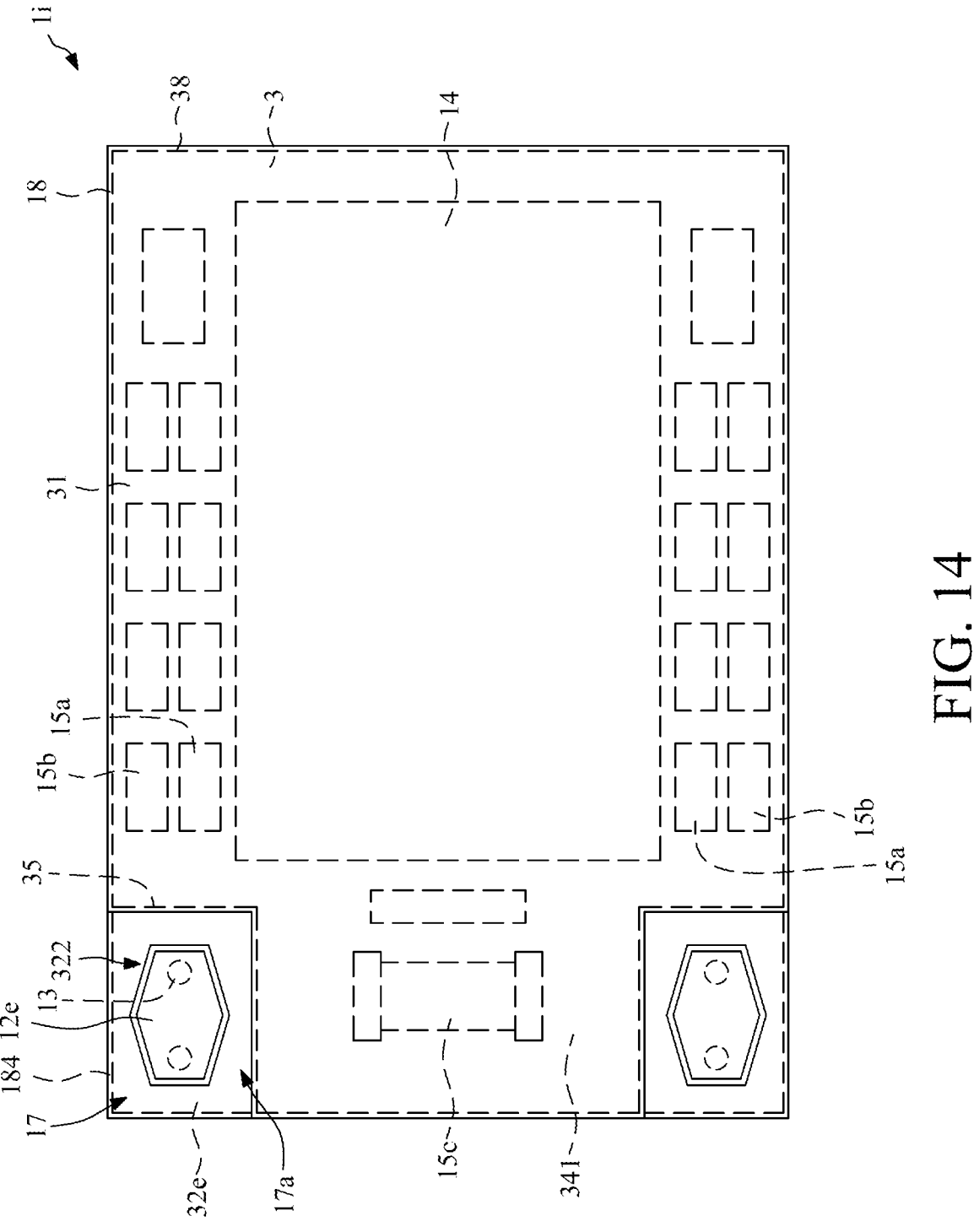
FIG. 14 illustrates a top view of an electronic device according to some embodiments of the present disclosure.

FIG. 14 illustrates a top view of an electronic device 1i according to some embodiments of the present disclosure. The electronic device 1i of FIG. 14 is similar to the electronic device 1g of FIG. 12, except that a shape of the electronic component 12e (e.g., the connector) and a shape of the recess portion 322 may be both hexagonal.

Figure 15:
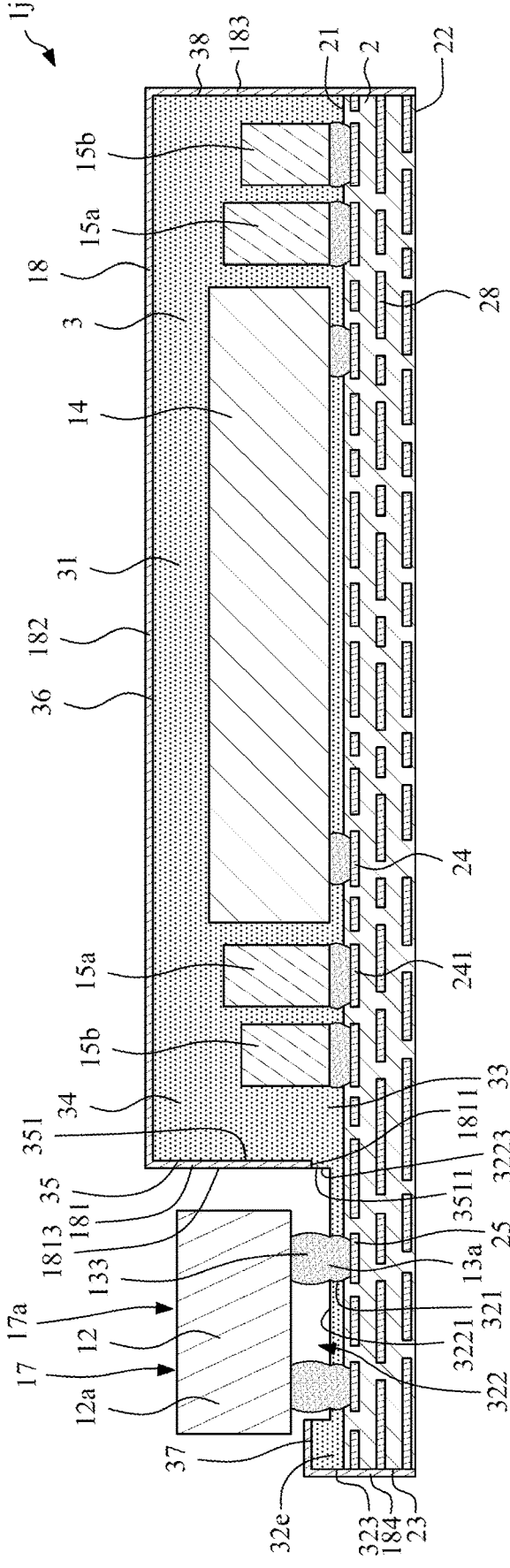
FIG. 15 illustrates a cross-sectional view of an electronic device according to some embodiments of the present disclosure.

FIG. 15 illustrates a cross-sectional view of an electronic device 1j according to some embodiments of the present disclosure. The electronic device 1j of FIG. 15 is similar to the electronic device 1e of FIG. 9, except that a right portion of the recess portion 322 may extend to the upper portion 34 of the encapsulant 3. Thus, the second portion 32e of the encapsulant 3 may be in a substantially "L" shape. Further, a lateral surface 1813 of the first portion 181 of the shielding layer 18 may be substantially aligned with a sidewall 3223 of the recess portion 322.

Figure 16:
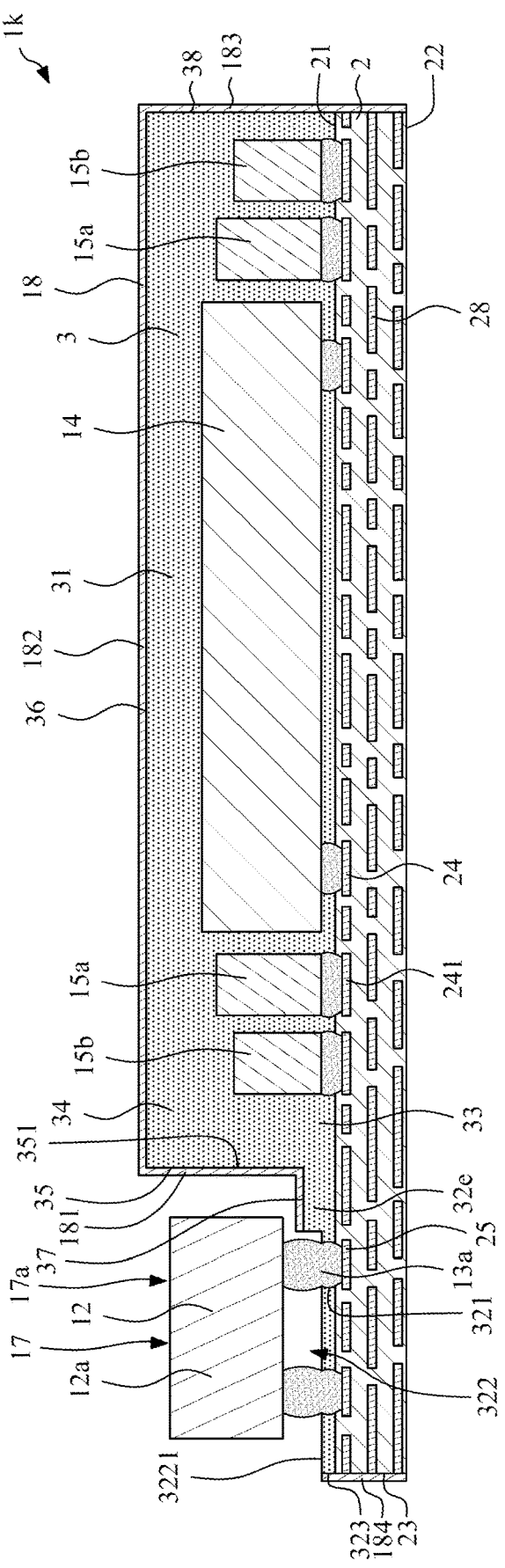
FIG. 16 illustrates a cross-sectional view of an electronic device according to some embodiments of the present disclosure.

FIG. 16 illustrates a cross-sectional view of an electronic device 1k according to some embodiments of the present disclosure. The electronic device 1k of FIG. 16 is similar to the electronic device 1e of FIG. 9, except that the left portion of the recess portion 322 may extend to the lateral surface 323 of the second portion 32e of the encapsulant 3. Thus, the second portion 32e of the encapsulant 3 may be in a substantially reversed "L" shape. The bottom surface 3221 of the recess portion 322 may extend to connect the lateral surface 323 of the second portion 32e. The second portion 32e of the encapsulant 3 may be a step structure.

Figure 17:
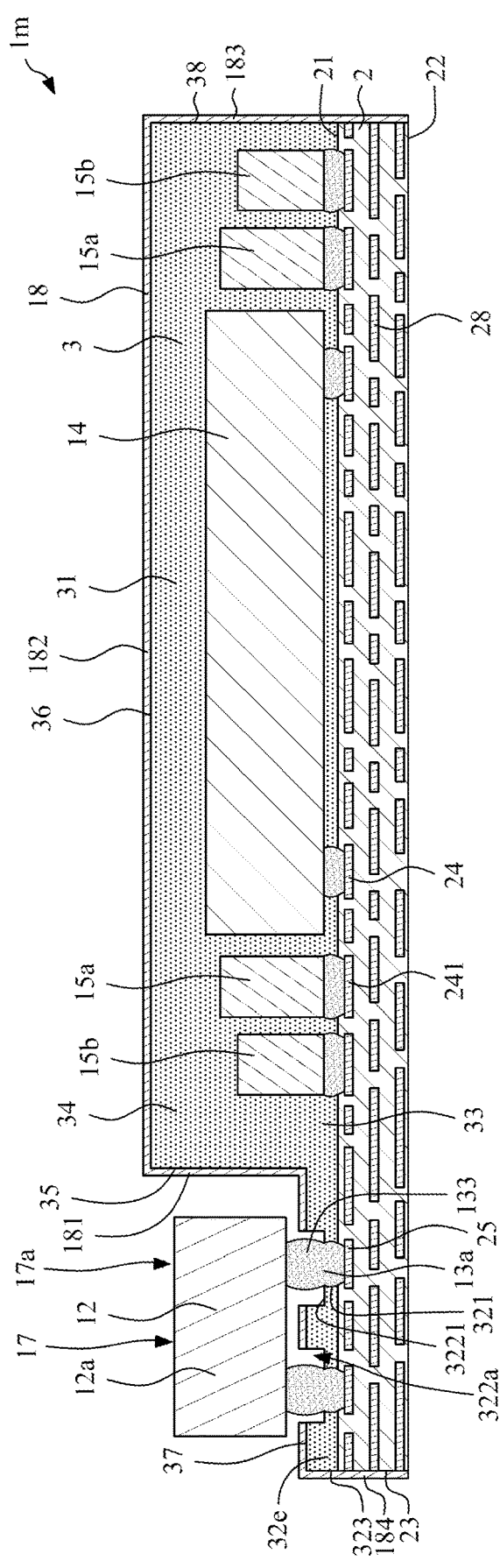
FIG. 17 illustrates a cross-sectional view of an electronic device according to some embodiments of the present disclosure.

FIG. 17 illustrates a cross-sectional view of an electronic device 1m according to some embodiments of the present disclosure. The electronic device 1m of FIG. 17 is similar to the electronic device 1e of FIG. 9, except that the second portion 32e of the encapsulant 3 may define a plurality of recess portions 322a recessed from the top surface (i.e., the second top surface 37) of the second portion 32e of the encapsulant 3. Each of the recess portions 322 may not extend through the second portion 32e, and may be communicated with the opening 321. One reflowable element 13a may be disposed in one recess portion 322a.

Figure 18:
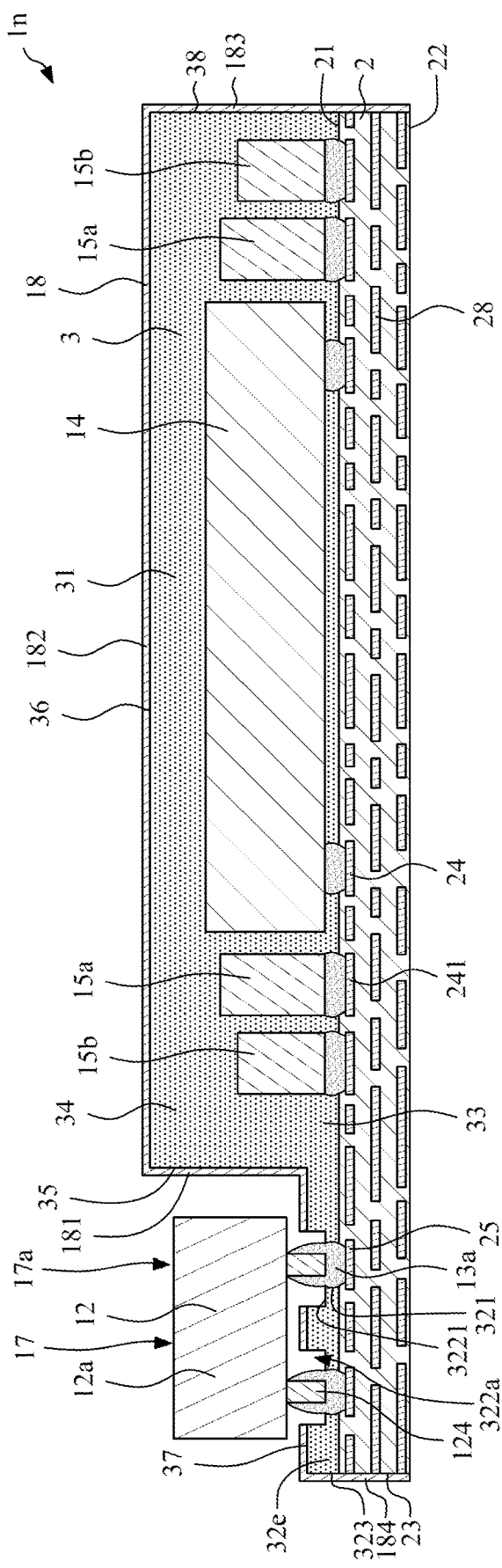
FIG. 18 illustrates a cross-sectional view of an electronic device according to some embodiments of the present disclosure.

FIG. 18 illustrates a cross-sectional view of an electronic device 1n according to some embodiments of the present disclosure. The electronic device 1n of FIG. 18 is similar to the electronic device 1m of FIG. 17, except that the electronic component 12 (e.g., the connector) may include at least one protrusion 124 protruding from a bottom surface of the electronic component 12 and inserting into the reflowable element 13a. A portion of the reflowable element 13a may extend to a lateral surface of the protrusion 124.

Figure 19:
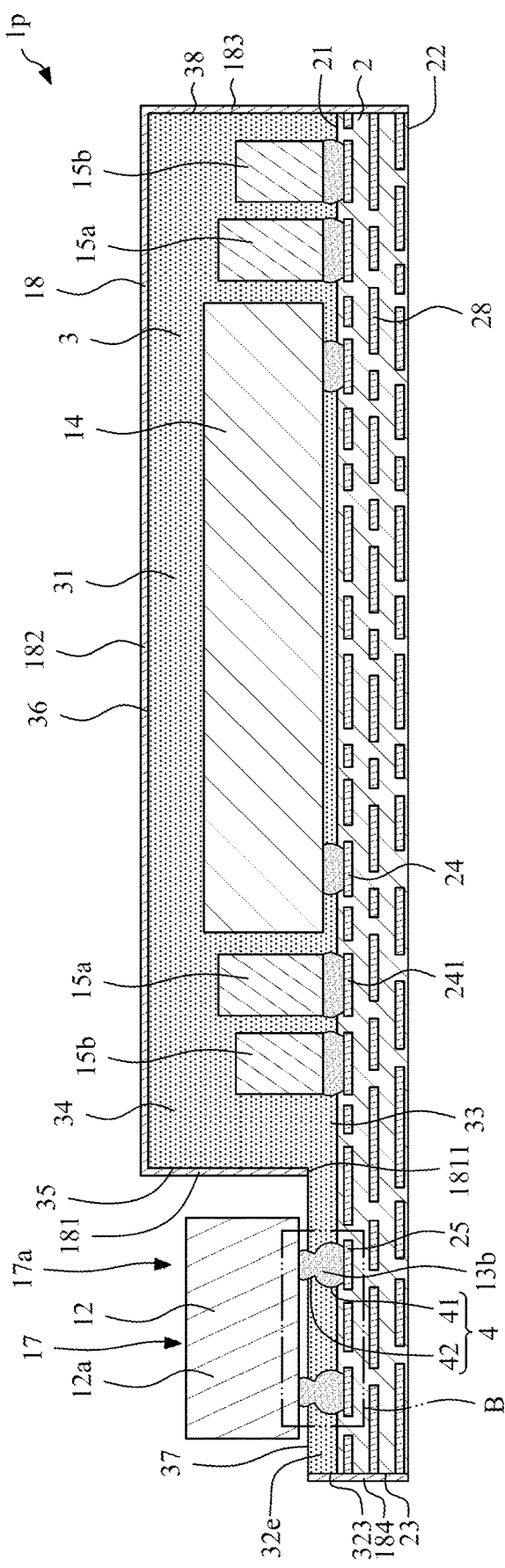
FIG. 19 illustrates a cross-sectional view of an electronic device according to some embodiments of the present disclosure.
Figure 20:
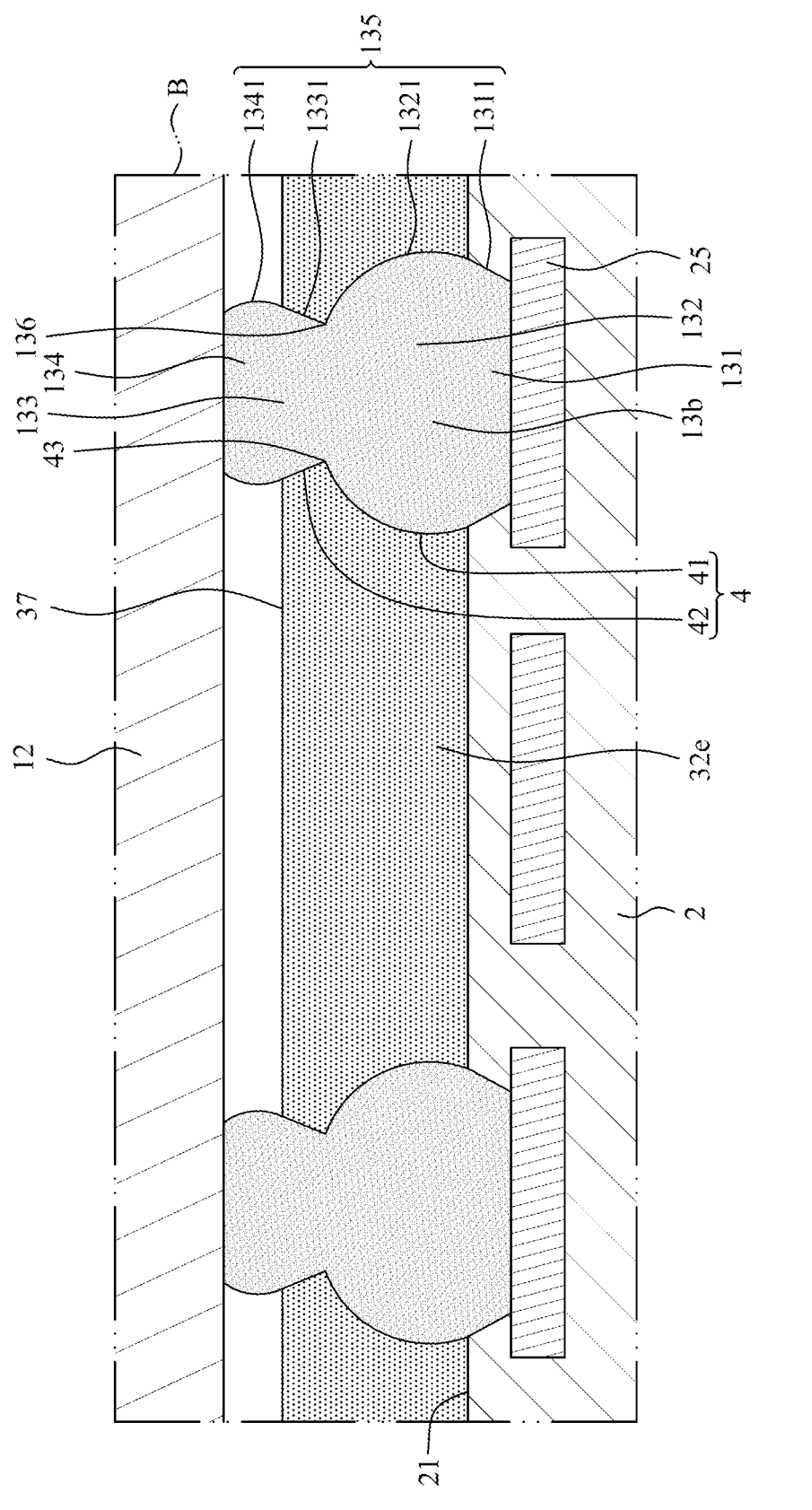
FIG. 20 illustrates an enlarged view of an area "B" of FIG. 19.

FIG. 19 illustrates a cross-sectional view of an electronic device 1p according to some embodiments of the present disclosure. FIG. 20 illustrates an enlarged view of an area "B" of FIG. 19. The electronic device 1p of FIG. 19 and FIG. 20 is similar to the electronic device 1 of FIG. 1 and FIG. 2, except for the structure of the second portion 32e of the encapsulant 3, and the structure of the reflowable element 13b. The second portion 32e of the encapsulant 3 may be thicker than the second portion 32 of the encapsulant 3 of FIG. 2. The second portion 32e of the encapsulant 3 may define a through hole 4 for accommodating at least a portion of the reflowable element 13b. The through hole 4 may include a lower portion 41 and an upper portion 42. A sidewall of the lower portion 41 may be discontinuous with a sidewall of the upper portion 42. Thus, the entire sidewall of the through hole 4 may be discontinuous. The through hole 4 may have a substantially hourglass shape. There may be a neck portion between the lower portion 41 and the upper portion 42. There may be a turning point 43 at the intersection between the sidewall of the lower portion 41 and the sidewall of the upper portion 42. The turning point 43 may be located within the second portion 32e of the encapsulant 3. A vertical distance between the turning point 43 and the first surface 21 of the substrate 2 may be greater than a vertical distance between the turning point 43 and the top surface (i.e., the second top surface 37) of the second portion 32e of the encapsulant 3.

The reflowable element 13b may include a first portion 131, a second portion 132, a third portion 133 and a fourth portion 134. The first portion 131, the second portion 132, the third portion 133 and the fourth portion 134 may be formed integrally as a monolithic structure. The first portion 131 may be disposed in an opening of the dielectric layer of the substrate 2. The first portion 131 may be disposed on and contact the electrical contact 25 (e.g., bonding pads) of the substrate 2. The first portion 131 may have a lateral surface 1311. Further, the second portion 132 may be disposed on the first portion 131, and may be surrounded by the second portion 32e of the encapsulant 3. The second portion 132 may be disposed in the lower portion 41 of the through hole 4. The second portion 132 may have a lateral surface 1321 corresponding to the sidewall of the lower portion 41 of the through hole 4. The lateral surface 1321 may have a curved shape.

In addition, the third portion 133 may be disposed on the second portion 132, and may be surrounded by the second portion 32e of the encapsulant 3. The third portion 133 may be disposed in the upper portion 42 of the through hole 4. The third portion 133 may have a lateral surface 1331 corresponding to the sidewall of the upper portion 42 of the through hole 4. The lateral surface 1331 may have a straight line shape. A thickness of the third portion 133 may be less than a thickness of the second portion 132.

The fourth portion 134 may protrude from the top surface (i.e., the second top surface 37) of the second portion 32e of the encapsulant 3 to contact the electronic component 12. The fourth portion 134 may have a lateral surface 1341. The lateral surface 1341 may have a curved shape. In the cross-sectional view shown in FIG. 19, the reflowable element 13b may have a lateral surface 135 including the lateral surface 1311 of the first portion 131, the lateral surface 1321 of the second portion 132, the lateral surface 1331 of the third portion 133 and the lateral surface 1341 of the fourth portion 134. The lateral surface 1321 of the second portion 132 may be discontinuous with the lateral surface 1331 of the third portion 133. Thus, the lateral surface 135 of the reflowable element 13b may be discontinuous. The reflowable element 13b may have a substantially hourglass shape. There may be a neck portion between the second portion 132 and the third portion 133. There may be a turning point 136 at the intersection between the lateral surface 1321 of the second portion 132 and the lateral surface 1331 of the third portion 133. The turning point 136 corresponds to the turning point 43 of the through hole 4.

In some embodiments, a profile of the sidewall of the lower portion 41 of the through hole 4 may be determined by the lateral surface 1321 of the second portion 132 of the reflowable element 13b since the lateral surface 1321 of the second portion 132 of the reflowable element 13b is formed before the formation of the second portion 32e of the encapsulant 3. Further, a profile of the lateral surface 1331 of the third portion 133 of the reflowable element 13b may be determined by the sidewall of the upper portion 42 of the through hole 4 since the sidewall of the upper portion 42 of the through hole 4 is formed before the formation of the third portion 133 of the reflowable element 13b.

Figure 21:
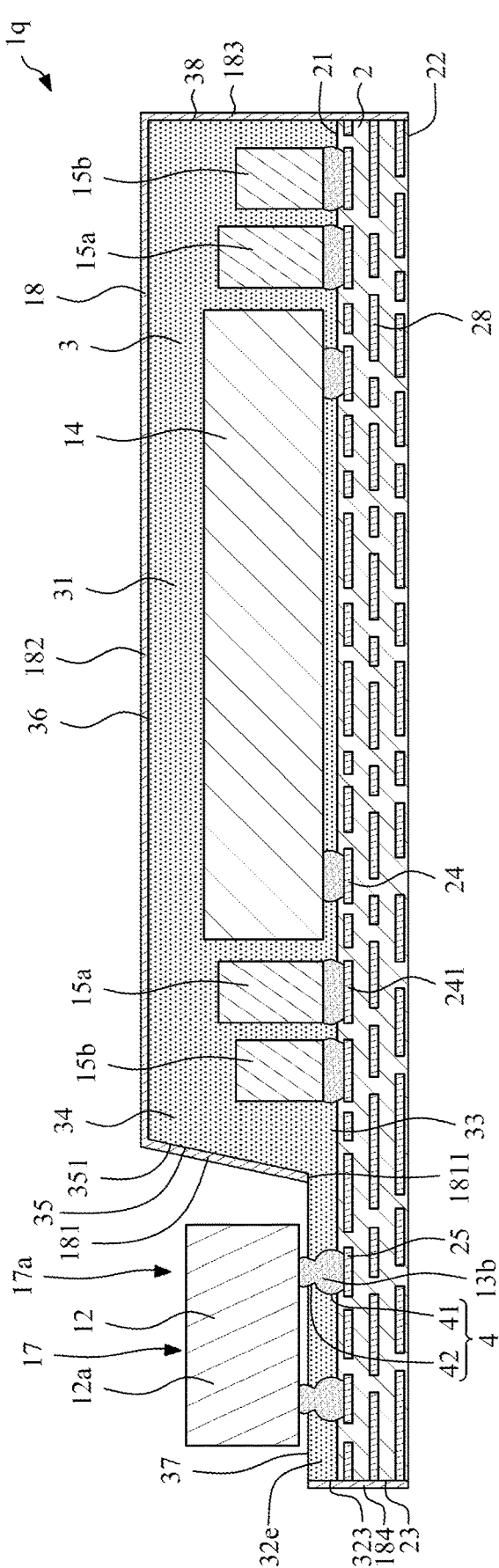
FIG. 21 illustrates a cross-sectional view of an electronic device according to some embodiments of the present disclosure.

FIG. 21 illustrates a cross-sectional view of an electronic device 1q according to some embodiments of the present disclosure. The electronic device 1q of FIG. 21 is similar to the electronic device 1p of FIG. 19, except that the inner lateral surface 35 of the upper portion 34 of the encapsulant 3 may be nonparallel with the outer lateral surface 38 of the encapsulant 3. In addition, the inner lateral surface 35 of the upper portion 34 of the encapsulant 3 may be not perpendicular to the top surface (i.e., the second top surface 37) of the second portion 32e of the encapsulant 3.

Figure 22:
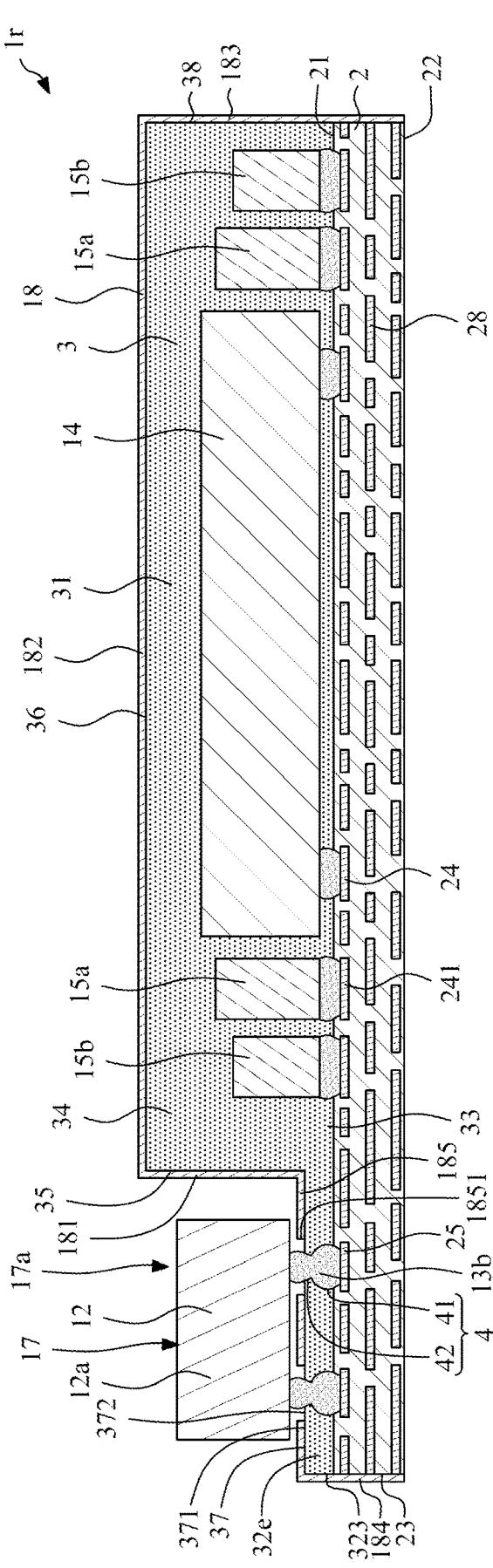
FIG. 22 illustrates a cross-sectional view of an electronic device according to some embodiments of the present disclosure.

FIG. 22 illustrates a cross-sectional view of an electronic device 1r according to some embodiments of the present disclosure. The electronic device 1r of FIG. 22 is similar to the electronic device 1p of FIG. 19, except that the shielding layer 18 may further a fifth portion 185 disposed on the top surface (i.e., the second top surface 37) of the second portion 32e of the encapsulant 3. In addition, the fifth portion 185 of the shielding layer 18 may define a plurality of openings 1851 corresponding to the upper portion 42 of the through hole 4. A width of the openings 1851 may be greater than a width of the upper portion 42 of the through hole 4. In addition, the fifth portion 185 of the shielding layer 185 may be provided to cover a first part 371 of the second top surface 37 of the second portion 32e of the encapsulant 3 and expose a second part 372 of the second top surface 37 of the second portion 32e of the encapsulant 3.

Figure 22A:
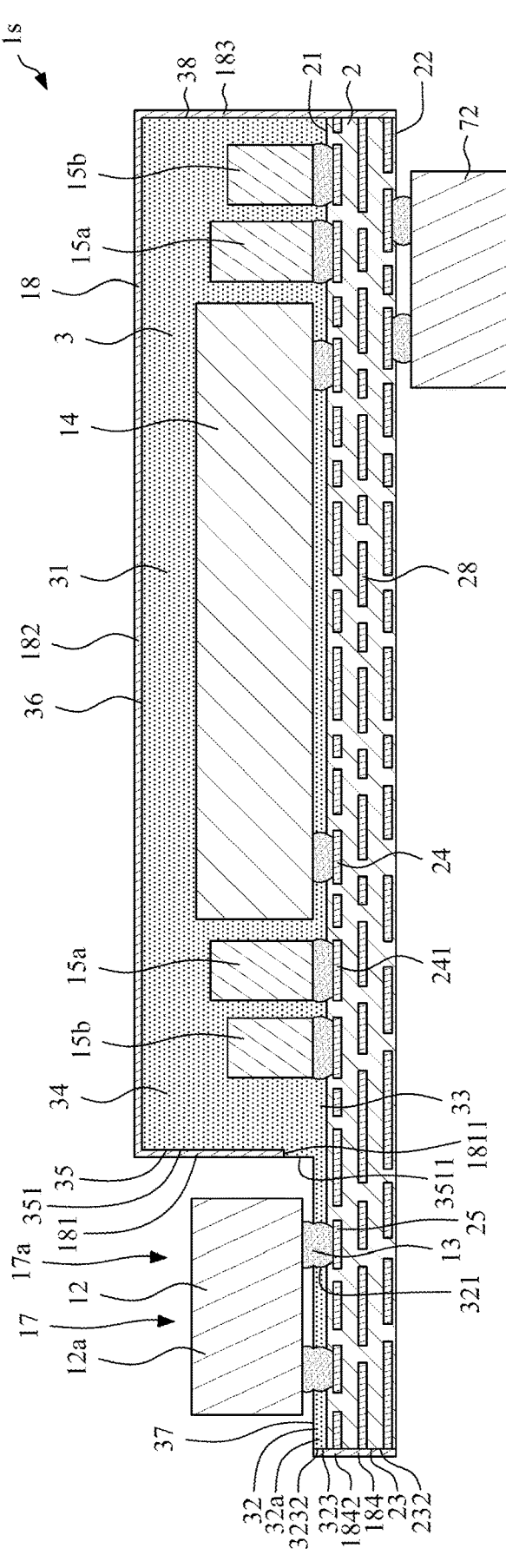
FIG. 22A illustrates a cross-sectional view of an electronic device according to some embodiments of the present disclosure.

FIG. 22A illustrates a cross-sectional view of an electronic device is according to some embodiments of the present disclosure. The electronic device 1s of FIG. 22A is similar to the electronic device 1 of FIG. 2, except that an electronic component 72 may be electrically connected to the second surface 22 of the substrate 2. The electronic component 72 may be a connector, a semiconductor die or semiconductor chip.

Figure 22B:
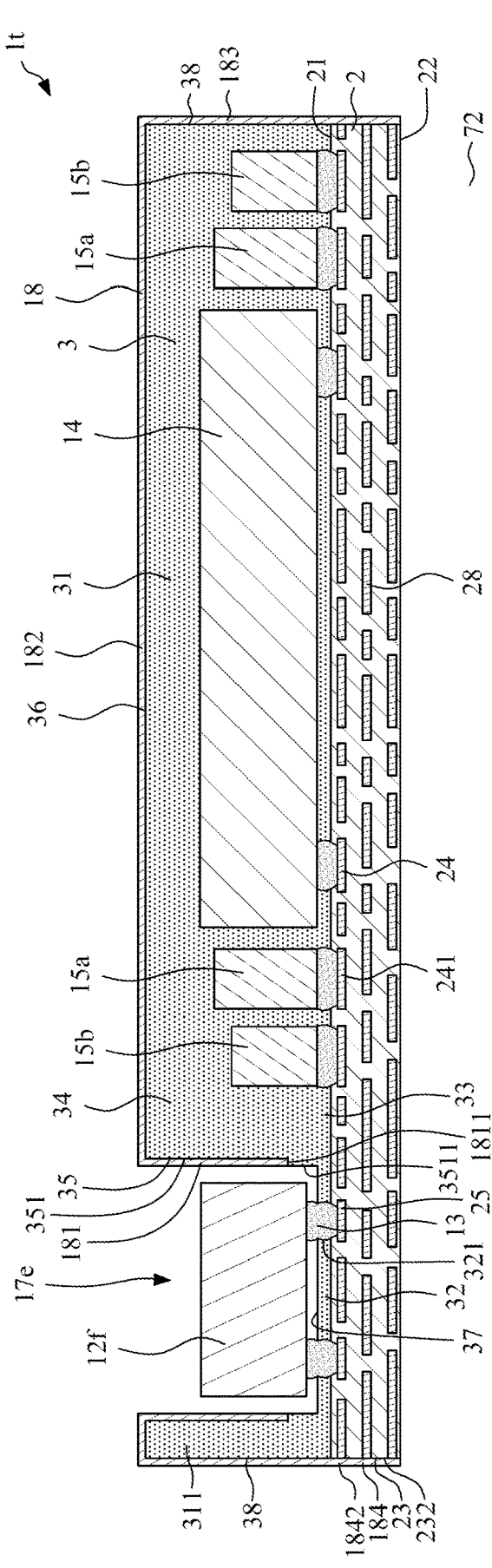
FIG. 22B illustrates a cross-sectional view of an electronic device according to some embodiments of the present disclosure.
Figure 22C:
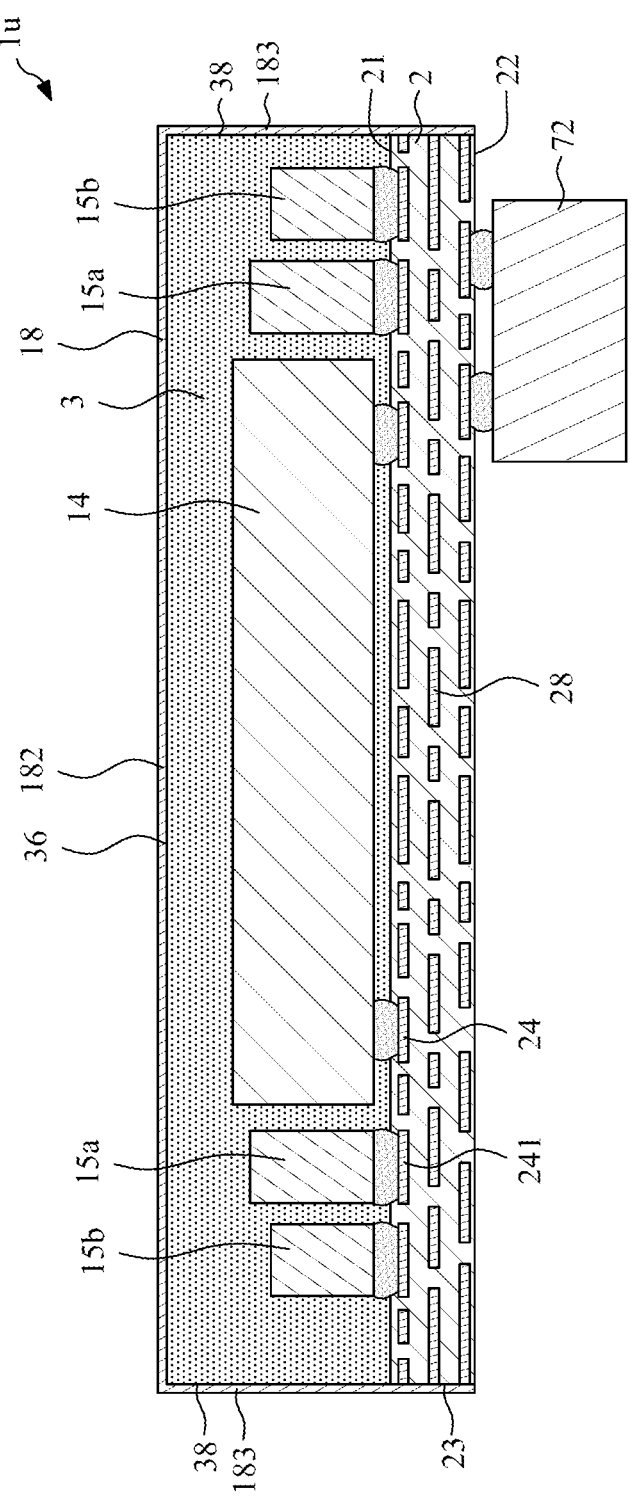
FIG. 22C illustrates a cross-sectional view of an electronic device according to some embodiments of the present disclosure.

FIG. 22B illustrates a cross-sectional view of an electronic device 1t according to some embodiments of the present disclosure. The electronic device 1t of FIG. 22B is similar to the electronic device 1 of FIG. 2, except that the accommodating space 17e may be surrounded by the first portion 31 and a third portion 311 of the encapsulant 3. A thickness of the third portion 311 may be substantially equal to the thickness of the first portion 31. For example, the third portion 311 may be a portion of the first portion 31. The electronic component 12f may be disposed in the accommodating space 17e FIG. 22C illustrates a cross-sectional view of an electronic device 1u according to some embodiments of the present disclosure. The electronic device 1u of FIG. 22C is similar to the electronic device 1s of FIG. 22A, except that the encapsulant 3 does not include a step structure.

FIG. 23 through FIG. 39 illustrate a method for manufacturing an electronic device according to some embodiments of the present disclosure. In some embodiments, the method is for manufacturing the electronic device 1 shown in FIG. 1 to FIG. 3.

Figure 23:
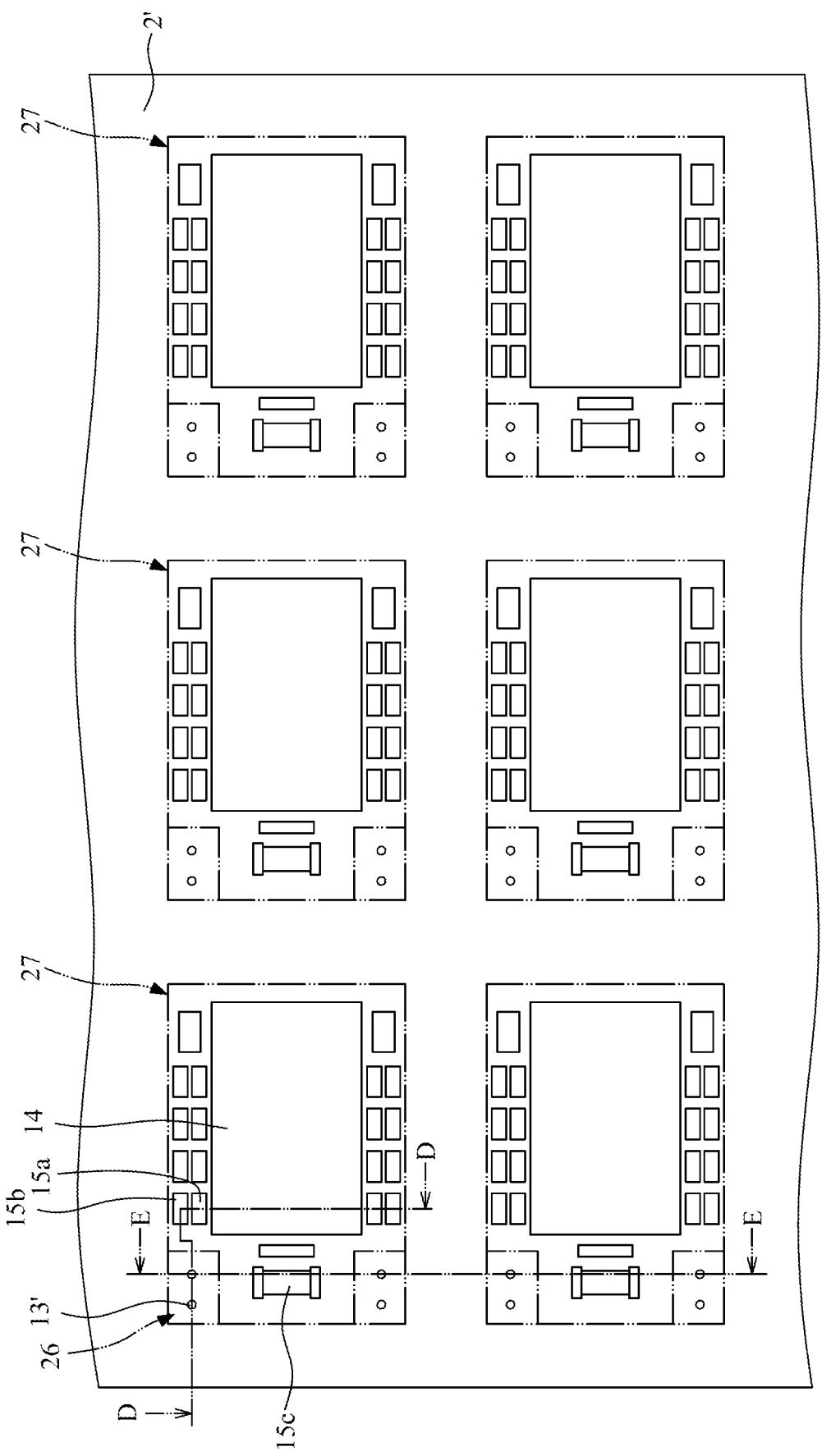
FIG. 23 through FIG. 39 illustrate a method for manufacturing an electronic device according to some embodiments of the present disclosure.
Figure 24:
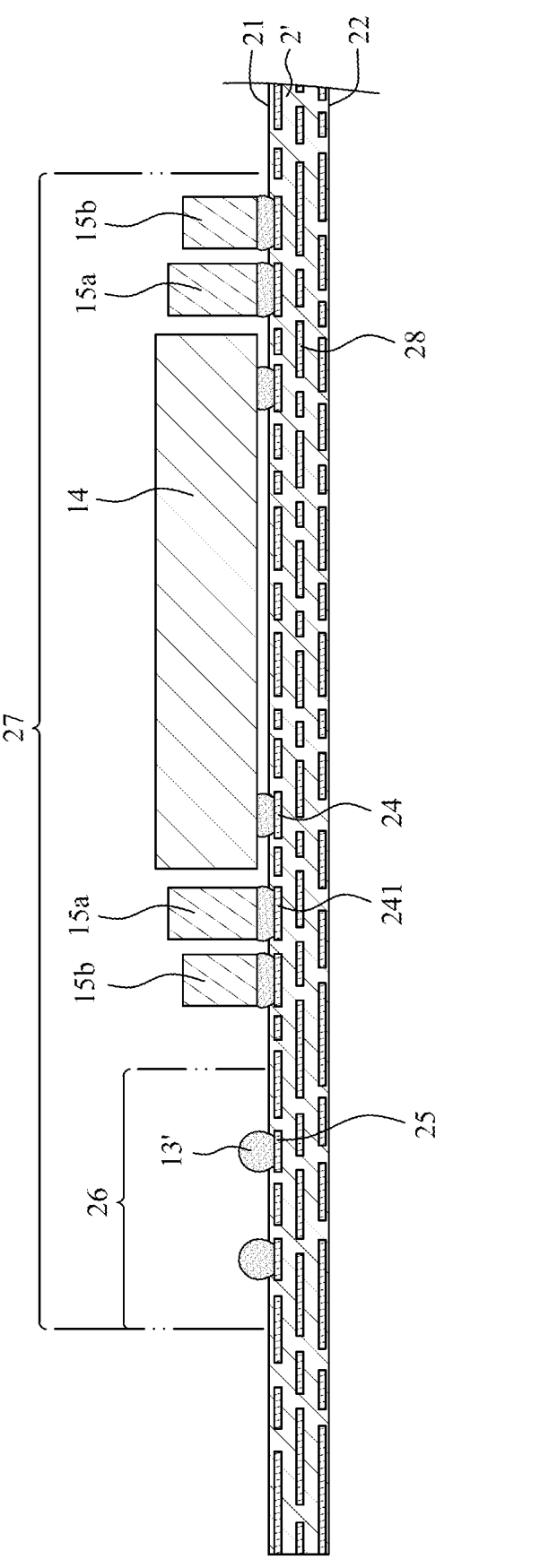
Figure 25:
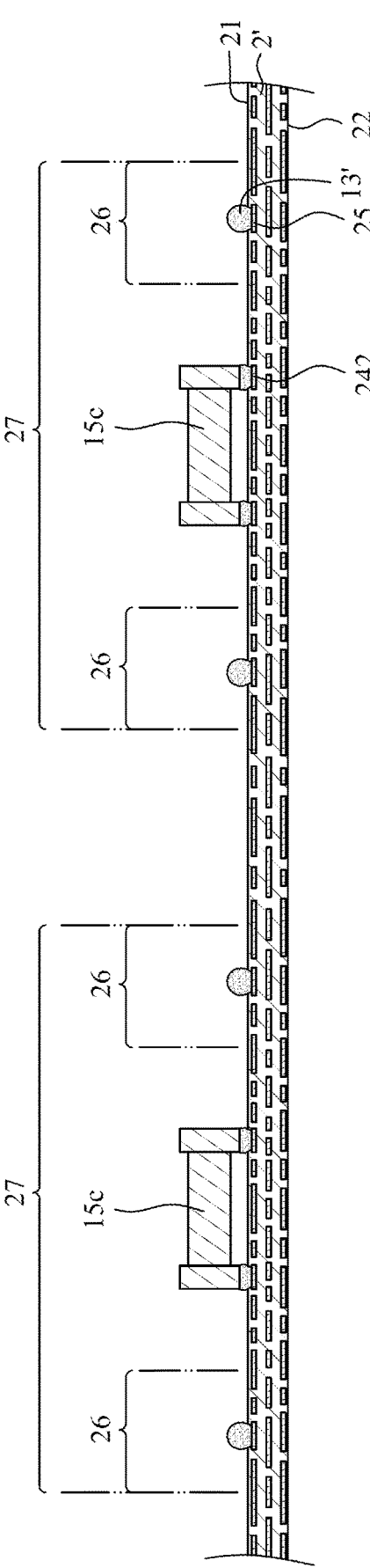

Referring to FIGS. 23 to 25, a substrate 2' is provided, wherein FIG. 24 illustrates a cross-sectional view taken along line D-D in FIG. 23. FIG. 25 illustrates a cross-sectional view taken along line E-E in FIG. 23. The substrate 2' may be in a strip type or wafer type, and may include a plurality of units 27. The units 27 may be defined by a plurality of cutting lines crossed with each other. The unit 27 may be similar to the substrate 2 of FIG. 1 to FIG. 3. The substrate 2' may have a first surface 21 and a second surface 22 opposite to the first surface 21. The substrate 2' may include a plurality of dielectric layers, a plurality of circuit layers 28 interposed between the dielectric layers and a plurality of electrical contacts 24, 241, 242, 25 (e.g., bonding pads).

Then, a plurality of electronic elements 14, a plurality of passive elements 15*a*, 15*b*, 15*c* and a plurality of reflowable elements 13' (e.g., pre-solders) may be electrically connected to the electrical contacts 24, 241, 242, 25 (e.g., bonding pads) in the units 27 of the substrate 2', respectively. In some embodiments, the electronic element 14 and the passive elements 15*a*, 15*b*, 15*c* may be disposed adjacent to the first surface 21 of the substrate 2', and may be attached to the substrate 2' through flip chip bonding or surface mounting technology (SMT). After a reflow stage of the flip chip bonding or surface mounting technology (SMT), the reflowable elements 13' (e.g., pre-solders) may be formed in a portion of a substantially sphere shape or a substantially ball shape. Each of the units 27 may include at least one predetermined area 26 corresponding to the reflowable elements 13' (e.g., pre-solders). The predetermined area 26 may be located at the corner of the unit 27. The reflowable elements 13' (e.g., pre-solders) may be disposed within the predetermined area 26.

Figure 26:
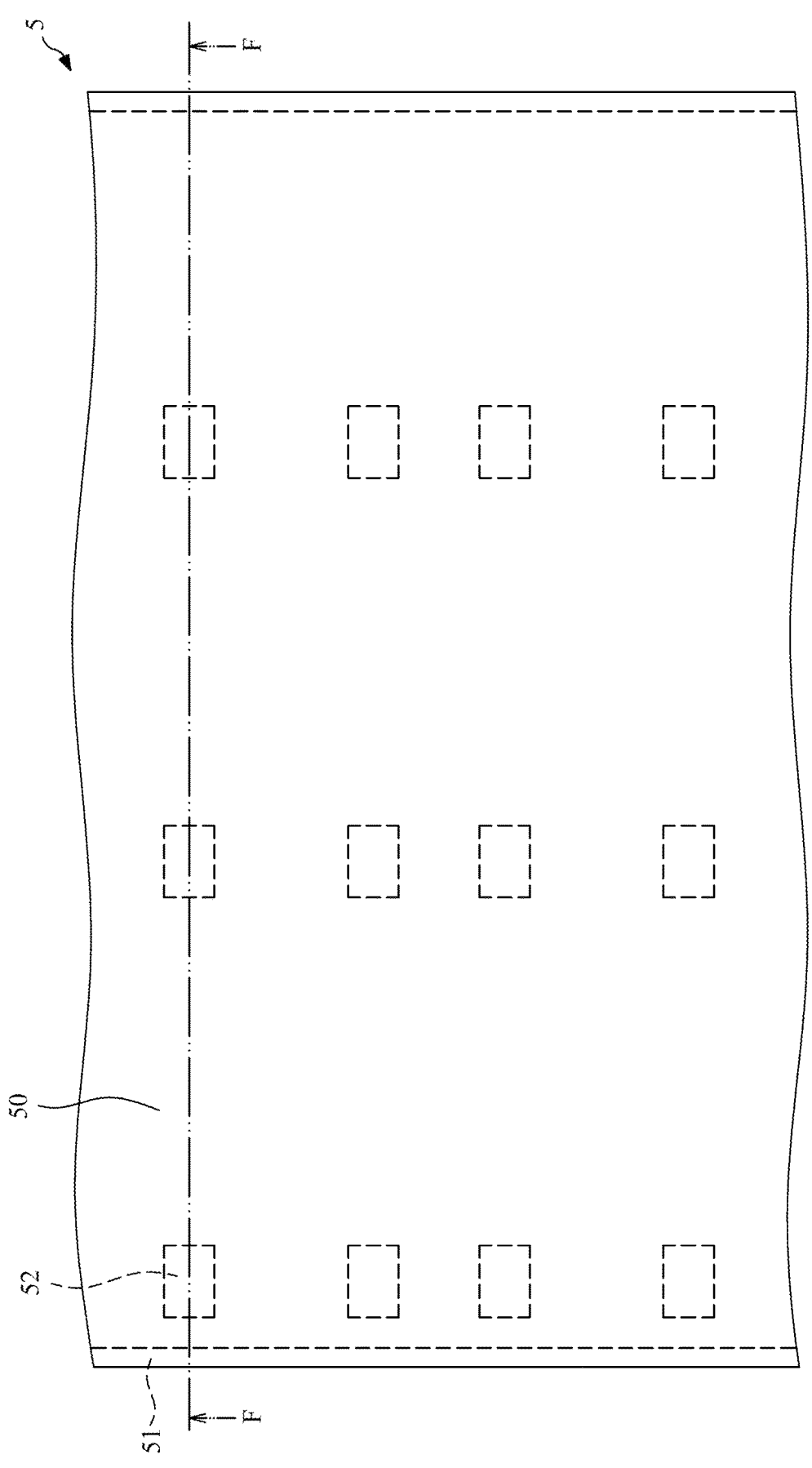
Figure 27:
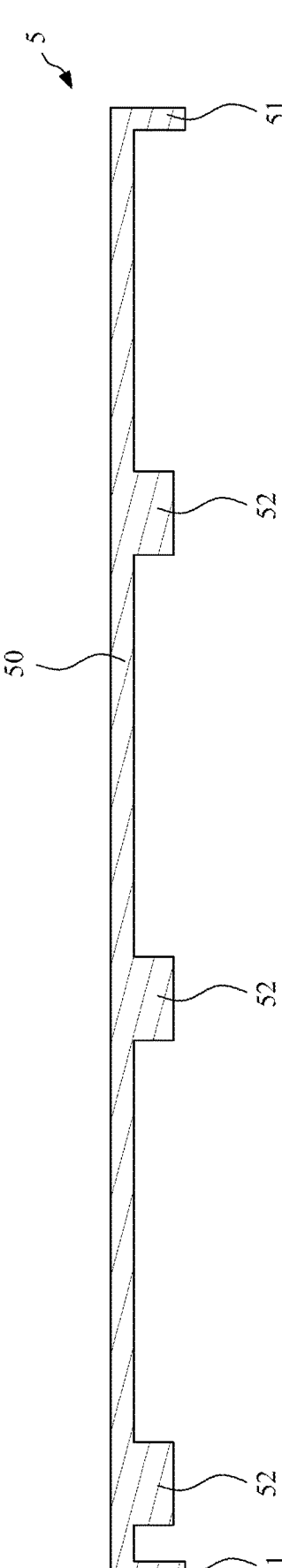
Figure 32:
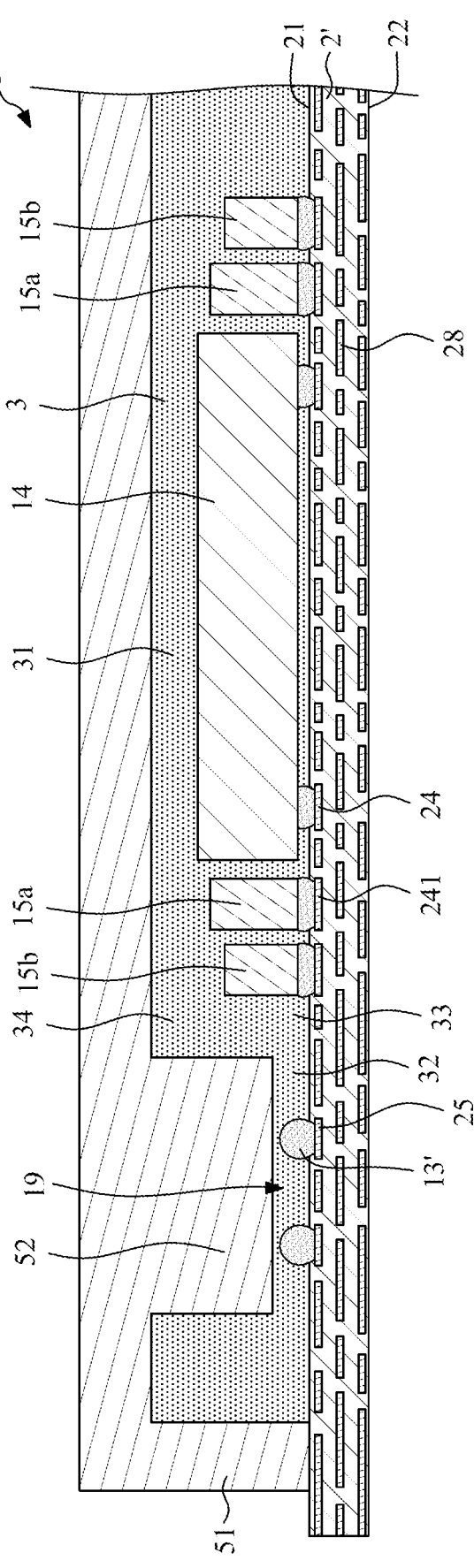
Figure 33:
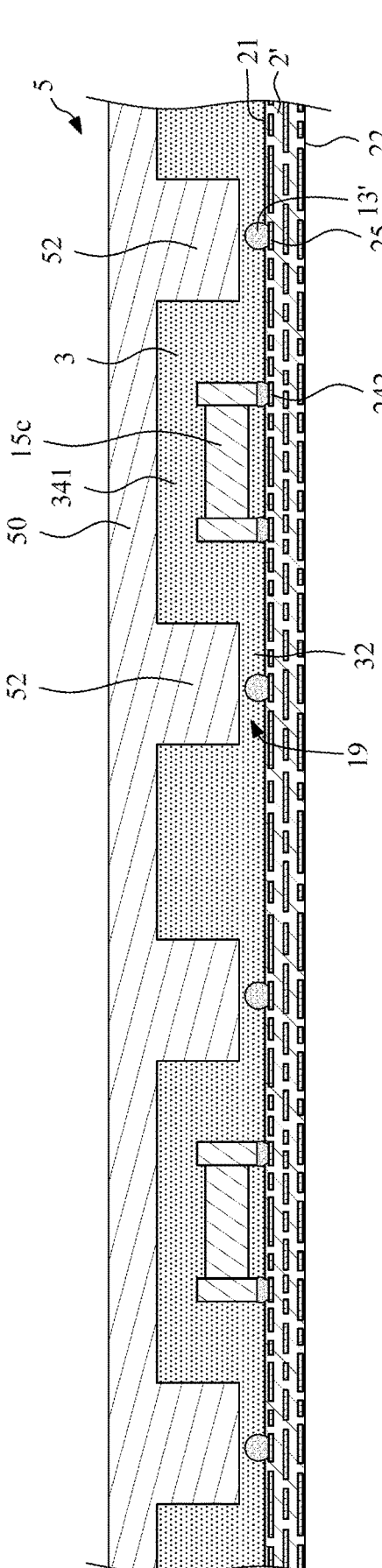
Figure 34:
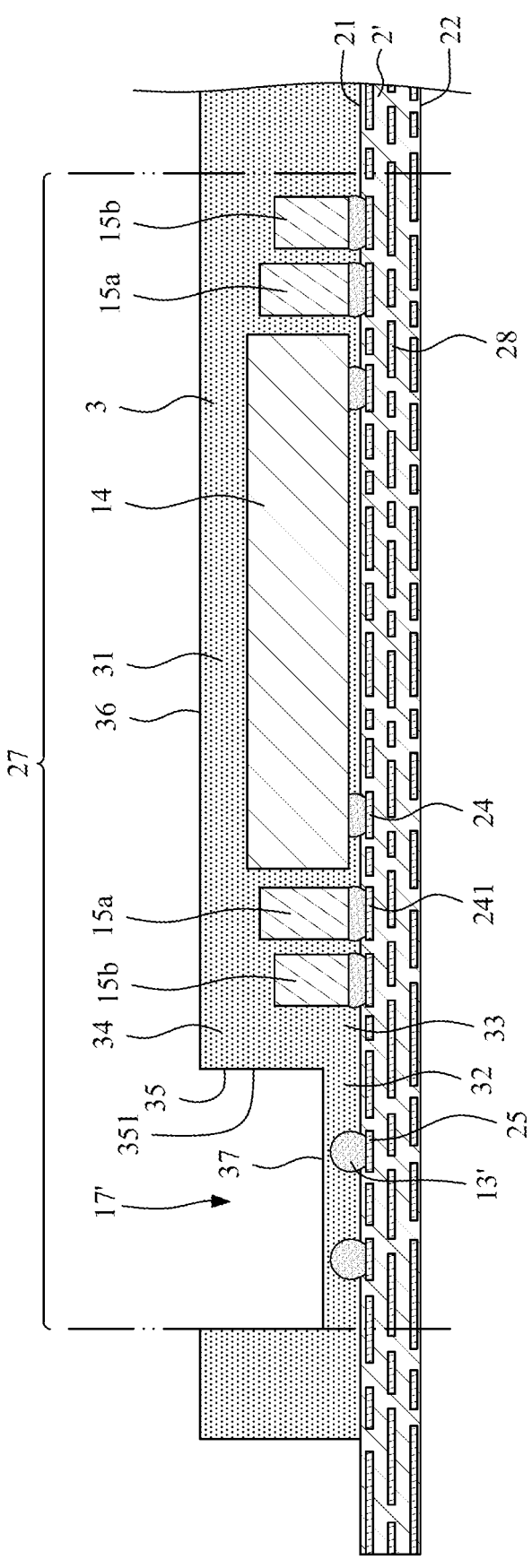
Figure 35:
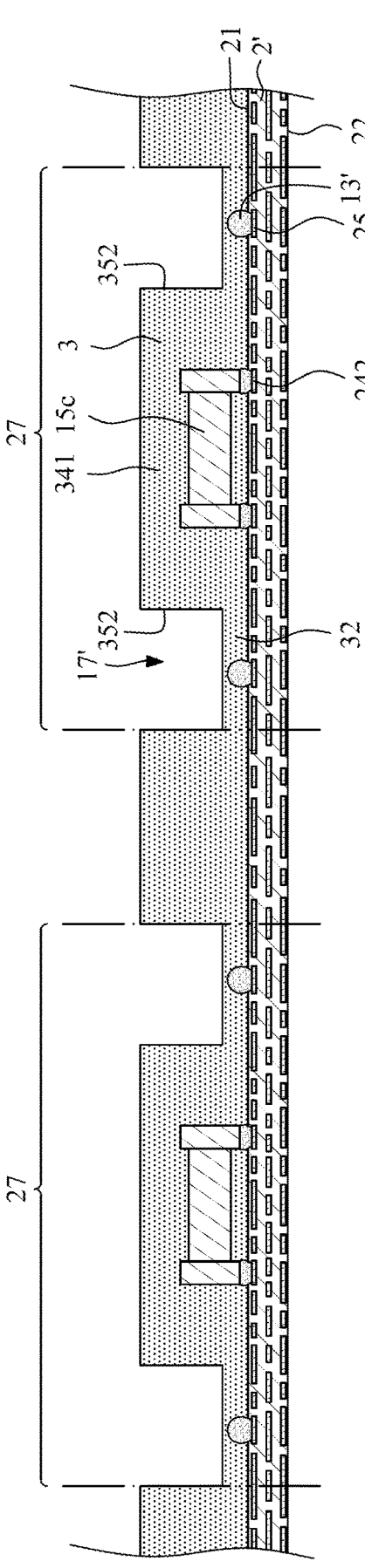
Figure 36:
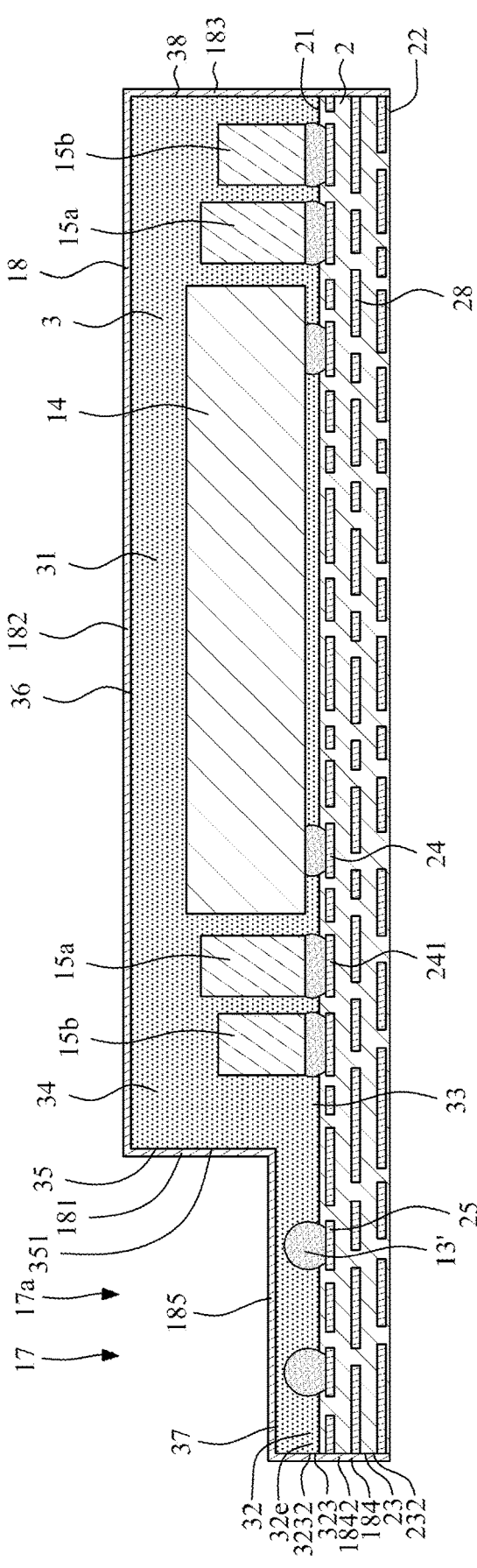

Referring to FIGS. 26 to 35, a step-shaped molding process is performed to form an encapsulant 3 encapsulating the substrate 2'. Referring to FIGS. 26 to 27, a step-shaped mold chase 5 is provided, wherein FIG. 27 illustrates a cross-sectional view taken along line F-F in FIG. 26. The step-shaped mold chase 5 is provided to perform the step-shaped molding process and to form a step portion (including a first portion 31 and a second portion 32) of the encapsulant 3 (FIG. 34 to FIG. 36). The mold chase 5 may include a main portion 50, at least two frame portions 51 and a plurality of protrusion pins 52. The frame portion 51 may surround the protrusion pins 52. The frame portions 51 and the protrusion pins 52 may protrude from a surface (e.g., a bottom surface) of the main portion 50. A height (or length) of the protrusion pin 52 may be less than a height (or length) of the frame portion 51. Thus, a bottom surface of the protrusion pin 52 may be not leveled with a bottom surface of the frame portion 51. An elevation of the bottom surface of the protrusion pin 52 may be higher than an elevation of the bottom surface of the frame portion 51.

Figure 28:
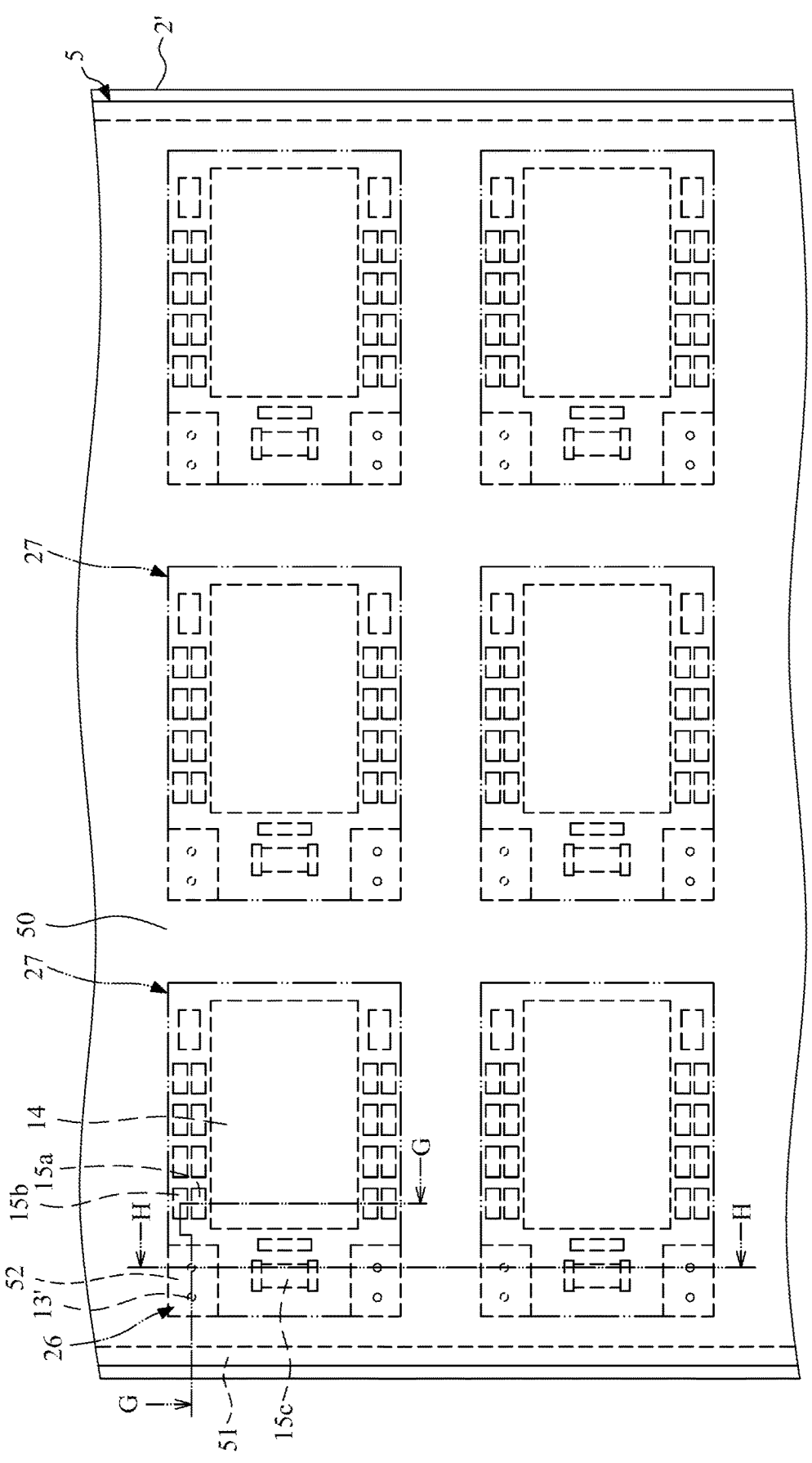
Figure 29:
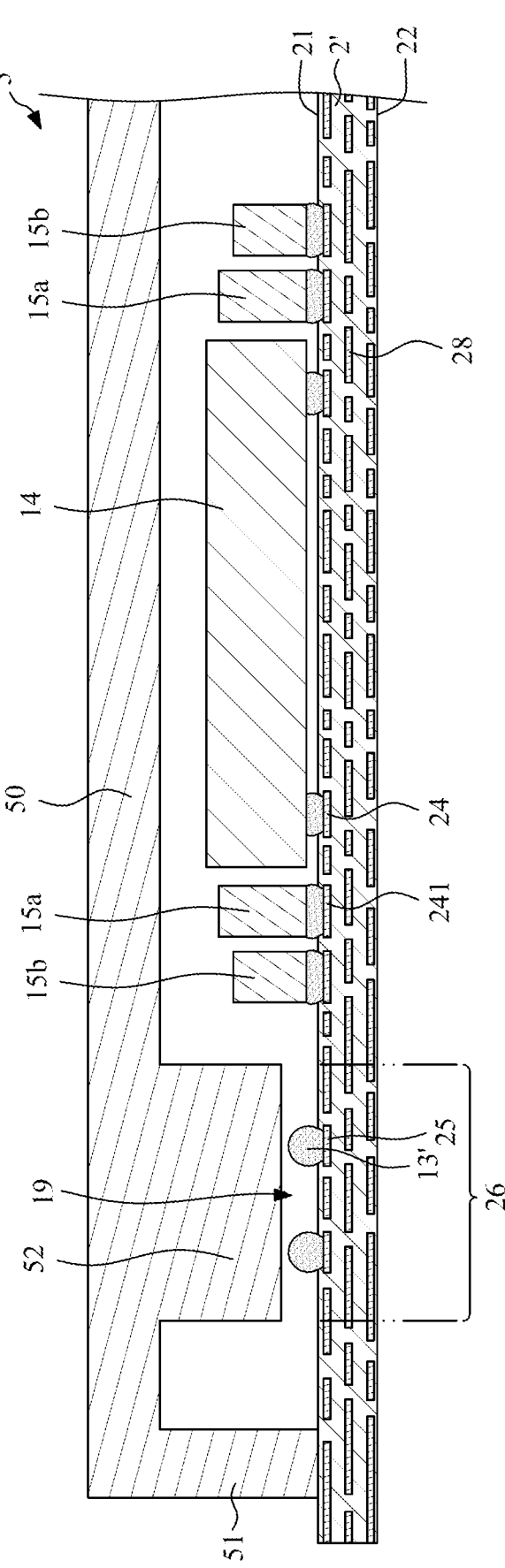
Figure 30:
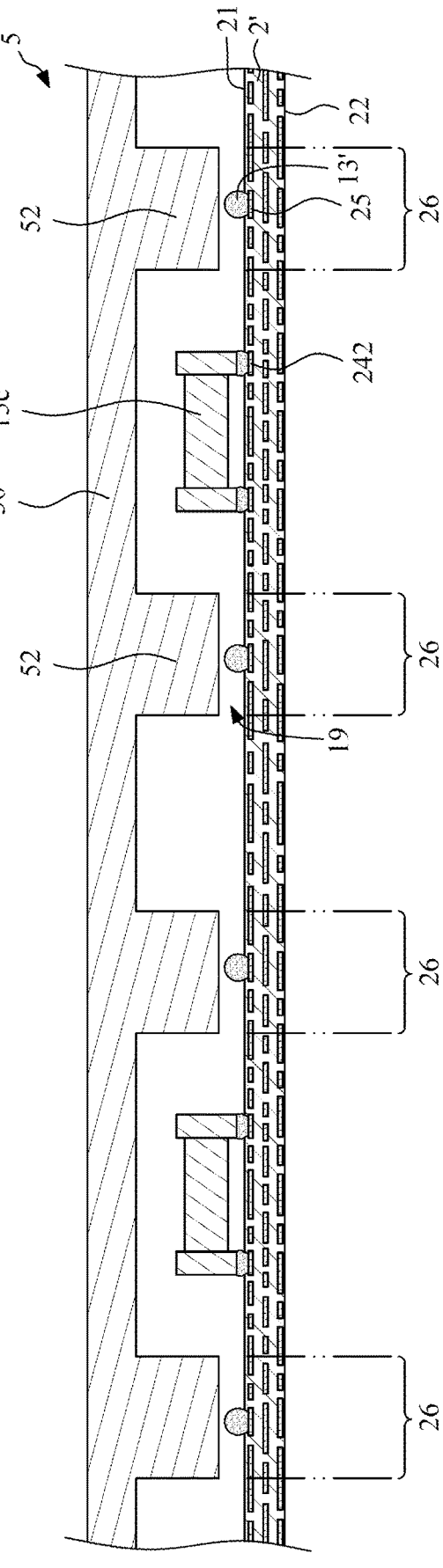

Referring to FIGS. 28 to 30, the mold chase 5 may be placed on the first surface 21 of the substrate 2'. As shown in FIG. 29 and FIG. 30, the bottom surface of the frame portion 51 may contact the first surface 21 of the substrate 2'. Each of the protrusion pins 52 may be located right above each of the predetermined areas 26. A projection of the protrusion pin 52 on the first surface 21 of the substrate 2' may be equal to the predetermined area 26. That is, a size and a location of the protrusion pin 52 may correspond to a size and a location of the predetermined area 26. The bottom surface of the protrusion pin 52 may be higher than the reflowable elements 13' (e.g., pre-solders). Thus, the bottom surface of the protrusion pin 52 may not contact the reflowable elements 13' (e.g., pre-solders) and the first surface 21 of the substrate 2'. A gap 19 may be formed between the bottom surface of the protrusion pin 52 and the first surface 21 of the substrate 2'. A main portion of a mold cavity may be formed between the bottom surface of the main portion 50 of the mold chase 5 and the first surface 21 of the substrate 2'. The gap 19 may be in communication with the main portion of the mold cavity. The gap 19 may extend from the main portion of the mold cavity. Thus, the gap 19 may be a portion of the mold cavity. As shown in FIG. 29 and FIG. 30, the reflowable elements 13' (e.g., pre-solders)

may be located in the gap 19. The electronic element 14 and the passive elements 15*a*, 15*b*, 15*c* may be located in the main portion of the mold cavity.

Figure 31:
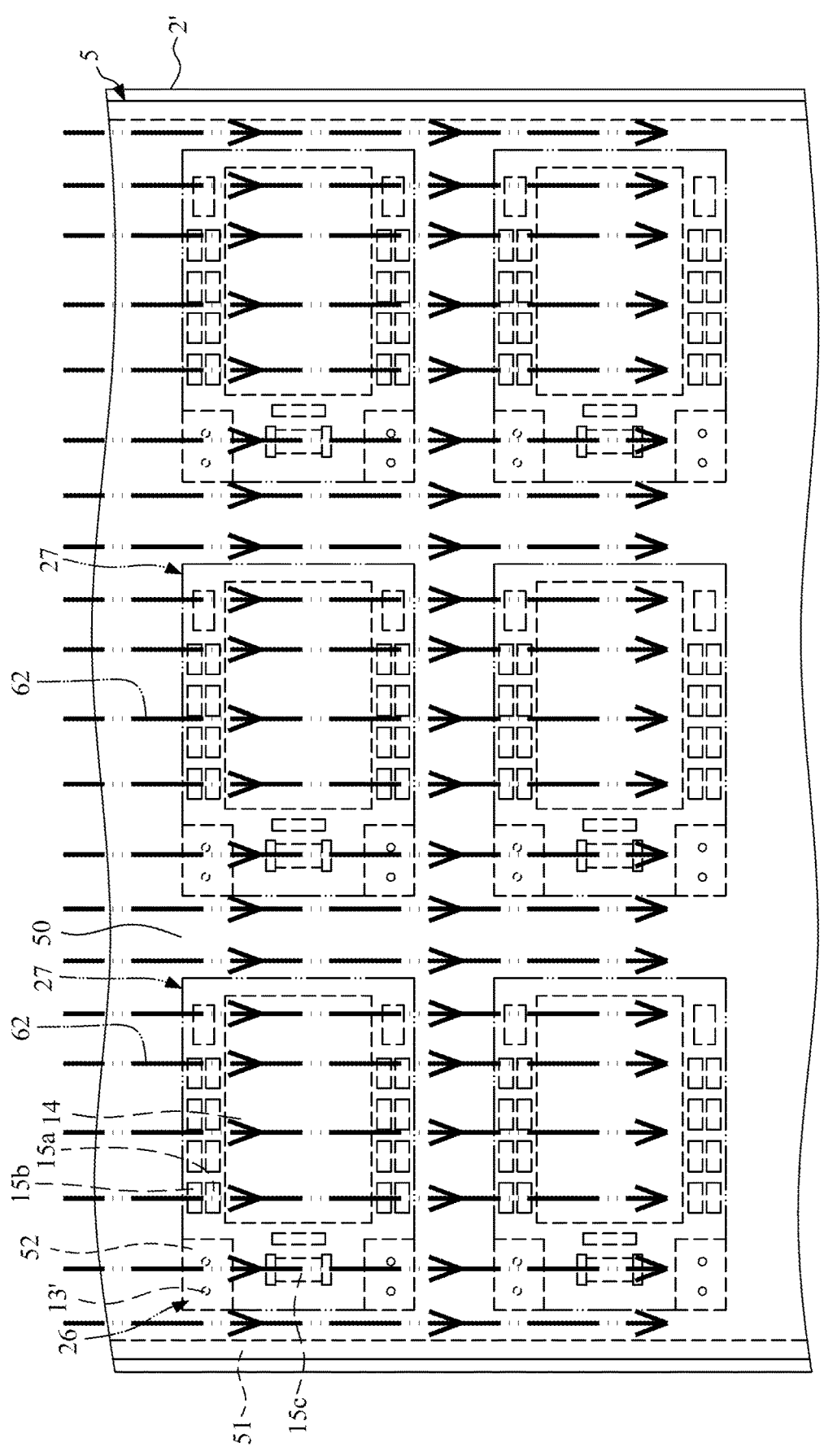

Referring to FIGS. 31 to 33, an encapsulant 3 may be applied to the mold cavity. A portion of the encapsulant 3 in the main portion of the mold cavity may encapsulate the electronic element 14 and the passive elements 15*a*, 15*b*, 15*c* to form a first portion 31 of the encapsulant 3. Meanwhile, another portion of the encapsulant 3 in the gap 19 may encapsulate the reflowable elements 13' (e.g., pre-solders) to form a second portion 32 of the encapsulant 3. A shown in FIG. 31, the mold flow 62 of the encapsulant 3 in the entire mold cavity may flow smoothly without blocking. Thus, there may be no non-mold region. Further, there may be no risk of mold void. As a result, the problems of non-mold region and mold void may be improved, and a quality of the molded encapsulant 3 may be enhanced.

Referring to FIGS. 34 to 35, the mold chase 5 may be removed. Thus, the encapsulant 3 may define a plurality of accommodating spaces 17 (or recess portion) at the corner(s) of the unit(s) 27. The encapsulant 3 may cover the entire first surface 21 of the substrate 2' and may encapsulate the electronic element 14 and the passive elements 15*a*, 15*b*, 15*c*. The encapsulant 3 may include a first portion 31 (corresponding to the main portion of the mold cavity) and a second portion 32 (corresponding to the gap 19). The first portion 31 of the encapsulant 3 may cover the electronic element 14 and the passive elements 15*a*, 15*b*, 15*c*. The second portion 32 of the encapsulant 3 may extend from the first portion 31. The first portion 31 of the encapsulant 3 and the second portion 32 of the encapsulant 3 may be formed concurrently and integrally as a monolithic structure. That is, there may be no interface between the first portion 31 of the encapsulant 3 and the second portion 32 of the encapsulant 3.

The encapsulant 3 may have a first top surface 36, an inner lateral surface 35 and a second top surface 37. The first top surface 36 of the encapsulant 3 may be opposite to the first surface 21 of the substrate 2'. The first top surface 36 may be a top surface of the first portion 31 of the encapsulant 3. The second top surface 37 may be substantially parallel with the first top surface 36, and may be lower than the first top surface 36. The second top surface 37 may be a top surface of the second portion 32 of the encapsulant 3. The inner lateral surface 35 may extend between the first top surface 36 and the second top surface 37. The second top surface 37 of the encapsulant 3 and the inner lateral surface 35 of the encapsulant 3 may together/collectively define the accommodating space 17, 17*a*.

It is noted that the molding process illustrated in FIGS. 26 to 35 may be referred to as a step-shaped molding process since the encapsulant 3 may include a step structure. The first portion 31 of the encapsulant 3 may be thicker than the second portion 32 of the encapsulant 3. Alternatively, the second portion 32 of the encapsulant 3 may be thinner than the first portion 31 of the encapsulant 3.

Figure 37:
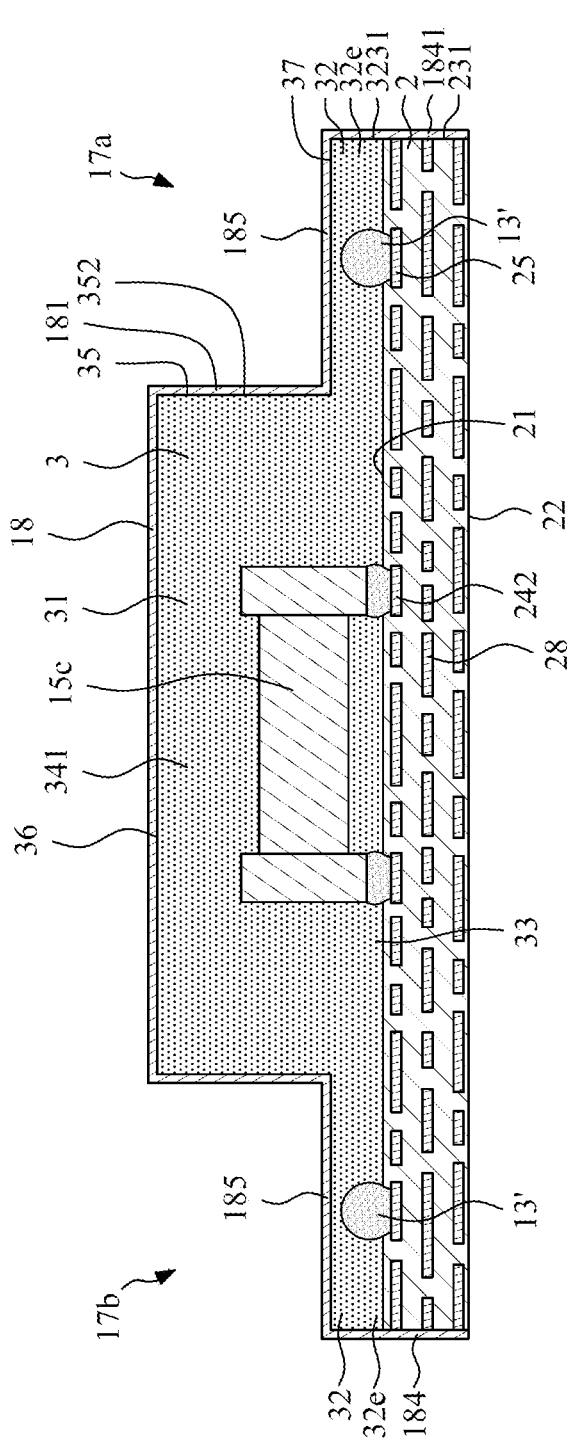

Referring to FIGS. 36 to 37, a singulation process may be performed to the substrate 2' and the encapsulant 3 to form a plurality of unit structures. Each of the unit structures may correspond to the unit 27 of FIG. 23, and may include a substrate 2 and an encapsulant 3 same as or similar to the substrate 2 and an encapsulant 3 of FIG. 2, respectively. The substrate 2 of the unit structure may have a lateral surface 23. The second portion 32, 32*e* of the encapsulant 3 of the unit structure may have a lateral surface 323. The encapsulant 3 of the unit structure may have an outer lateral surface 38 opposite to the lateral surface 323.

Then, a shielding layer 18 may be formed or disposed on the surfaces of the substrate 2 and the encapsulant 3 by, for example, physical vapor deposition (PVD). That is, the shielding layer 18 may be provided to cover the surfaces of the substrate 2 and the encapsulant 3. In some embodiments, the shielding layer 18 may include a first portion 181, a second portion 182, a third portion 183, a fourth portion 184 and a fifth portion 185. The first portion 181 of the shielding layer 18 may be formed to cover and contact the inner lateral surface 35 of the encapsulant 3. The second portion 182 of the shielding layer 18 may be formed to cover and contact the first top surface 36 of the encapsulant 3. The third portion 183 of the shielding layer 18 may be formed to cover and contact the outer lateral surface 38 of the encapsulant 3 and the lateral surface 23 of the substrate 2. The fourth portion 184 of the shielding layer 18 may be formed to be disposed on and contact the lateral surface 323 of the second portion 32 of the encapsulant 3 and the lateral surface 23 of the substrate 2. The fifth portion 185 of the shielding layer 18 may be formed to cover and contact the second top surface 37 of the encapsulant 3. It is notated that the first portion 181, the second portion 182, the third portion 183, the fourth portion 184 and the fifth portion 185 may be formed concurrently and integrally, and they are continuous with one another.

In some embodiments, the fourth portion 184 of the shielding layer 18 may include a first part 1841 and a second part 1842. The first part 1841 may be substantially perpendicular to the second part 1842 (FIG. 1). As shown in FIG. 37, the first part 1841 of the fourth portion 184 of the shielding layer 18 may be formed to cover a first lateral surface 3231 of the second portion 32 of the encapsulant 3. The first lateral surface 3231 of the second portion 32 of the encapsulant 3 may be substantially aligned with a first lateral surface 231 of the substrate 2. As shown in FIG. 36, the second part 1842 of the fourth portion 184 of the shielding layer 18 may be formed to cover a second lateral surface 3232 of the second portion 32 of the encapsulant 3. The second lateral surface 3232 of the second portion 32 of the encapsulant 3 may be substantially aligned with a second lateral surface 232 of the substrate 12.

Figure 38:
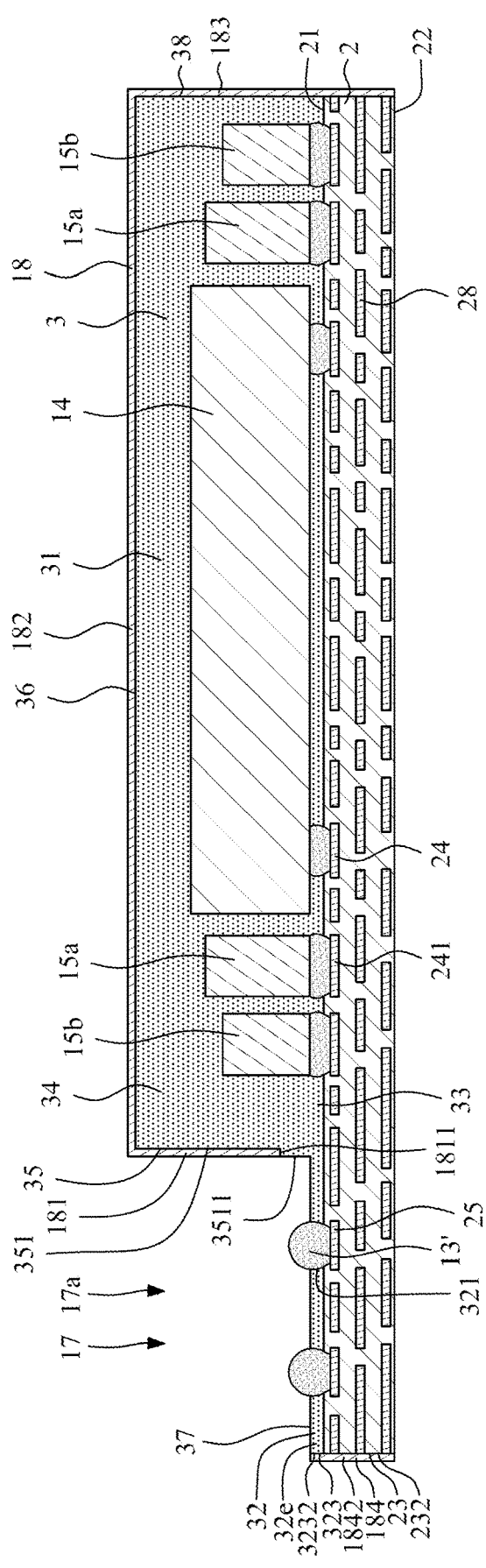
Figure 39:
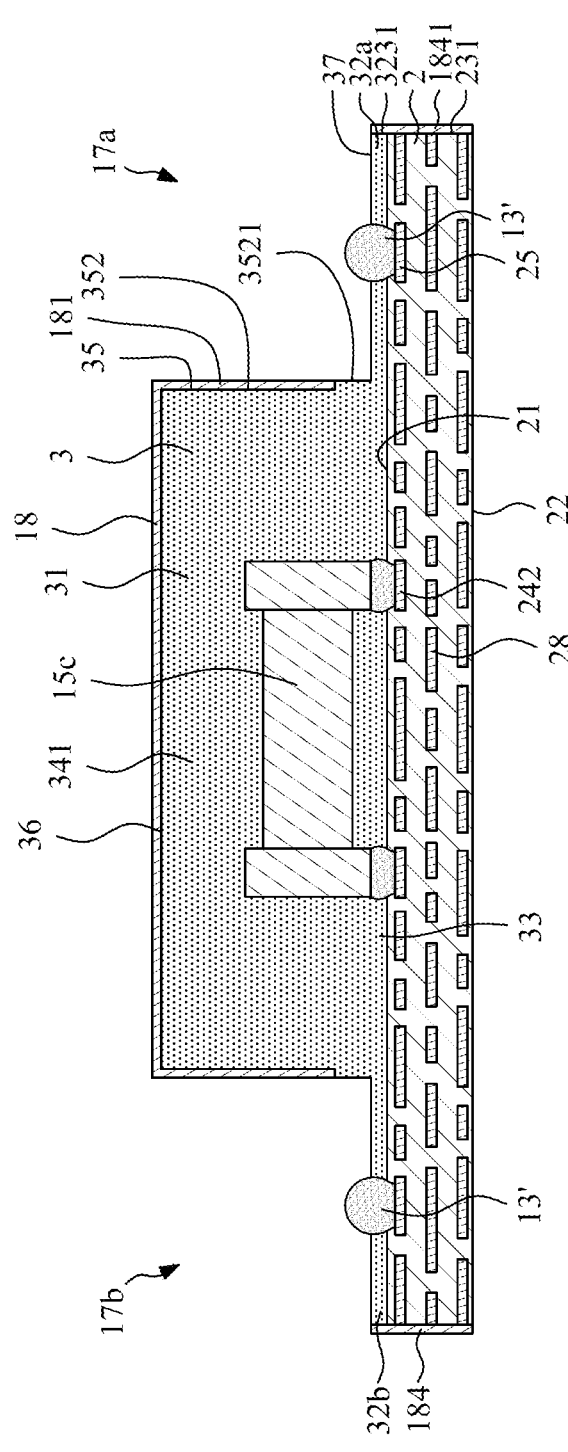

Referring to FIGS. 38 to 39, the second portion 32 of the encapsulant 3 may be thinned by, for example, laser polishing. Thus, the fifth portion 185 of the shielding layer 18 and a portion of the second portion 32 of the encapsulant 3 may be removed from the second top surface 37 of the encapsulant 3 to expose a portion of the reflowable elements 13' (e.g., pre-solders). Meanwhile, the portion of the second portion 32 of the encapsulant 3 may be removed to form a first side surface 3511 of the first portion 31 of the encapsulant 3 and to form a second side surface 3521 of the first portion 31 of the encapsulant 3. The second side surface 3521 of the first portion 31 of the encapsulant 3 may be distinct from the first side surface 3511 of the first portion 31 of the encapsulant 3. As shown in FIG. 38 and FIG. 39, the reflowable element 13' (e.g., pre-solder) remains its substantially sphere shape or substantially ball shape, and protrudes from the second top surface 37 of the encapsulant 3.

Then, an electronic component 12 is disposed adjacent to the first portion 31 of the encapsulant 3 and over the second portion 32 of the encapsulant 3 that continuously extends to and/or contacting the first portion 31 of the encapsulant 3. Thus, the electronic component 12 may be disposed in the accommodating space 17, and may be disposed over the second portion 32 of the encapsulant 3. Then, a reflow process is performed so that the reflowable element 13' is melted to become the reflowable element 13, so as to form the electronic device 1 of FIG. 1 to FIG. 3. The electronic component 12 may be disposed outside or external to the encapsulant 3, and electrically connected to the substrate 2 through the reflowable element 13 after the reflow process. That is, the electronic component 12 may be attached to the substrate 2 through flip chip bonding or surface mounting technology (SMT).

Figure 40:
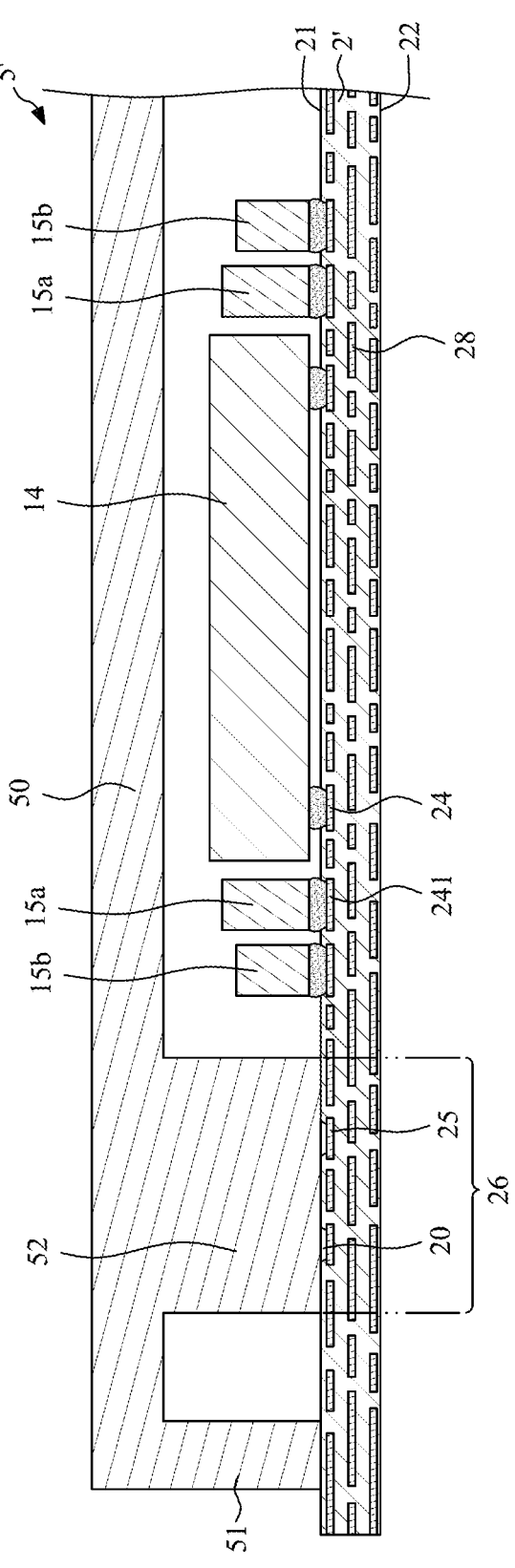
FIG. 40 through FIG. 42 illustrate a method for manufacturing an electronic device according to a comparative embodiment of the present disclosure.
Figure 41:
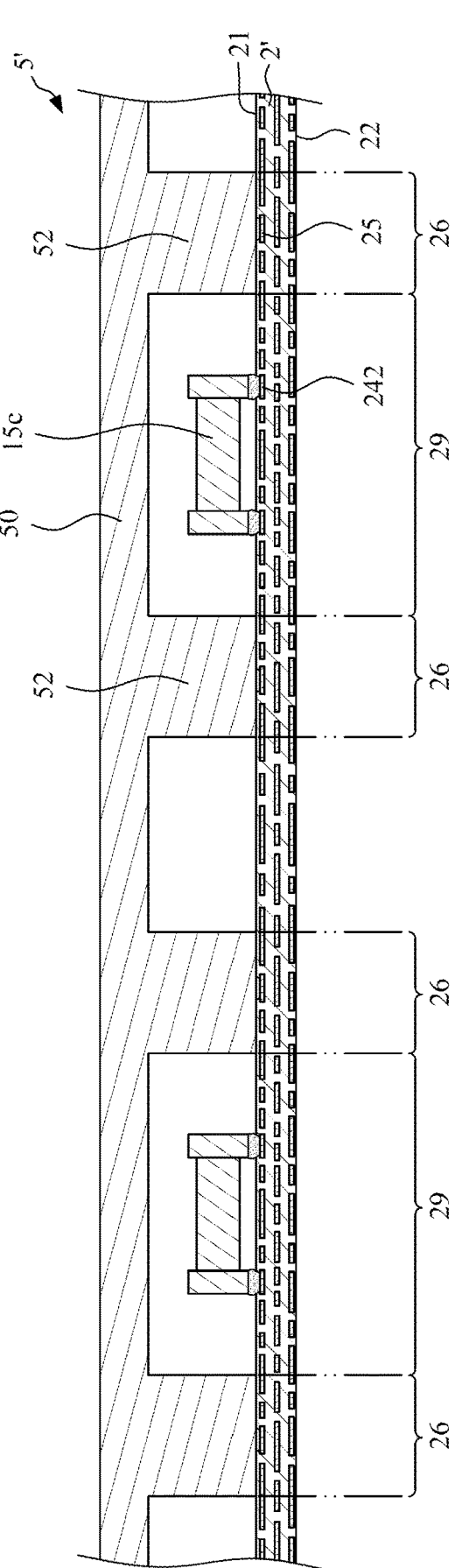
Figure 42:
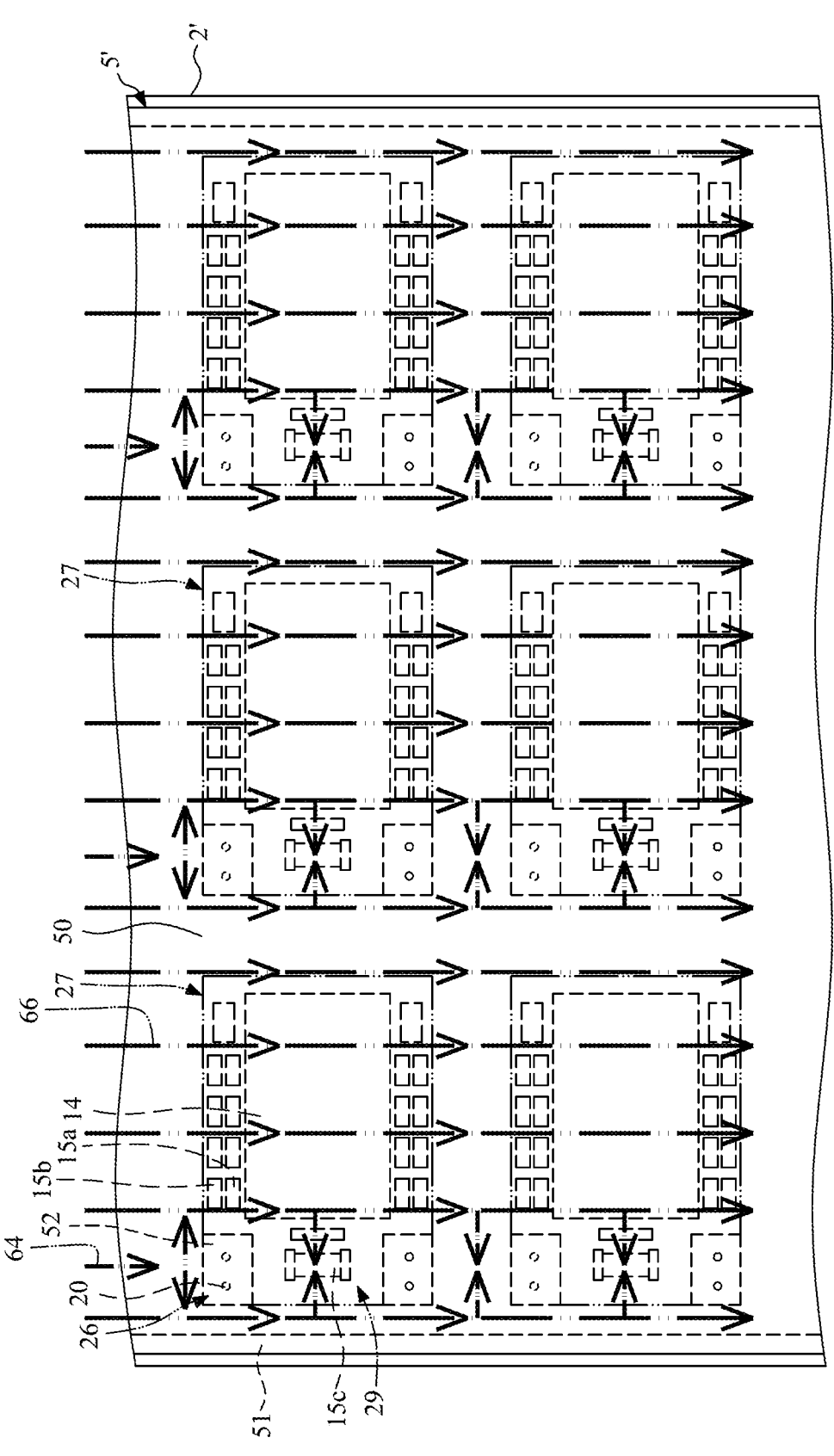

FIG. 40 through FIG. 42 illustrate a method for manufacturing an electronic device according to a comparative embodiment of the present disclosure. The method is similar to the method illustrated in FIG. 23 through FIG. 39 except that there is no pre-solder (the reflowable element 13' of FIG. 24 and FIG. 25) that is pre-formed on the bonding pad 25 in the opening 20 when the electronic elements 14 and the passive elements 15a, 15b, 15c are attached to the substrate 2' through flip chip bonding or surface mounting technology. In addition, the mold chase 5' is different from the mold chase 5' of FIG. 26 and FIG. 27. A height (or length) of the protrusion pin 52 of the mold chase 5' may be substantially equal to a height (or length) of the frame portion 51. Thus, a bottom surface of the protrusion pin 52 may be leveled with a bottom surface of the frame portion 51. Referring to FIGS. 40 to 41, the mold chase 5' may be placed on the first surface 21 of the substrate 2'. The bottom surface of the frame portion 51 may contact the first surface 21 of the substrate 2'. Each of the protrusion pins 52 may contact and press the predetermined area 26 of the first surface 21 of the substrate 2'. Referring to FIG. 42, an encapsulant may be applied to the mold cavity of the mold chase 5' through the mold flows 64, 66. The mold flow 64 of the encapsulant may be blocked by the protrusion pins 52. Thus, there may be a non-mold region 29 between the protrusion pins 52. Therefore, there may be high risk of mold void or incomplete fill. As a result, the quality and yield rate of the molded encapsulant may be low.

Figure 43:
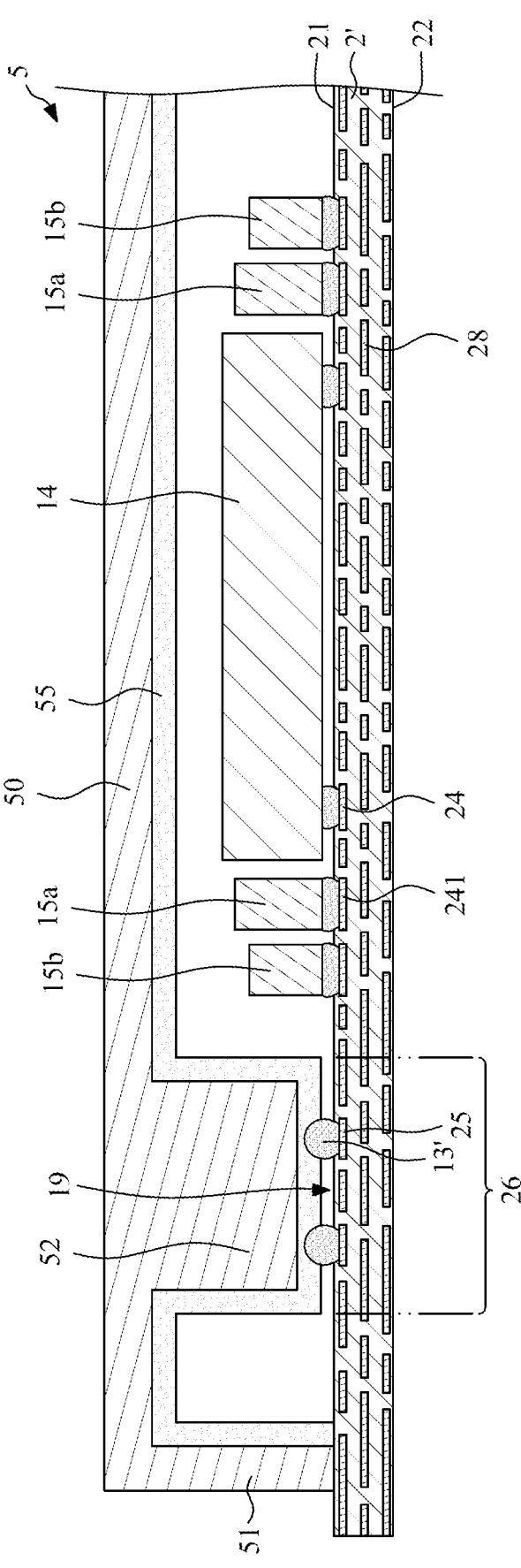
FIG. 43 through FIG. 46 illustrate a method for manufacturing an electronic device according to some embodiments of the present disclosure.

FIG. 43 through FIG. 46 illustrate a method for manufacturing an electronic device according to some embodiments of the present disclosure. In some embodiments, the method is for manufacturing the electronic device 1d shown in FIG. 7. The initial several stages of the method corresponding to FIG. 43 through FIG. 46 are the same as, or at least similar to, the stages illustrated in FIG. 23 through FIG. 25. FIG. 43 depicts a stage subsequent to that depicted in FIG. 25.

Figure 44:
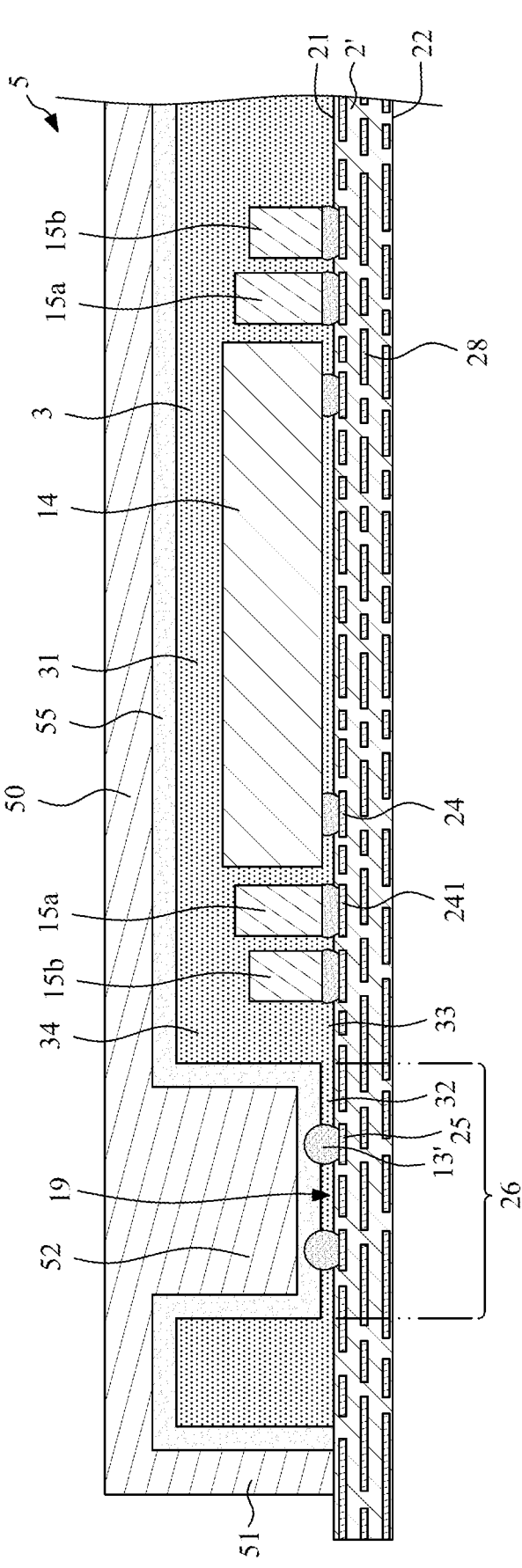

Referring to FIG. 43, a mold chase 5 is provided and placed on the first surface 21 of the substrate 2'. The mold chase 5 of FIG. 43 and FIG. 44 is similar to the mold chase 5 of FIG. 26 to FIG. 30 except that a release film 55 is further included. The release film 55 may include a soft material, and may be disposed on a bottom surface of the main portion 50 and the outer surfaces of the frame portion 51 and the protrusion pin 52. Thus, a portion of the reflowable elements 13' (e.g., pre-solders) may be embedded in the release film 55. A gap 19 between the release film 55 on the bottom surface of the protrusion pin 52 and the first surface 21 of the substrate 2' shown in FIG. 43 may be less than the gap 19 of FIG. 29.

Referring to FIG. 44, an encapsulant 3 may be applied to the mold cavity defined by the mold chase 5. A portion of the encapsulant 3 in the main portion of the mold cavity may encapsulate the electronic element 14 and the passive elements 15a, 15b, 15c to form a first portion 31 of the encapsulant 3. Meanwhile, another portion of the encapsulant 3 in the gap 19 may encapsulate a portion of the reflowable elements 13' (e.g., pre-solders) to form a second portion 32 of the encapsulant 3.

Figure 45:
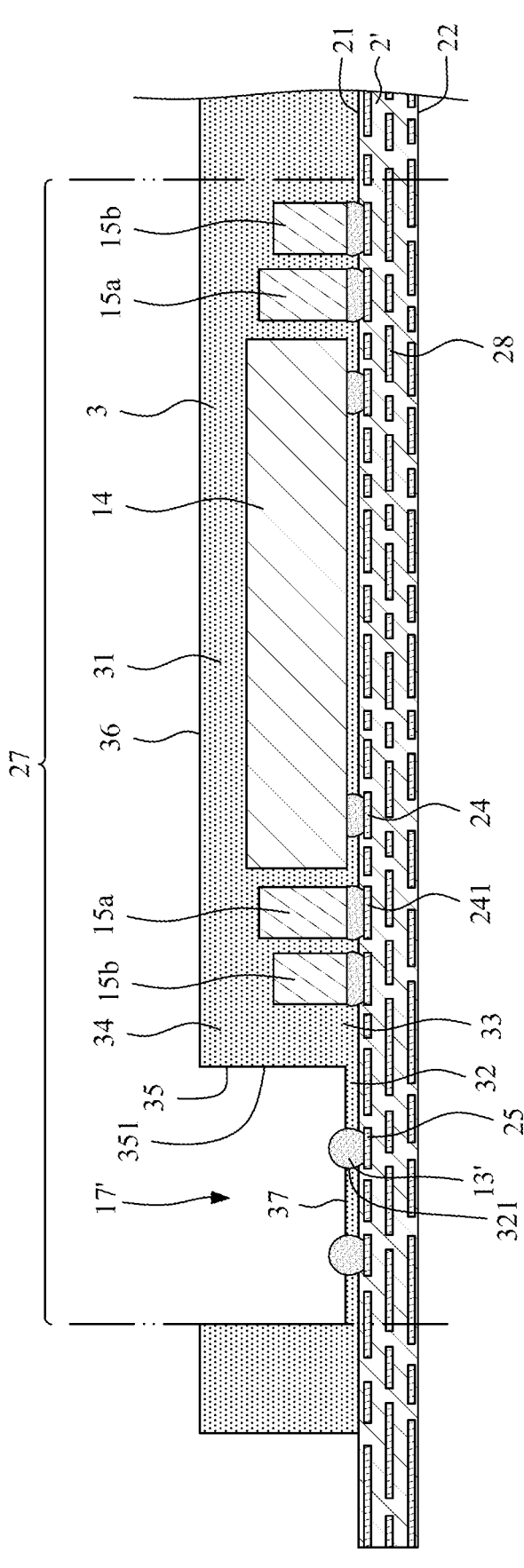

Referring to FIGS. 45, the mold chase 5 may be removed so as to form a molded encapsulant 3. The encapsulant 3 of FIG. 45 is similar to the encapsulant 3 of FIG. 34 except that the second portion 32 of the encapsulant 3 of FIG. 45 is thinner than the second portion 32 of the encapsulant 3 of FIG. 34. Further, a portion of the reflowable elements 13' (e.g., pre-solders) may protrude from the second top surface 37 of the second portion 32 of the encapsulant 3. Thus, the second top surface 37 of the second portion 32 of the encapsulant 3 is formed by molding rather than laser polishing.

Figure 46:
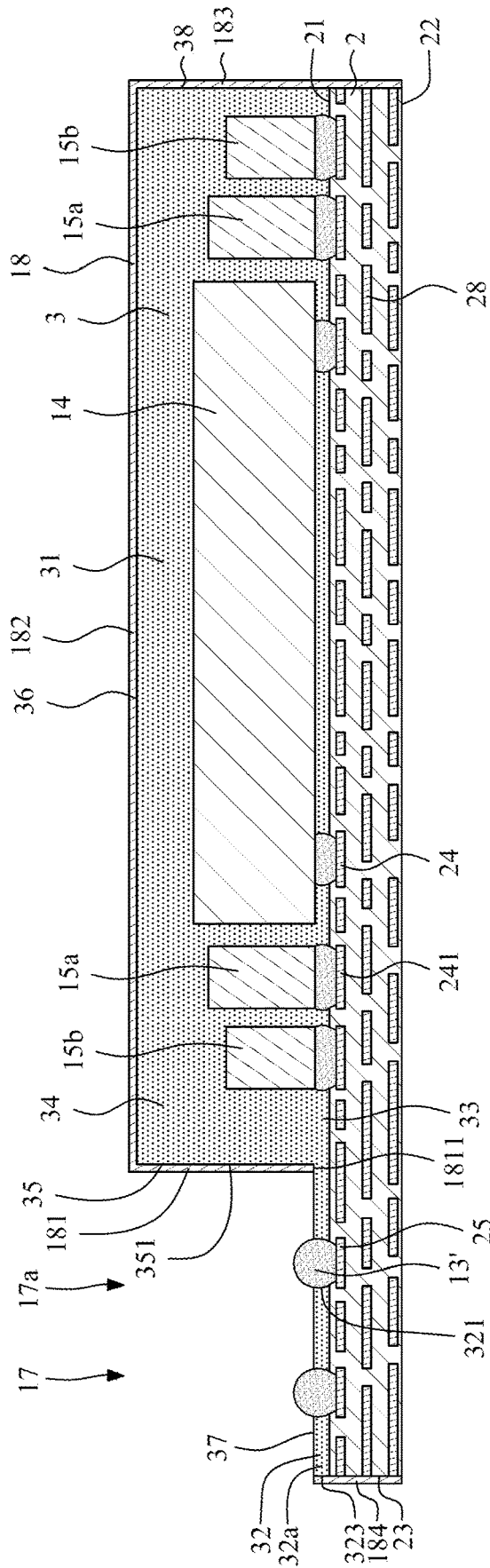

Referring to FIG. 46, a singulation process may be performed to the substrate 2' and the encapsulant 3 to form a plurality of unit structures. Each of the unit structures may correspond to the unit 27 of FIG. 23, and may include a substrate 2 and an encapsulant 3 same as or similar to the substrate 2 and an encapsulant 3 of FIG. 2, respectively. The substrate 2 of the unit structure may have a lateral surface 23. The second portion 32, 32a of the encapsulant 3 of the unit structure may have a lateral surface 323. The encapsulant 3 of the unit structure may have an outer lateral surface 38 opposite to the lateral surface 323.

Then, a shielding layer 18 may be formed or disposed on the surfaces of the substrate 2 and the encapsulant 3 except for the second top surface 37 of the second portion 32, 32a of the encapsulant 3. The structure of FIG. 46 is similar to the structure of FIG. 38 except that the bottom end surface 1811 of the first portion 181 of the shielding layer 18 may be leveled with or aligned with the second top surface 37 of the second portion 32, 32a of the encapsulant 3.

Then, an electronic component 12 is disposed in the accommodating space 17. Then, a reflow process is performed so that the reflowable element 13' is melted to become the reflowable element 13, so as to form the electronic device 1d of FIG. 7.

Figure 47:
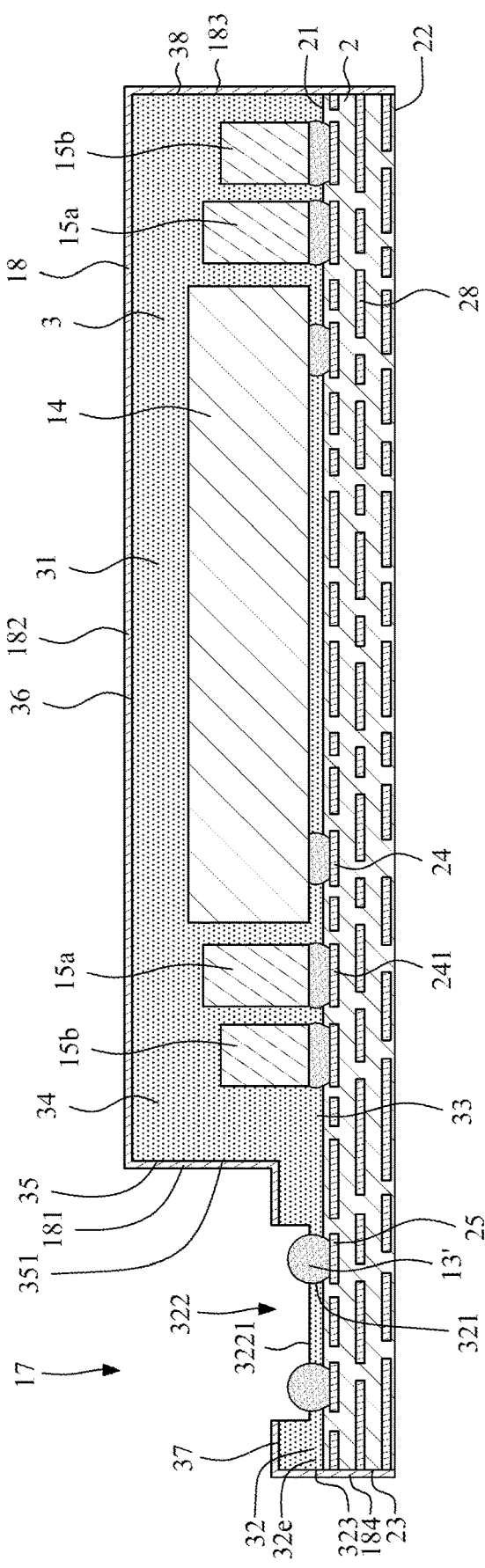
FIG. 47 illustrates a method for manufacturing an electronic device according to some embodiments of the present disclosure.

FIG. 47 illustrates a method for manufacturing an electronic device according to some embodiments of the present disclosure. In some embodiments, the method is for manufacturing the electronic device 1e shown in FIG. 9 and the electronic device if shown in FIG. 10. The initial several stages of the method corresponding to FIG. 47 are the same as, or at least similar to, the stages illustrated in FIG. 23 through FIG. 37. FIG. 47 depicts a stage subsequent to that depicted in FIG. 37.

Referring to FIG. 47, a portion of the fifth portion 185 of the shielding layer 18 and a portion of the second portion 32, 32e of the encapsulant 3 may be removed from the second top surface 37 of the second portion 32, 32e of the encapsulant 3 to form a recess portion 322 so as to expose a portion of the reflowable element 13' that is connected to the substrate 2. The recess portion 322 may be configured to function as an alignment for disposing an electronic component 12 over the second portion 32, 32e. The recess portion 322 may not extend through the second portion 32e, and may be communicated with the opening 321. The recess portion 322 may have a bottom surface 3221. The bottom surface 3221 may be also referred to as a third top surface of the second portion 32, 32e of the encapsulant 3. Thus, the encapsulant 3 may further have a third top surface 3221 (i.e., the bottom surface 3221 of the recess portion 322) different from the second top surface 37. The second top surface 37 of the encapsulant 3 may be not aligned with or leveled with the third top surface 3221 of the encapsulant 3. The second top surface 37 of the encapsulant 3 may be higher than the third top surface 3221 of the encapsulant 3. In addition, the shielding layer 18 covers the second top surface 37 except for the third top surface 3221.

At least two reflowable materials 13' may be disposed in one recess portion 322. The recess portion 322 may expose a portion of the reflowable element 13a that connects the substrate 2 and the electronic component 12. An upper portion of the reflowable material 13' may protrude from the third top surface 3221 (i.e., the bottom surface 3221 of the recess portion 322).

Then, an electronic component 12 is disposed in the accommodating space 17. Then, a reflow process is performed so that the reflowable element 13' is melted to become the reflowable element 13a, so as to form the electronic device 1e of FIG. 9.

In some embodiments, an electronic component 12e is disposed and aligned in the recess portion 322 of the second portion 32, 32e of the encapsulant 3. Then, a reflow process is performed so that the reflowable element 13' is melted to become the reflowable element 13, so as to form the electronic device if of FIG. 10.

Figure 48:
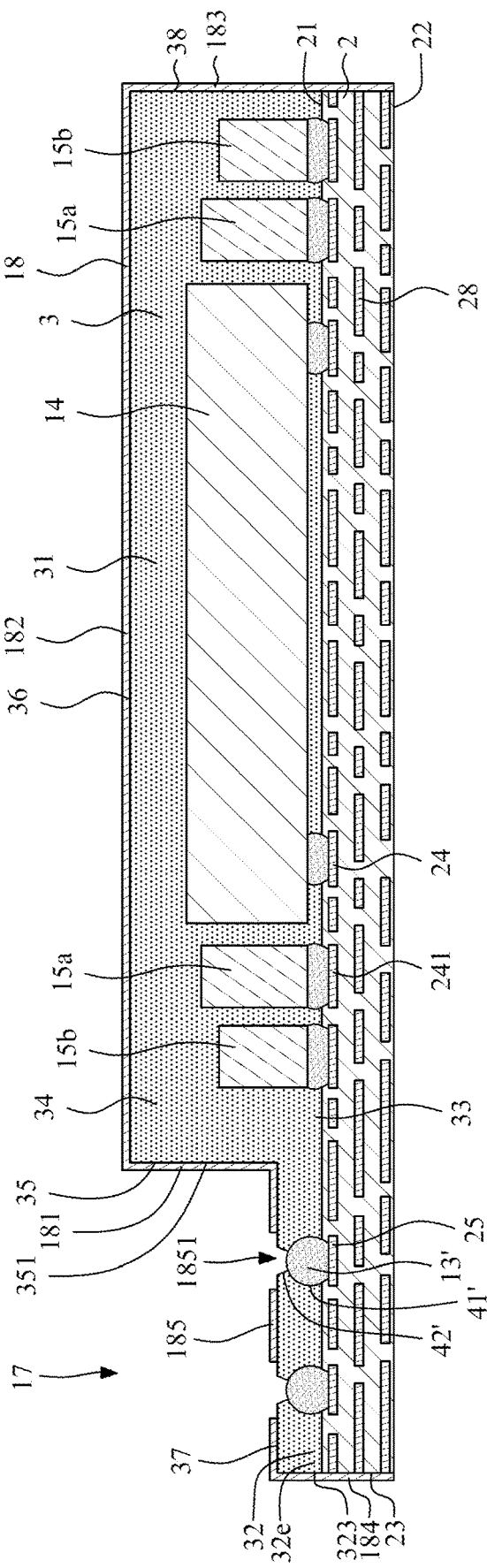
FIG. 48 illustrates a method for manufacturing an electronic device according to some embodiments of the present disclosure.

FIG. 48 illustrates a method for manufacturing an electronic device according to some embodiments of the present disclosure. In some embodiments, the method is for manufacturing the electronic device 1r shown in FIG. 22. The initial several stages of the method corresponding to FIG. 48 are the same as, or at least similar to, the stages illustrated in FIG. 23 through FIG. 37. FIG. 48 depicts a stage subsequent to that depicted in FIG. 37.

Referring to FIG. 48, the fifth portion 185 of the shielding layer 18 may define at least one opening 1851. Thus, the fifth portion 185 of the shielding layer 18 may be formed or provided to cover a first part 371 (FIG. 22) of the second top surface 37 of the second portion 32e of the encapsulant 3 and expose a second part 372 (FIG. 22) of the second top surface 37 of the second portion 32e of the encapsulant 3. Then, the second portion of the second portion 32e of the encapsulant 3 exposed from the opening 1851 may be removed from the second top surface 37 of the second portion 32e of the encapsulant 3 to form an upper opening 42' to expose a portion of the reflowable element 13'. Meanwhile, the reflowable element 13' embedded in the second portion 32e of the encapsulant 3 may define a lower opening 41' in the second portion 32e of the encapsulant 3.

Then, an electronic component 12 is disposed in the accommodating space 17. Then, a reflow process is performed so that the reflowable element 13' is melted to become the reflowable element 13b, so as to form the electronic device 1r of FIG. 22. The upper opening 42' and the lower opening 41' of FIG. 48 become the upper portion 42 and the lower portion 41 of the through hole 4 of FIG. 22.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device comprising:
   a substrate;
   an encapsulant disposed over the substrate, and having a first top surface, a second top surface and a first lateral surface extending between the first top surface and the second top surface, wherein a roughness of the first lateral surface is less than or equal to a roughness of the second top surface; and
   an electronic component disposed over the second top surface of the encapsulant and electrically connected to the substrate through a reflowable material, wherein the encapsulant surrounds and contacts the reflowable material, wherein a portion of the reflowable material is disposed over the second top surface of the second portion of the encapsulant.

2. The electronic device of claim 1, wherein the encapsulant includes:
   a first portion having the first top surface; and
   a second portion having the second top surface, wherein the first portion is continuously extended to the second portion.

3. The electronic device of claim 2, further comprising a shielding layer, wherein the second portion of the encapsulant further has a third top surface level-distinct from the second top surface, and the shielding layer disposed over the second top surface.

4. The electronic device of claim 1, wherein the encapsulant includes:
   a first portion having the first top surface; and
   a second portion having the second top surface and a third top surface level-distinct from the second top surface, wherein the roughness of the second top surface is less than a roughness of the third top surface.

5. The electronic device of claim 1, wherein an encapsulant further has a second lateral surface, and the first lateral surface and the second lateral surface collectively define an accommodating space for accommodating the electronic component.

6. An electronic device comprising:
   a substrate;
   an encapsulant disposed over the substrate, and including a first portion and a second portion connected to the first portion;
   an electronic component disposed over the second portion; and
   a shielding layer disposed on a lateral surface of the second portion, and being distant from the first portion in a cross-sectional view, wherein the second portion defines a recess portion to expose a portion of a reflowable element connecting the substrate and the electronic component.

7. The electronic device of claim 6, wherein the second portion is disposed between the shielding layer and the first portion.

8. The electronic device of claim 6, wherein the shielding layer extends to a lateral surface of the substrate.

9. The electronic device of claim 8, wherein the lateral surface of the substrate is substantially aligned with the lateral surface of the second portion.

10. The electronic device of claim 6, wherein the shielding layer is disposed on a top surface of the second portion, and is spaced apart from the reflowable element.

11. The electronic device of claim 1, wherein the electronic component is a connector that is configured to connect the substrate to an external device.

12. The electronic device of claim 2, wherein the second portion of the encapsulant defines an opening to expose an electrical contact of the substrate.

13. The electronic device of claim 12, wherein the second portion of the encapsulant defines a recess portion recessed from the second top surface of the second portion of the encapsulant, wherein the recess portion is communicated with the opening.

14. The electronic device of claim 1, wherein in a cross section, the reflowable material has a substantially hourglass shape.

15. The electronic device of claim 6, wherein the shielding layer covers a portion of a second top surface of the second portion of the encapsulant.

16. An electronic device comprising:
a substrate;
an encapsulant disposed over the substrate, and including a first portion and a second portion connected to the first portion;
an electronic component disposed over the second portion; and
a shielding layer disposed on a lateral surface of the second portion, and being distant from the first portion in a cross-sectional view, wherein a bottom end surface of a first portion of the shielding layer is embedded in the first portion of the encapsulant.

17. The electronic device of claim 16, wherein the second portion has a second top surface and a third top surface level-distinct from the second top surface, wherein the shielding layer is further disposed over the second top surface except for the third top surface.

18. The electronic device of claim 16, wherein the second portion of the encapsulant defines a recess portion recessed from a second top surface of the second portion of the encapsulant, wherein the recess portion has a bottom surface extending to connect a lateral surface of the second portion of the encapsulant.

\* \* \* \* \*